United States Patent
Langer et al.

(10) Patent No.: US 9,203,037 B2
(45) Date of Patent: Dec. 1, 2015

(54) ORGANIC ELECTRONIC DEVICES COMPRISING A LAYER OF A DIBENZOFURANE COMPOUND AND A 8-HYDROXYPQUINOLINOLATO EARTH ALKALINE METAL, OR ALKALI METAL COMPLEX

(75) Inventors: Nicolle Langer, Heppenheim (DE); Gerhard Wagenblast, Wachenheim (DE); Oliver Molt, Weinheim (DE); Christian Schildknecht, Mannheim (DE); Evelyn Fuchs, Mannheim (DE); Korinna Dormann, Bad Durkheim (DE); Soichi Watanabe, Mannheim (DE); Thomas Geβner, Heidelberg (DE); Christian Lennartz, Schifferstadt (DE); Heinz Wolleb, Fehren (CH); Junichi Tanabe, Hyogo (JP)

(73) Assignee: BASF SE, Ludwigshafen (DE)

( * ) Notice: Subject to any disclaimer, the term of this patent is extended or adjusted under 35 U.S.C. 154(b) by 691 days.

(21) Appl. No.: 13/159,957

(22) Filed: Jun. 14, 2011

(65) Prior Publication Data
US 2011/0309343 A1 Dec. 22, 2011

Related U.S. Application Data

(60) Provisional application No. 61/356,057, filed on Jun. 18, 2010.

(51) Int. Cl.
*H01L 51/54* (2006.01)
*H01L 51/00* (2006.01)
*H01L 51/50* (2006.01)

(52) U.S. Cl.
CPC ........ *H01L 51/0073* (2013.01); *H01L 51/0072* (2013.01); *H01L 51/0077* (2013.01); *H01L 51/0094* (2013.01); *H01L 51/0085* (2013.01); *H01L 51/5016* (2013.01); *H01L 51/5092* (2013.01); *H01L 51/5096* (2013.01)

(58) Field of Classification Search
CPC ............ H01L 51/0072; H01L 51/0073; H01L 51/0077; H01L 51/0085; H01L 51/0094; H01L 51/5016; H01L 51/5092; H01L 51/5096; H05B 33/14; C09K 11/00
See application file for complete search history.

(56) References Cited

U.S. PATENT DOCUMENTS

| 2004/0076853 A1* | 4/2004 | Jarikov .................... 428/690 |
| 2005/0106412 A1 | 5/2005 | Kathirgamanathan |
| 2006/0008740 A1* | 1/2006 | Kido et al. .................... 430/296 |
| 2006/0258043 A1* | 11/2006 | Bold et al. .................... 438/99 |
| 2008/0032123 A1* | 2/2008 | Spindler et al. ............... 428/336 |
| 2008/0265210 A1 | 10/2008 | Kathirgamanathan et al. |
| 2009/0026938 A1* | 1/2009 | Okada et al. .................. 313/504 |
| 2009/0131673 A1* | 5/2009 | Tanabe et al. .................... 546/88 |
| 2009/0189519 A1 | 7/2009 | Lee et al. |
| 2009/0230852 A1 | 9/2009 | Lee et al. |
| 2011/0095282 A1 | 4/2011 | Pflumm et al. |
| 2011/0121268 A1 | 5/2011 | Nagao et al. |
| 2011/0198578 A1 | 8/2011 | Heuser et al. |
| 2011/0248217 A1 | 10/2011 | Tanabe et al. |

(Continued)

FOREIGN PATENT DOCUMENTS

| WO | 03046107 | 5/2003 |
| WO | 2006087521 | 8/2006 |
| WO | 2006128800 | 12/2006 |

(Continued)

OTHER PUBLICATIONS

M. Thelakkat, et. al., Chem Mater.12 (2000)3012-3019.

(Continued)

*Primary Examiner* — Dawn L. Garrett
(74) *Attorney, Agent, or Firm* — Shruti Costales

(57) ABSTRACT

The present invention provides an organic electronic device including a first electrode, a second electrode, and an organic layer interposed between the first electrode and the second electrode, wherein the organic layer comprises an organic metal complex of formula

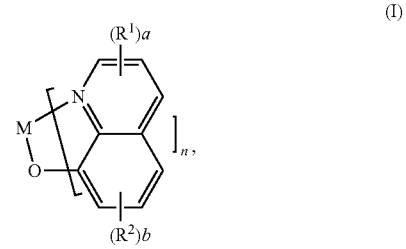

(I)

and a compound of formula

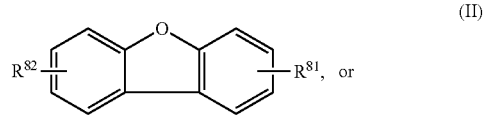

(II)

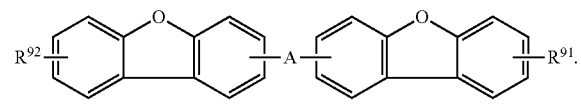

(III)

The organic electronic device, especially an organic light emitting device can show superior life time, power efficiency, quantum efficiency and/or a low operating voltage.

13 Claims, No Drawings

(56) References Cited

U.S. PATENT DOCUMENTS

2011/0309346 A1* 12/2011 Watanabe et al. ............... 257/40
2012/0292605 A1* 11/2012 Park et al. ....................... 257/40

FOREIGN PATENT DOCUMENTS

| WO | 2010001817 | 1/2010 |
| WO | 2010040777 | 4/2010 |
| WO | 2010072300 | 7/2010 |

OTHER PUBLICATIONS

Z.L. Zhang, et al., Synthetic Metals 158 (2008)810-814.
International Search Report dated Oct. 7, 2011.
Choi, S.H. et al., "Improved Efficiency and Lifetime of Organic Light-Emitting Diode with Lithium-Quinolate-Doped Electron Transport Layer", 2009, vol. 48, pp. 062101-1-062101-3.

* cited by examiner

ORGANIC ELECTRONIC DEVICES COMPRISING A LAYER OF A DIBENZOFURANE COMPOUND AND A 8-HYDROXYPQUINOLINOLATO EARTH ALKALINE METAL, OR ALKALI METAL COMPLEX

CROSS REFERENCES

This application claims the benefit of U.S. Provisional Application No. 61/356,057, filed Jun. 18, 2010.

DESCRIPTION

The present invention provides an organic electronic device including a first electrode, a second electrode, and an organic layer interposed between the first electrode and the second electrode, wherein the organic layer comprises an organic metal complex of formula I and a compound of formula II, or III.
wie versprochen das Patent von Merck.

WO10072300 relates to organic electroluminescent devices which comprise triazine derivatives optionally in combination with an organic alkali metal compound as the electron transport material. As an example of an organic alkali metal compound lithium quinolate is mentioned.

WO2006128800 discloses compounds of the formula

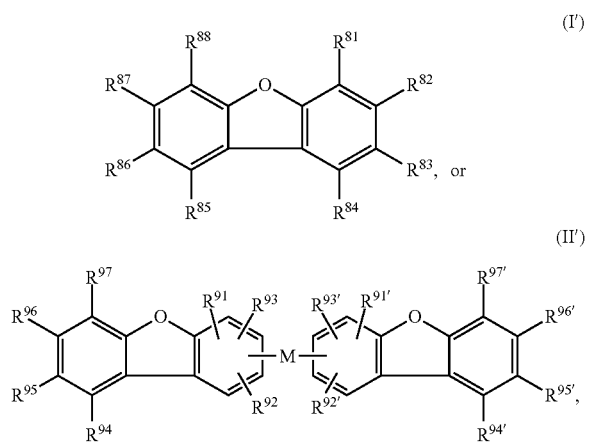

and their use in electroluminescent devices. According to WO2006128800 the compounds of formula I', or II' can be used as the light emitting material in the light emitting layer, optionally as a host or guest component (as fluorescence emitter, or as host for triplet emitter), or electron transport layer.

M. Thelakkat et al., Chem. Mater. 12 (2000) 3012-3019 describes the synthesis of lithium-quinolate complexes, 8-hydroxyquinolinolatolithium (Liq) and 2-methyl-8-hydroxyquinolinolatolithium (LiMeq) and their use as emitter and electron injection/transport materials in conventional two-layer organic light-emitting diodes in combination with N,N"-bis(p-methoxyphenyl)-N,N'-diphenylbenzidine (DMeOTPD) as hole transport material (HTL). The lithium complexes were also examined as interface materials in combination with 8-hydroxyquinolinolato-Al(III) (Alq$_3$) as emitter material. The lithium complexes increase the efficiency of an optimized indium-tin oxide (ITO)/DMeOTPD/Alq$_3$/Al device considerably when used as a thin interface layer between Alq$_3$ and aluminum. The improvement of device characteristics with lithium quinolates is similar to that obtained with LiF salt.

Z. L. Zhang et al., Synthetic Metals 158 (2008) 810-814 describes organic light-emitting diodes with 8-hydroxyquinolinato lithium doped 4',7-diphenyl-1,10-phenanthroline as electron transport layer (ETL), and tetrafluoro-tetracyano-quinodimethane doped 4,4',4"-tris(3-methylphenylphenylamino)triphenylamine as hole transport layer (HTL). Compared with the referenced device (without doping), the current efficiency and power efficiency of the p-i-n device are enhanced by approximately 51% and 89%, respectively. This improvement is attributed to the improved conductivity of the transport layers and the efficient charge balance in the emission zone.

S. H. Choi et al., Japanese Journal of Applied Physics 48 (2009) 062101 reports improved efficiency and lifetime of OLEDs with lithium quinolate doped electron transport layers. The electron transport layer consists of LGC201

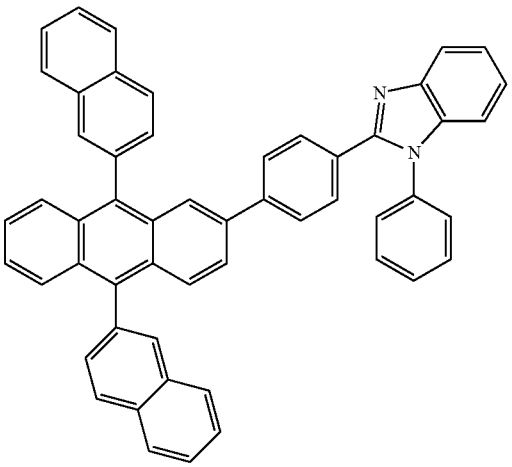 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

(LG Chem) and Liq.

WO2010040777A1 relates to the use of siloles substituted with condensed ring systems in organic-electronic applications and also special siloles substituted with condensed ring systems and use thereof in organic-electronic applications. 8-Hydroxyquinolinolatolithium (Liq) is mentioned as an example of a material of an electron transport material.

The organic electroluminescent compounds according to US2009230852A1 are represented by Chemical Formula

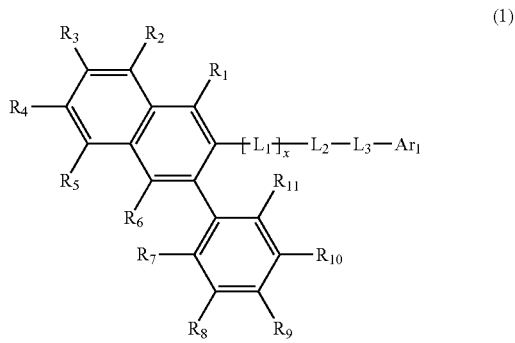

wherein, $L_1$ represents (C6-C60)arylene or (C3-C60)heteroarylene containing one or more heteroatom(s) selected from N, O and S, or a bivalent group selected from the following structures: $L_2$ and $L_3$ independently represent a chemical bond, or (C1-C60)alkyleneoxy, (C1-C60)alkylenethio, (C6-C60)aryleneoxy, (C6-C60)arylenethio, (C6-

C60)arylene or (C3-C60)heteroarylene containing one or more heteroatom(s) selected from N, O and S; $Ar_1$ represents $NR_{41}R_{42}$, (C6-C60)aryl, (C3-C60)heteroaryl containing one or more heteroatom(s) selected from N, O and S, a 5- or 6-membered heterocycloalkyl containing one or more heteroatom(s) selected from N, O and S, (C3-C60)cycloalkyl, adamantyl, (C7-C60)bicycloalkyl, or a substituent selected from the following structures: and x is an integer from 1 to 4. Lithium quinolate (Liq) is used in Example 1 as an electron injection material.

US2009189519A1 relates to organic compounds represented by formula

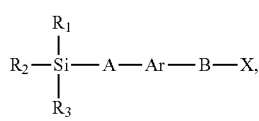
(1)

which are preferably used as host materials. Lithium quinolate (Liq) is used in Examples 1 to 5 as an electron injection material.

WO10001817A relates to an organic thin-film light-emitting element containing an organic compound represented by general formula $Y-(A^1-Ar)_{n1}$ (1) and a donor compound as an electronic transport layer. In general formula (I), Y represents a substituted or unsubstituted pyrene or a substituted or unsubstituted anthracene; $A^1$ represents a member selected from the group consisting of a single bond, arylene groups and heteroarylene groups; Ar represents a member selected from the group consisting of carbazolyl groups, dibenzofuranyl groups and dibenzothiophenyl groups; the groups may be substituted or unsubstituted; and $n^1$ represents an integer of 1-3. Examples of compounds of formula 1 are,

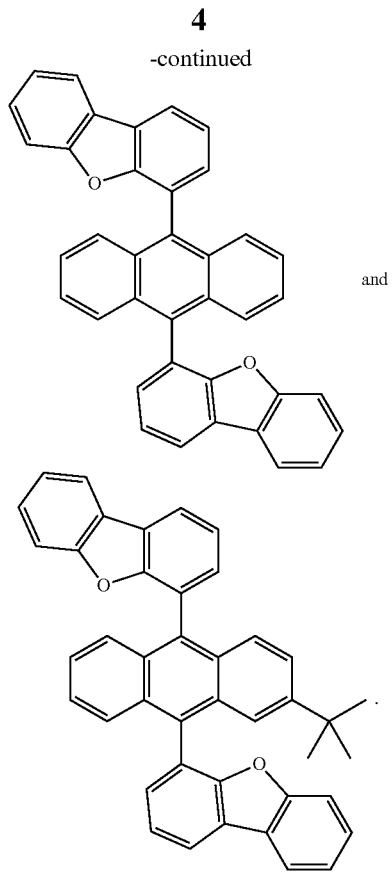

and

Liq is mentioned as an example of the donor compound. In the Working Example the electron transport layer consists of a 1:1 mixture of Liq and

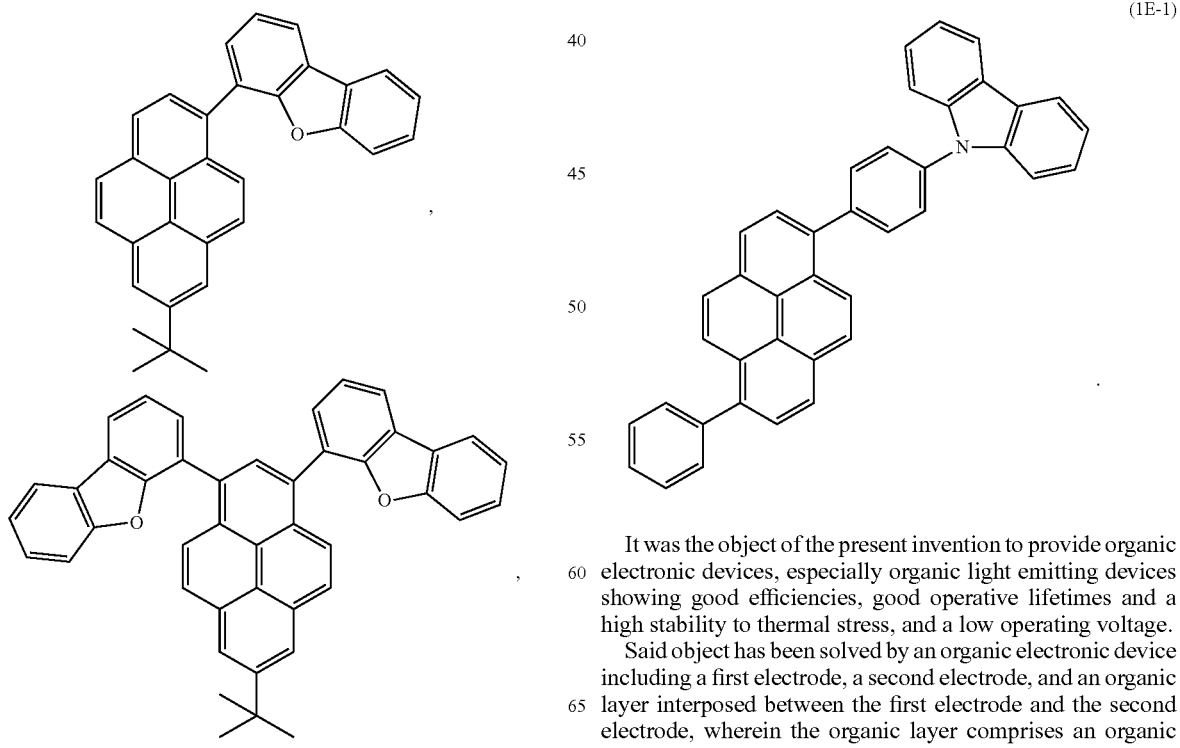
(1E-1)

It was the object of the present invention to provide organic electronic devices, especially organic light emitting devices showing good efficiencies, good operative lifetimes and a high stability to thermal stress, and a low operating voltage.

Said object has been solved by an organic electronic device including a first electrode, a second electrode, and an organic layer interposed between the first electrode and the second electrode, wherein the organic layer comprises an organic metal complex of formula and

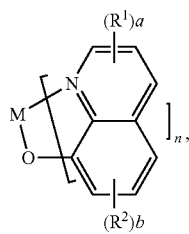

and a compound of formula

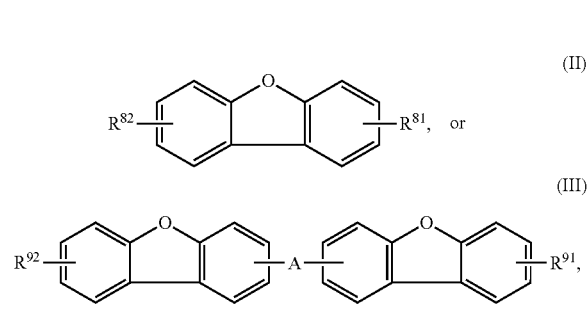

wherein $R^1$ and $R^2$ are independenly of each other F, $C_1$-$C_8$alkyl, or $C_6$-$C_{14}$aryl, which may optionally be substituted by one, or more $C_1$-$C_8$alkyl groups, or two substituents $R^1$ and/or $R^2$ combine to form a fused benzene ring group, which may optionally be substituted by one, or more $C_1$-$C_8$alkyl groups, a and b are independently of each other 0, or an integer 1 to 3, $R^{81}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups, $R^{82}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups, $R^{91}$ is phenanthryl, pyrenyl, triphenylenyl, 1,10-phenanthrolinyl, triazinyl, dibenzothiophenyl, pyrimidinyl, or dibenzofuranyl, each of which may optionally be substituted by one, or more $C_1$-$C_{18}$alkyl, $C_6$-$C_{14}$aryl, or $C_2$-$C_{20}$heteroaryl groups, $R^{92}$ is H, phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$ alkyl, $C_6$-$C_{14}$aryl, or $C_2$-$C_{20}$heteroaryl groups, A is a single bond, an arylene, or heteroarylene group, each of which may optionally be substituted by one, or more $C_1$-$C_{18}$alkyl groups; or —$SiR^{83}R^{84}$—, wherein $R^{83}$ and $R^{84}$ are independently of each other a $C_1$-$C_{18}$ alkyl, or a $C_6$-$C_{14}$aryl group, which may optionally be substituted by one, or more $C_1$-$C_{18}$alkyl groups;

M is an alkali metal atom, or an earth alkaline metal atom, n is 1, if M is an alkali metal atom, n is 2, if M is an earth alkaline metal atom.

If the organic layer comprising the compounds of formula I and II, or III constitutes the electron transport layer of an OLED, OLEDs having superior life time, power efficiency, quantum efficiency and/or a low operating voltage are obtained.

Examples of M are Li, Na, K, Rb, Cs, Be, Mg, Ca, Sr, or Ba. Li, Na and K are preferred, Li is most preferred. Examples of the metal complex of formula I are 8-hydroxyquinolinolato lithium (Liq) and 2-methyl-8-hydroxyquinolinolato lithium (LiMeq). The most preferred metal complex is

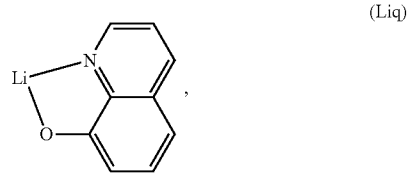

which can exist as the single species, or in other forms such as $Li_gQ_g$, where g is an integer, for example $Li_6Q_6$. Q represents 8-hydroxyquinolate ligand or a derivative of 8-hydroxyquinolate

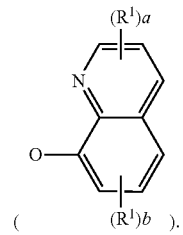

Preferably, the substituents $R^{81}$ and $R^{82}$ are in ortho-, or para-position with respect to the oxygen atom of the dibenzofurane moiety.

Preferably, the substituents A, $R^{91}$ and $R^{92}$ are in ortho-, or para-position with respect to the oxygen atom of the dibenzofurane moiety.

Compounds of formula

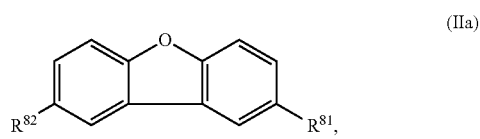

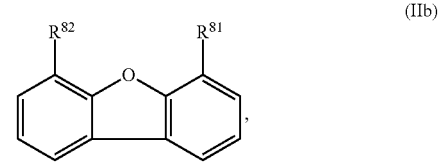

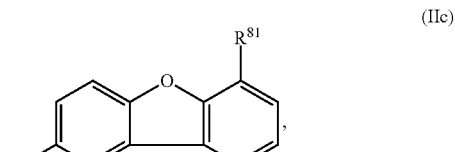

(IIIa)

(IIIb)

wherein A, $R^{81}$, $R^{82}$, $R^{91}$ and $R^{92}$ are as defined above, are preferred.

Preferably, $R^{81}$ is phenanthryl, dibenzothiophenyl, or pyrenyl, each of which may optionally be substituted by one, or more $C_1$-$C_{18}$alkyl groups and $R^{82}$ is phenanthryl, dibenzothiophenyl, or pyrenyl, each of which may optionally be substituted by one, or more $C_1$-$C_{18}$alkyl groups. More preferably, $R^{81}$ is phenanthryl, or pyrenyl, each of which may optionally be substituted by one, or more $C_1$-$C_{18}$alkyl groups and $R^{82}$ is phenanthryl, or pyrenyl, each of which may optionally be substituted by one, or more $C_1$-$C_{18}$alkyl groups.

Preferably, $R^{91}$ is dibenzofuranyl, dibenzothiophenyl, phenanthryl, or pyrenyl, each of which may optionally be substituted by one, or more $C_1$-$C_{18}$alkyl groups and $R^{92}$ is H, phenanthryl, dibenzothiophenyl, or pyrenyl, each of which may optionally be substituted by one, or more $C_1$-$C_{18}$alkyl groups. More preferably, $R^{91}$ is dibenzofuranyl, phenanthryl, or pyrenyl, each of which may optionally be substituted by one, or more $C_1$-$C_{18}$alkyl groups and $R^{92}$ is phenanthryl, or pyrenyl, each of which may optionally be substituted by one, or more $C_1$-$C_{18}$alkyl groups. For $R^{91}$ phenanthryl and pyrenyl groups are more preferred than dibenzofuranyl groups.

In a preferred embodiment of the present invention $R^{81}$ and $R^{82}$ are independently of each other -continued

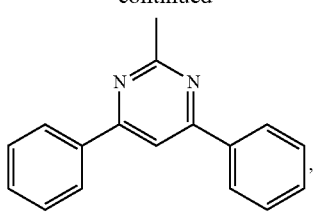

wherein $R^{87}$ is H, or $C_1$-$C_8$alkyl.

More preferably, $R^{81}$ is

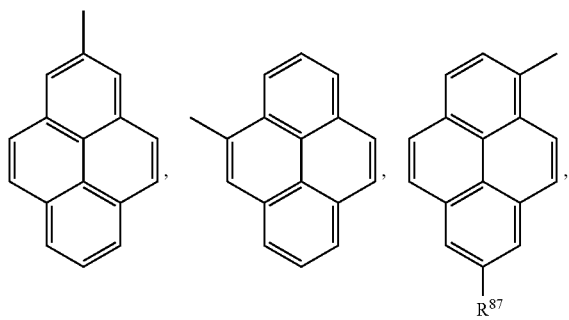

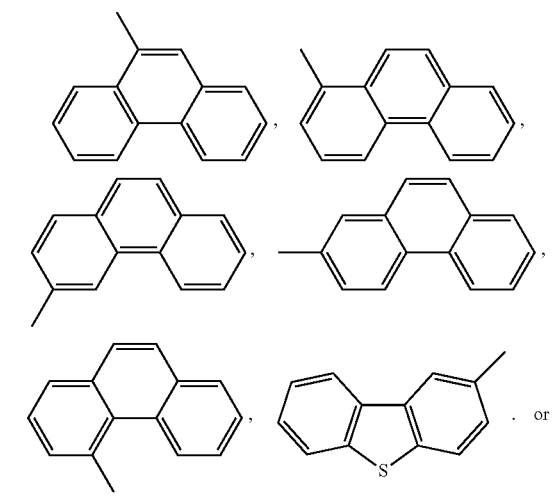

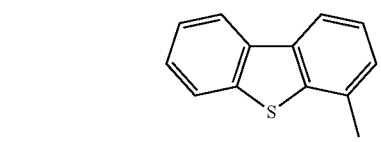

and $R^{82}$ has the same preferences as $R^{81}$.

In another preferred embodiment of the present invention $R^{91}$ has the meaning of $R^{81}$, or is

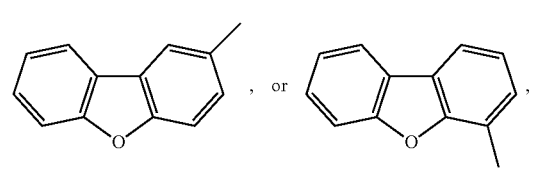

and $R^{92}$ has the meaning of $R^{81}$, or is H.

More preferably, $R^{91}$ has the same preferences as $R^{81}$, or is

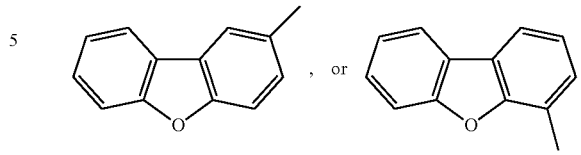

and $R^{92}$ has the same preferences as $R^{81}$, or is H.

A is a single bond, a substituted, or unsubstituted arylene group having 6 to 30 ring carbon atoms, or a substituted or unsubstituted heteroarylene group having 5 to 30 ring carbon atoms, or —SiR$^{83}$R$^{84}$—.

Preferred arylene radicals are phenylene, naphthylene, phenantrylene and phenalylene, which may optionally be substituted by one, or more $C_1$-$C_{18}$alkyl groups.

Preferred heteroarylene radicals are pyridinylene, pyrazinylene, pyrimidinylene, and triazolylene, which may optionally be substituted by one, or more $C_1$-$C_{18}$alkyl groups.

More preferred arylene radicals are

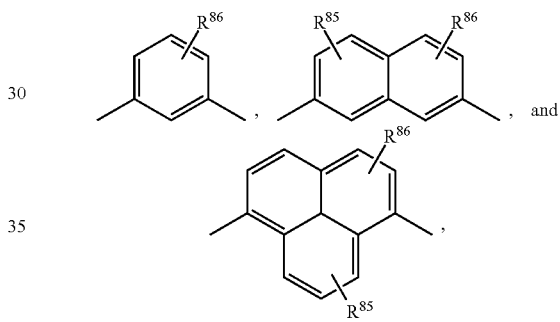

wherein $R^{85}$ and $R^{86}$ are independently of each other H, or a $C_1$-$C_{18}$alkyl group.

In another embodiment of the present invention preferred arylene radicals are a pyrenylene, or anthrylene group. In said embodiment a groups of formula

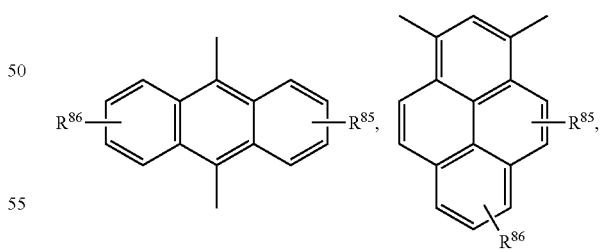

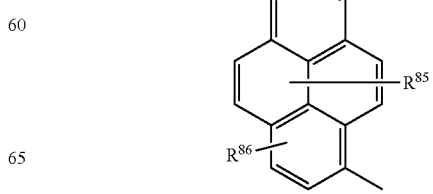

are more preferred and a group of formula

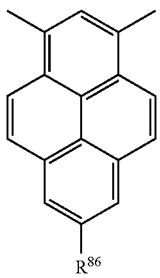

is most preferred, wherein $R^{85}$ and $R^{86}$ are independently of each other H, or a $C_1$-$C_{18}$alkyl group.

More preferred heteroarylene radicals are

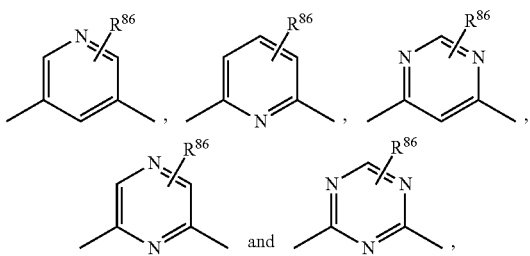

wherein $R^{86}$ is H, or a $C_1$-$C_{18}$alkyl group.

Preferred groups —$SiR^{83}R^{84}$— are —$Si(CH_3)_2$—, —$Si(CH_2CH_3)_2$—, and $Si(C(CH_3)_3)_2$—.

Particularly preferred compounds of formula II are compounds A-1 to A-36. Particularly preferred compounds of formula III are compounds B-1 to B-27. Reference is made to claim 5. Compound A-10 is at present most preferred.

In a particularly preferred embodiment the organic layer, especially the electron transport layer comprises a mixture of a compound of formula

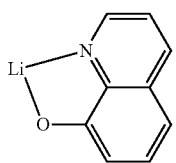

(Liq)

and a compound of formula

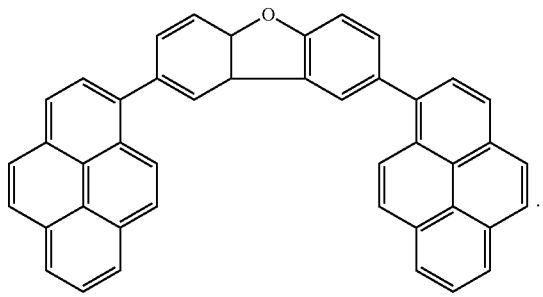

(A-10)

The organic electronic device according to the present invention is preferably an organic light emitting device (OLED), comprising an anode, a hole injection layer, a hole transport layer, a light emitting layer, a hole and exciton blocking layer, an electron transport layer, an electron injection layer and a cathode, wherein the organic layer comprising the compounds of formula I and II, or III constitutes the electron transport layer. An exciton blocking layer, may be arranged between the hole transport layer and the light emitting layer.

Accordingly, the present invention is also directed to an electron transport layer, comprising an organic metal complex of formula I and a compound of formula II, or III.

The organic metal complex of formula I is contained in the organic layer, especially the electron transport layer of an OLED in an amount of 99 to 1% weight, preferably 75 to 25% by weight, more preferably about 50% by weight, based on the amount of compound of formula I and II, or III.

The synthesis of the compounds of formula II and III is described in WO2006128800, or can be done in analogy to the methods described therein.

The synthesis of the compounds of formula I is described, for example, in Christoph Schmitz et al. Chem. Mater. 12 (2000) 3012-3019 and WO00/32717, or can be done in analogy to the methods described therein.

$C_1$-$C_{18}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, or octadecyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_6$-$C_{14}$aryl, which optionally can be substituted, is typically phenyl, 4-methylphenyl, 4-methoxyphenyl, naphthyl, especially 1-naphthyl, or 2-naphthyl, biphenylyl, terphenylyl, pyrenyl, 2- or 9-fluorenyl, phenanthryl, or anthryl, which may be unsubstituted or substituted.

$C_2$-$C_{20}$heteroaryl represents a ring with five to seven ring atoms or a condensed ring system, wherein nitrogen, oxygen or sulfur are the possible hetero atoms, and is typically a heterocyclic group with five to 30 atoms having at least six conjugated π-electrons such as thienyl, benzothiophenyl, dibenzothiophenyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

The $C_6$-$C_{14}$aryl and $C_2$-$C_{20}$heteroaryl groups are preferably substituted by one, or more $C_1$-$C_8$alkyl groups.

Examples of arylene radicals are phenylene, naphthylene, phenalenylene, antracylene and phenantrylene, which may optionally be substituted by one or more $C_1$-$C_{18}$alkyl groups. Preferred arylene radicals are 1,3-phenylene, 3,6-naphthylene, and 4,9-phenalenylene, which may optionally be substituted by one or more $C_1$-$C_{18}$alkyl groups.

Examples of heteroarylene radicals are 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene, 2,6-indenylene, especially pyrazinylene, pyridinylene, pyrimidinylene, and triazolylene, which may optionally be substituted by one or more $C_1$-$C_{18}$alkyl groups. Preferred heteroarylene radicals are 2,6-pyrazinylene, 2,6-pyridinylene, 4,6-pyrimidinylene, and 2,6-triazolylene, which may optionally be substituted by one or more $C_1$-$C_{18}$alkyl groups.

The organic electronic device of the present application is, for example, an organic solar cell (organic photovoltaics), a switching element, such as an organic transistors, for example organic FET and organic TFT, organic light emitting field effect transistor (OLEFET), or an organic light-emitting diode (OLED), preference being given to OLEDs.

The present application relates to the use of the organic metal complex of formula I in combination with the compound of formula II, or III preferably as electron transport layer in an organic electronic device.

Accordingly, the present application is also directed to an organic layer, especially an electron transport layer, comprising an organic metal complex of formula I and a compound of formula II, or III.

Suitable structures of organic electronic devices are known to those skilled in the art and are specified below.

The organic transistor generally includes a semiconductor layer formed from an organic layer with hole transport capacity and/or electron transport capacity; a gate electrode formed from a conductive layer; and an insulating layer introduced between the semiconductor layer and the conductive layer. A source electrode and a drain electrode are mounted on this arrangement in order thus to produce the transistor element. In addition, further layers known to those skilled in the art may be present in the organic transistor.

The organic solar cell (photoelectric conversion element) generally comprises an organic layer present between two plate-type electrodes arranged in parallel. The organic layer may be configured on a comb-type electrode. There is no particular restriction regarding the site of the organic layer and there is no particular restriction regarding the material of the electrodes. When, however, plate-type electrodes arranged in parallel are used, at least one electrode is preferably formed from a transparent electrode, for example an ITO electrode or a fluorine-doped tin oxide electrode. The organic layer is formed from two sublayers, i.e. a layer with p-type semiconductor properties or hole transport capacity, and a layer formed with n-type semiconductor properties or electron transport capacity. In addition, it is possible for further layers known to those skilled in the art to be present in the organic solar cell. The layer with electron transport capacity may comprise the organic metal complex of formula I and the compound of formula II, or III.

The present invention further relates to an organic light-emitting diode comprising an anode An and a cathode Ka, a light-emitting layer E arranged between the anode An and the cathode Ka, an electron transport layer arranged between the cathode Ka and the light-emitting layer E, and if appropriate at least one further layer selected from the group consisting of at least one blocking layer for holes/excitons, at least one blocking layer for electrons/excitons, at least one hole injection layer, at least one hole transport layer and at least one electron injection layer, wherein the electron transport layer comprises an organic metal complex of formula I and a compound of formula II, or III.

Structure of the Inventive OLED

The inventive organic light-emitting diode (OLED) thus generally has the following structure:
an anode (An) and a cathode (Ka) and a light-emitting layer E arranged between the anode (An) and the cathode (Ka) and an electron transport layer arranged between the cathode Ka and the light-emitting layer E.

The inventive OLED may, for example—in a preferred embodiment—be formed from the following layers:
1. Anode
2. Hole transport layer
3. Light-emitting layer
4. Blocking layer for holes/excitons
5. Electron transport layer
6. Cathode Layer sequences different than the aforementioned structure are also possible, and are known to those skilled in the art. For example, it is possible that the OLED does not have all of the layers mentioned; for example, OLEDs which have layers (1), (3), (4), (5) and (6), are likewise suitable. In addition, the OLEDs may have a blocking layer for electrons/excitons between the hole transport layer (2) and the light-emitting layer (3).

It is additionally possible that a plurality of the aforementioned functions (electron/exciton blocker, hole/exciton blocker, hole injection, hole transport, electron injection, electron transport) are combined in one layer and are assumed, for example, by a single material present in this layer. For example, a material used in the hole transport layer, in one embodiment, may simultaneously block excitons and/or electrons.

Furthermore, the individual layers of the OLED among those specified above may in turn be formed from two or more layers. For example, the hole transport layer may be formed from a layer into which holes are injected from the electrode, and a layer which transports the holes away from the hole-injecting layer into the light-emitting layer. The electron transport layer may likewise consist of a plurality of layers, for example a layer in which electrons are injected by the electrode, and a layer which receives electrons from the electron injection layer and transports them into the light-emitting layer. These layers mentioned are each selected according to factors such as energy level, thermal resistance and charge carrier mobility, and also energy difference of the layers specified with the organic layers or the metal electrodes. The person skilled in the art is capable of selecting the structure of the OLEDs such that it is matched optimally to the organic compounds used as emitter substances in accordance with the invention.

In order to obtain particularly efficient OLEDs, for example, the HOMO (highest occupied molecular orbital) of the hole transport layer should be matched to the work function of the anode, and the LUMO (lowest unoccupied molecular orbital) of the electron transport layer should be matched to the work function of the cathode, provided that the aforementioned layers are present in the inventive OLEDs.

The anode (1) is an electrode which provides positive charge carriers. It may be formed, for example, from materials which comprise a metal, a mixture of various metals, a metal alloy, a metal oxide or a mixture of various metal oxides. Alternatively, the anode may be a conductive polymer. Suitable metals comprise metals and alloys of the metals of the main groups, transition metals and of the lanthanoids, especially the metals of groups Ib, IVa, Va and VIa of the periodic table of the elements, and the transition metals of group VIIIa. When the anode is to be transparent, generally mixed metal oxides of groups IIb, IIIb and IVb of the periodic table of the elements (IUPAC version) are used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed. The material used for the anode (1) is preferably ITO.

Suitable hole transport materials for layer (2) of the inventive OLEDs are disclosed, for example, in Kirk-Othmer Encyclopedia of Chemical Technology, 4th edition, Vol. 18, pages 837 to 860, 1996. Both hole-transport molecules and polymers can be used as the hole transport material. Hole-transport molecules typically used are selected from the group consisting of tris[N-(1-naphthyl)-N-(phenylamino)] triphenylamine (1-NaphDATA), 4,4'-bis[N-(1-naphthyl)-N-phenylamino]biphenyl (α-NPD), N,N'-diphenyl-N,N'-bis(3-methylphenyl)-[1,1'-biphenyl]-4,4'-diamine (TPD), 1,1-bis [(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl] (4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), 4,4',4''-tris(N,N-diphenylamino)triphenylamine (TDTA), 4,4',4''-tris (N-carbazolyl)triphenylamine (TCTA), N,N'-bis (naphthalen-2-yl)-N,N'-bis(phenyl)benzidine (β-NPB), N,N'-bis(3-methylphenyl)-N,N'-bis(phenyl)-9,9-spirobifluorene (Spiro-TPD), N,N'-bis(naphthalen-1-yl)-N,N'-bis (phenyl)-9,9-spirobifluorene (Spiro-NPB), N,N'-bis(3-methylphenyl)-N,N'-bis(phenyl)-9,9-dimethylfluorene (DMFL-TPD), di[4-(N,N-ditolylamino)phenyl]cyclohexane, N,N'-bis(naphthalen-1-yl)-N,N'-bis(phenyl)-9,9-dimethylfluorene, N,N'-bis(naphthalen-1-yl)-N,N'-bis (phenyl)-2,2-dimethylbenzidine, N,N'-bis(naphthalen-1-yl)-N,N'-bis(phenyl)benzidine, N,N'-bis(3-methylphenyl)-N,N'-bis(phenyl)benzidine, 2,3,5,6-tetrafluoro-7,7,8,8-tetracyanoquinodimethane (F4-TCNQ), 4,4',4''-tris(N-3-methylphenyl-N-phenylamino)triphenylamine, 4,4',4''-tris (N-(2-naphthyl)-N-phenyl-amino)triphenylamine, pyrazino [2,3-f][1,10]phenanthroline-2,3-dicarbonitrile (PPDN), N,N,N',N'-tetrakis(4-methoxyphenyl)benzidine (MeO-TPD), 2,7-bis[N,N-bis(4-methoxyphenyl)amino]-9,9-spirobifluorene (MeO-Spiro-TPD), 2,2'-bis[N,N-bis(4-methoxyphenyl)amino]-9,9-spirobifluorene (2,2'-MeO-Spiro-TPD), N,N'-diphenyl-N,N'-di[4-(N,N-ditolylamino)phenyl]benzidine (NTNPB), N,N'-diphenyl-N,N'-di[4-(N,N-diphenylamino)phenyl]benzidine (NPNPB), N,N'-di(naphthalen-2-yl)-N,N'-diphenylbenzene-1,4-diamine (β-NPP), N,N'-bis (3-methylphenyl)-N,N'-bis(phenyl)-9,9-diphenylfluorene (DPFL-TPD), N,N'-bis(naphthalen-1-yl)-N,N'-bis(phenyl)-9,9-diphenylfluorene (DPFL-NPB), 2,2',7,7'-tetrakis(N,N-diphenylamino)-9,9'-spirobifluorene (Spiro-TAD), 9,9-bis [4-(N,N-bis(biphenyl-4-yl)amino)phenyl]-9H-fluorene (BPAPF), 9,9-bis[4-(N,N-bis(naphthalen-2-yl)amino)phenyl]-9H-fluorene (NPAPF), 9,9-bis[4-(N,N-bis(naphthalen-2-yl)-N,N'-bisphenylamino)phenyl]-9H-fluorene (NP-BAPF), 2,2',7,7'-tetrakis(N-naphthalenyl(phenyl)amino)-9,9'-spirobifluorene (Spiro-2NPB), N,N'-bis(phenanthren-9-yl)-N,N'-bis(phenyl)benzidine (PAPB), 2,7-bis[N,N-bis(9,9-spirobifluoren-2-yl)amino]-9,9-spirobifluorene (Spiro-5), 2,2'-bis[N,N-bis(biphenyl-4-yl)amino]-9,9-spirobifluorene (2,2'-Spiro-DBP), 2,2'-bis(N,N-diphenylamino)-9,9-spirobifluorene (Spiro-BPA), 2,2',7,7'-tetra(N,N-ditolyl)amino-spirobifluorene (Spiro-TTB), N,N,N',N'-tetranaphthalen-2-yl-benzidine (TNB), porphyrin compounds and phthalocyanines such as copper phthalocyanines and titanium oxide phthalocyanines. Hole-transporting polymers typically used are selected from the group consisting of polyvinylcarbazoles, (phenylmethyl)polysilanes and polyanilines. It is likewise possible to obtain hole-transporting polymers by doping hole-transporting molecules into polymers such as polystyrene and polycarbonate. Suitable hole-transporting molecules are the molecules already mentioned above.

In addition—in one embodiment—it is possible to use carbene complexes as hole transport materials, the band gap of the at least one hole transport material generally being greater than the band gap of the emitter material used. In the context of the present application, "band gap" is understood to mean the triplet energy. Suitable carbene complexes are, for example, carbene complexes as described in WO 2005/019373 A2, WO 2006/056418 A2, WO 2005/113704, WO 2007/115970, WO 2007/115981 and WO 2008/000727. One example of a suitable carbene complex is fac-Iridium-tris(1,3-diphenylbenzimidazolin-2-yliden-C,$C^{2'}$) (Ir(dpbic)$_3$) with the formula:

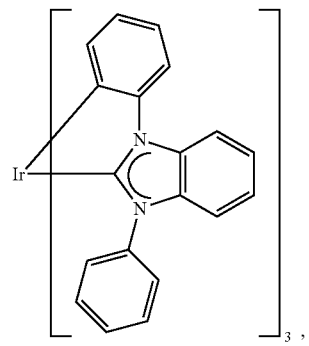

which is disclosed, for example, in WO2005/019373. Preferably, the hole transport layer comprises a compound of formula

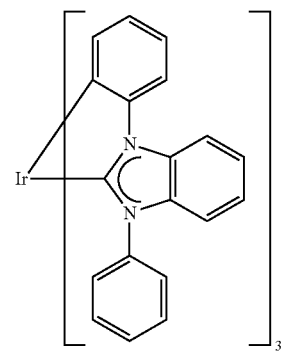

doped with molybdenum oxide (MoO$_x$), especially MoO$_3$, or rhenium oxide (ReO$_x$), especially ReO$_3$. The dopant is contained in an amount of from 0.1% by weight, preferably 1 to 8% by weight, more preferably 3 to 5% by weight, based on the amount of dopant and carbene complex.

The light-emitting layer (3) comprises at least one emitter material. In principle, it may be a fluorescence or phosphorescence emitter, suitable emitter materials being known to those skilled in the art. The at least one emitter material is preferably a phosphorescence emitter. The phosphorescence emitter compounds used with preference are based on metal complexes, and especially the complexes of the metals Ru, Rh, Ir, Pd and Pt, in particular the complexes of Ir, have gained significance.

Suitable metal complexes for use in the inventive OLEDs are described, for example, in documents WO 02/60910 A1, US 2001/0015432 A1, US 2001/0019782 A1, US 2002/0055014 A1, US 2002/0024293 A1, US 2002/0048689 A1, EP 1 191 612 A2, EP 1 191 613 A2, EP 1 211 257 A2, US 2002/0094453 A1, WO 02/02714 A2, WO 00/70655 A2, WO 01/41512 A1, WO 02/15645 A1, WO 2005/019373 A2, WO 2005/113704 A2, WO 2006/115301 A1, WO 2006/067074 A1, WO 2006/056418, WO 2006121811 A1, WO 2007095118 A2, WO 2007/115970, WO 2007/115981 and WO 2008/000727, WO2010129323, WO2010056669 and WO10086089.

The light emitting layer comprises preferably a compound of the formula

which are described in WO 2005/019373 A2, wherein the symbols have the following meanings:

$M^1$ is a metal atom selected from the group consisting of Co, Rh, Ir, Nb, Pd, Pt, Fe, Ru, Os, Cr, Mo, W, Mn, Tc, Re, Cu, Ag and Au in any oxidation state possible for the respective metal atom;

carbene is a carbene ligand which may be uncharged or monoanionic and monodentate, bidentate or tridentate, with the carbene ligand also being able to be a biscarbene or triscarbene ligand;

L is a monoanionic or dianionic ligand, which may be monodentate or bidentate;

K is an uncharged monodentate or bidentate ligand selected from the group consisting of phosphines; phosphonates and derivatives thereof, arsenates and derivatives thereof; phosphites; CO; pyridines; nitriles and conjugated dienes which form a π complex with $M^1$;

n1 is the number of carbene ligands, where n1 is at least 1 and when n1>1 the carbene ligands in the complex of the formula I can be identical or different;

m is the number of ligands L, where m can be 0 or ≥1 and when m>1 the ligands L can be identical or different;

o is the number of ligands K, where o can be 0 or ≥1 and when o>1 the ligands K can be identical or different;

where the sum n1+m+o is dependent on the oxidation state and coordination number of the metal atom and on the denticity of the ligands carbene, L and K and also on the charge on the ligands, carbene and L, with the proviso that n1 is at least 1.

The compound of formula IX is preferably a compound of the formula:

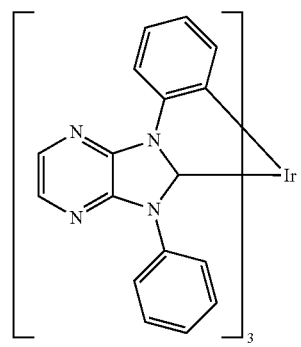

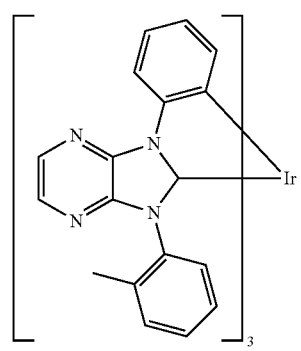

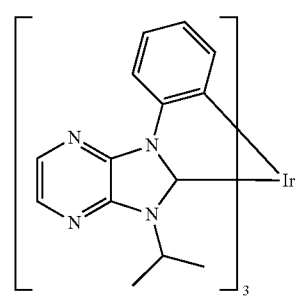

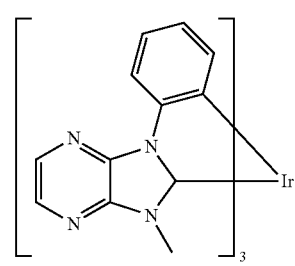

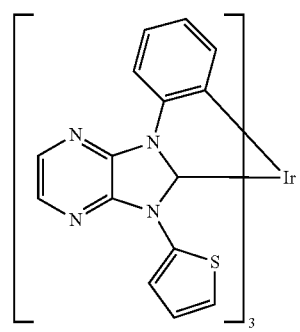

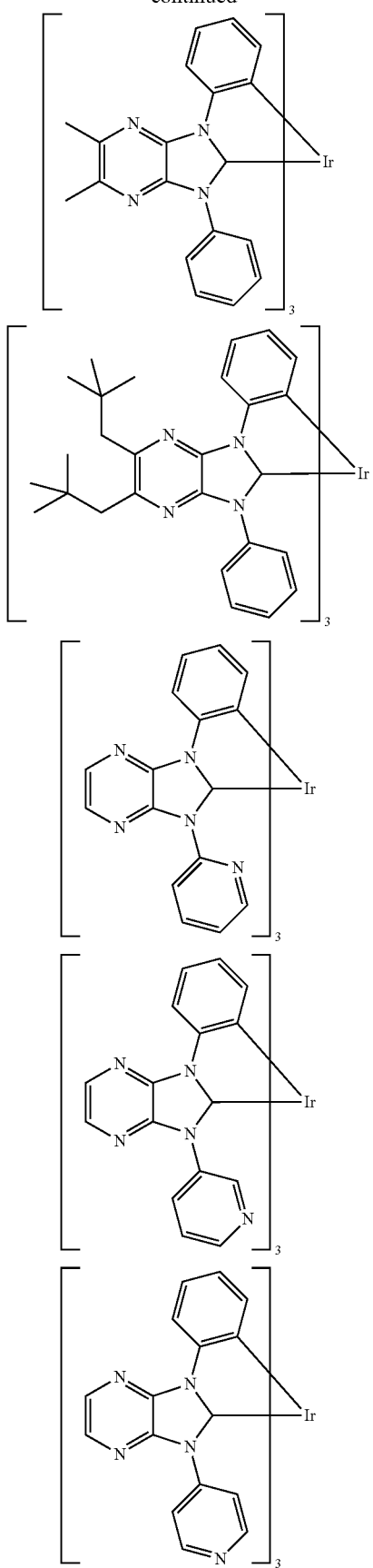
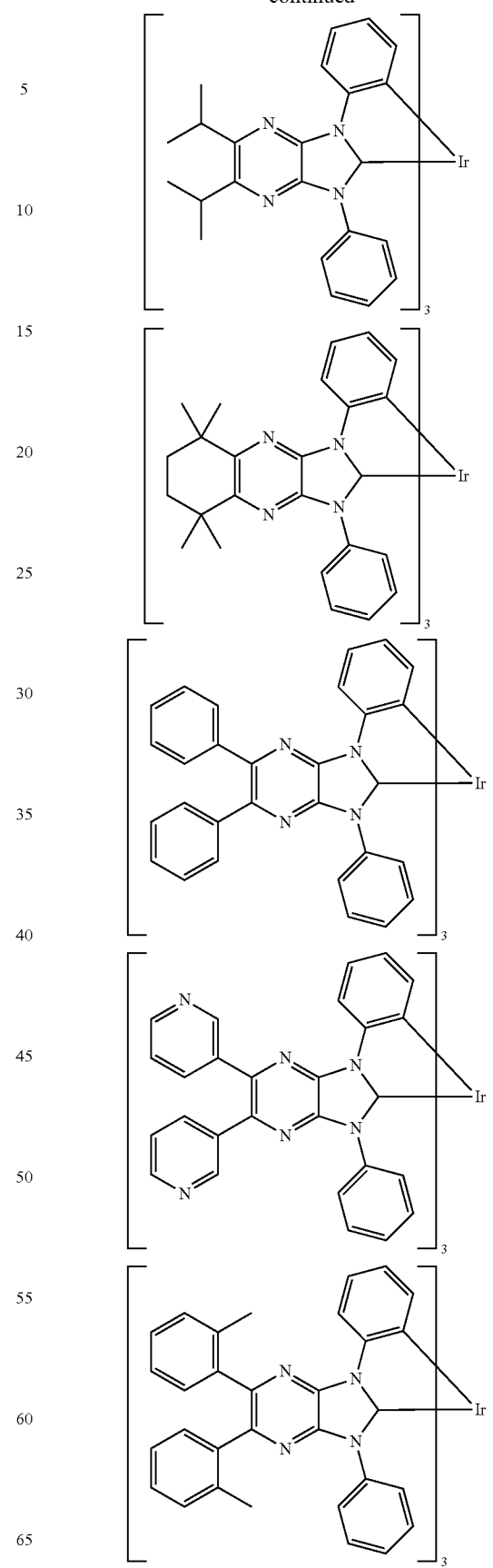

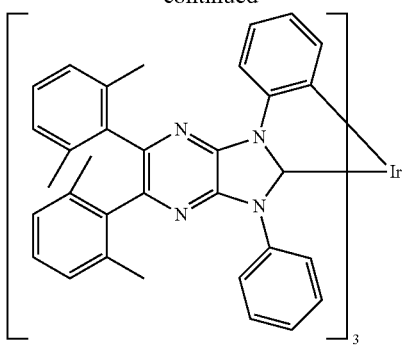
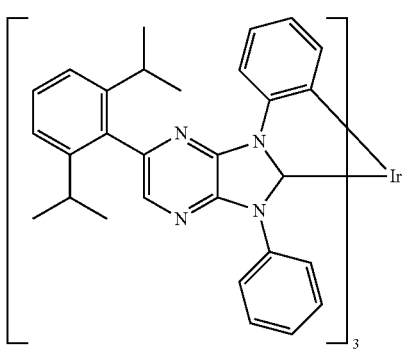
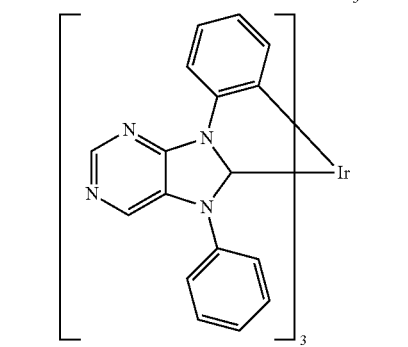
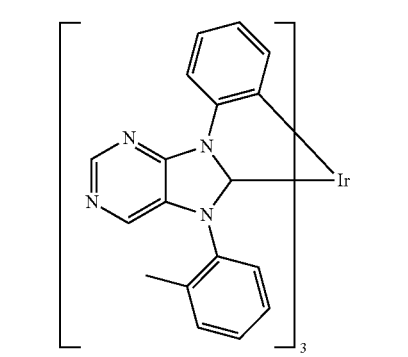
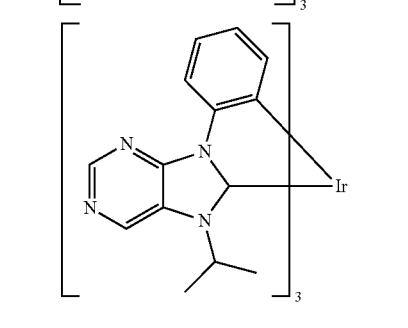
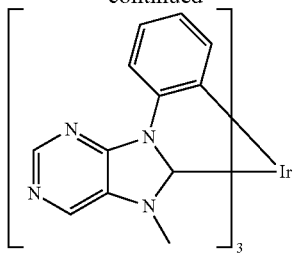
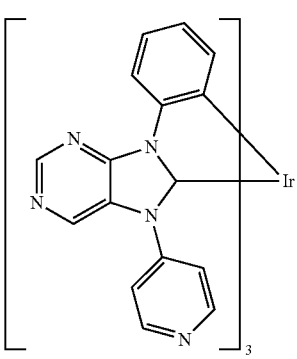
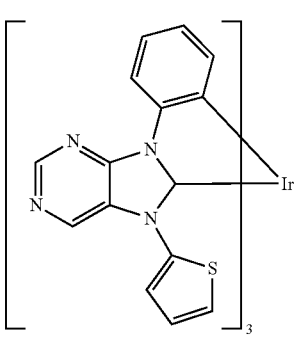
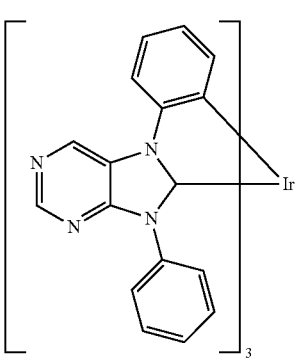
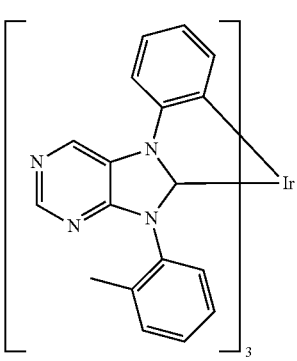

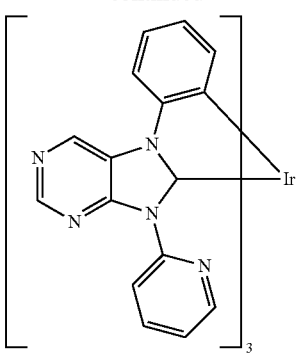
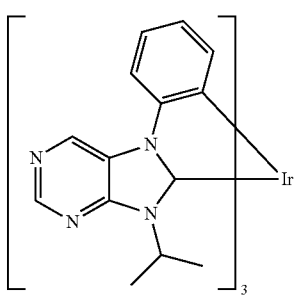
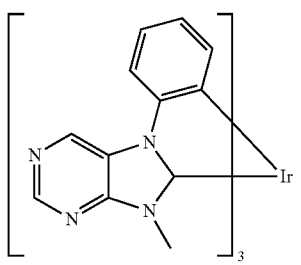
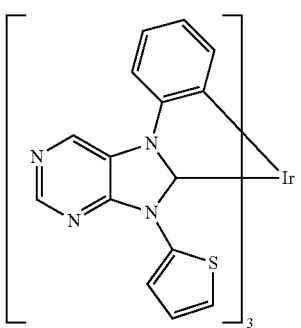
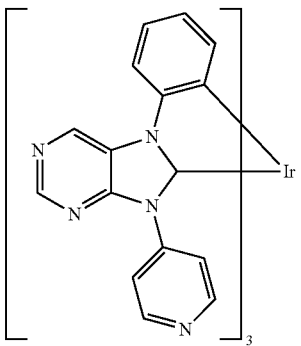
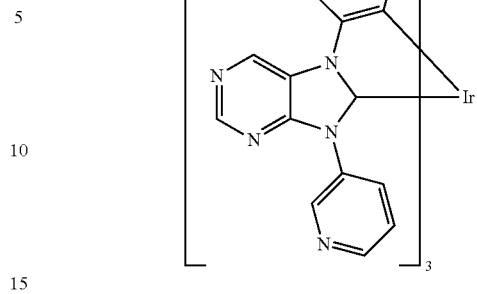
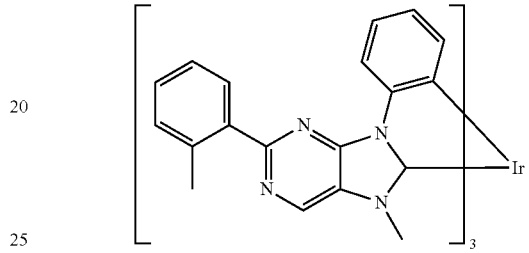
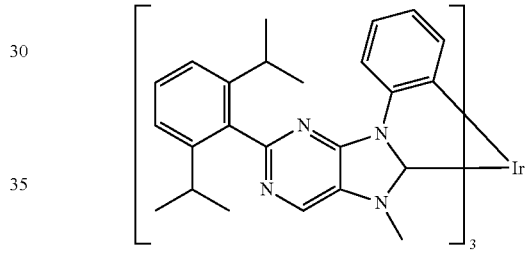
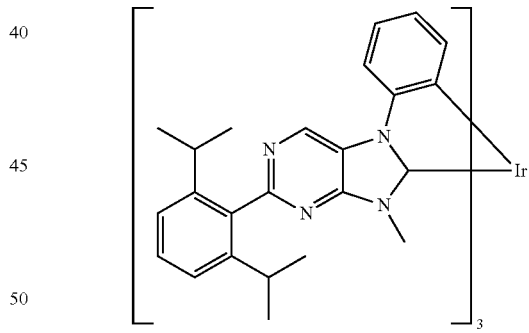
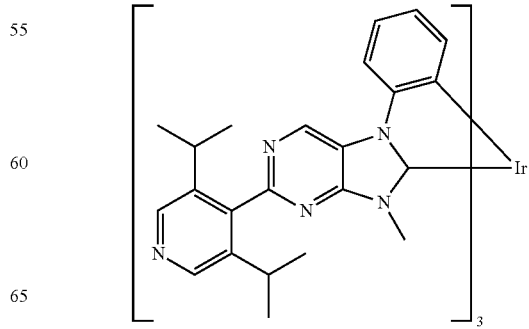

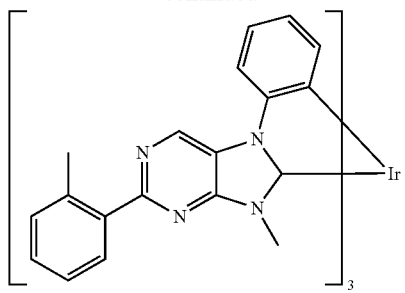
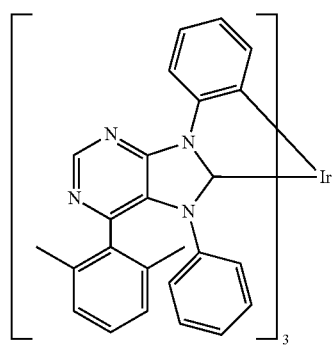
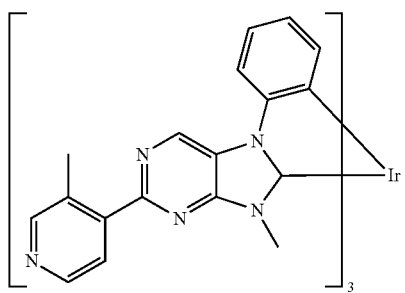
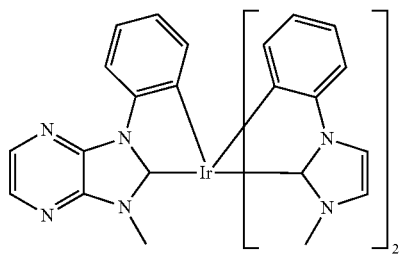
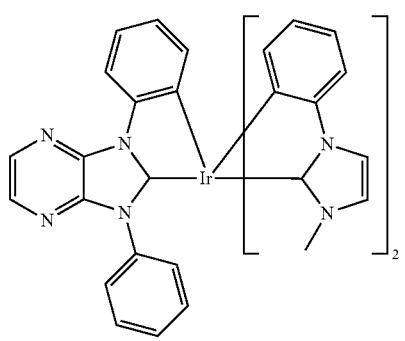
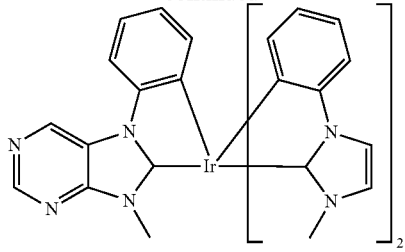
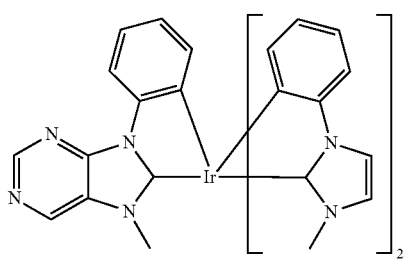
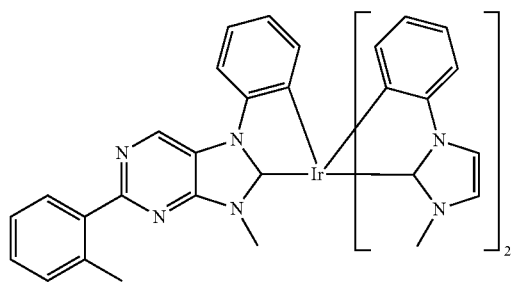
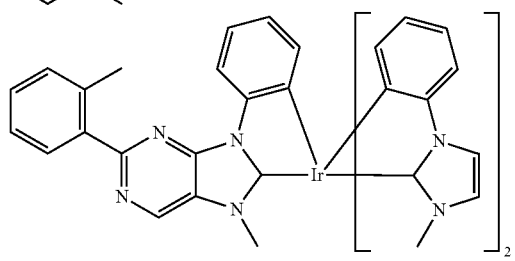
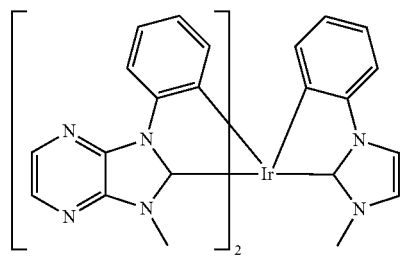
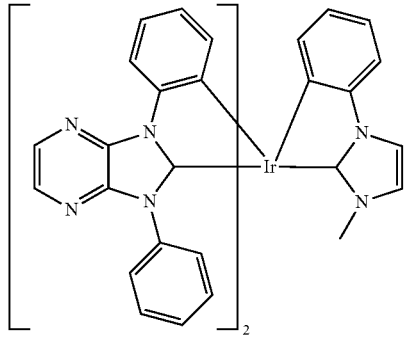

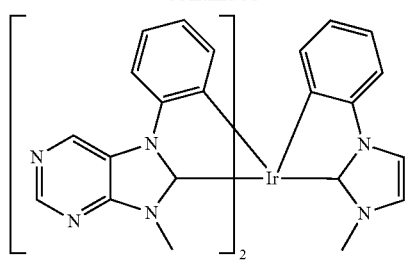
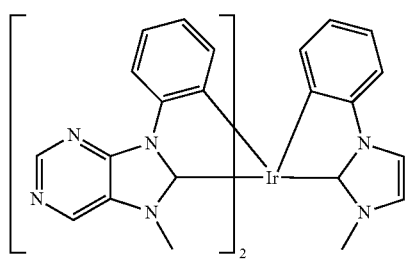
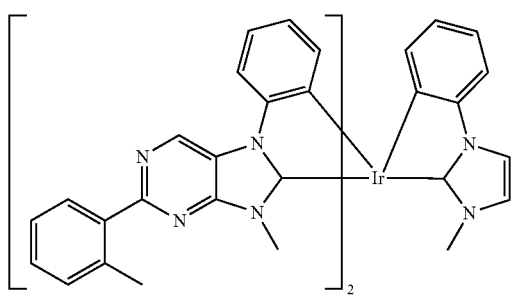
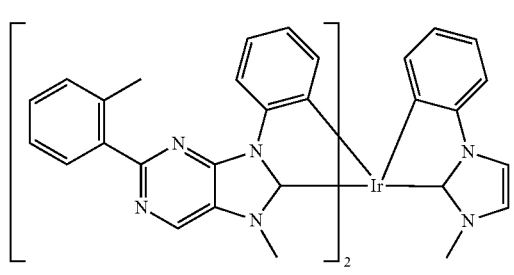
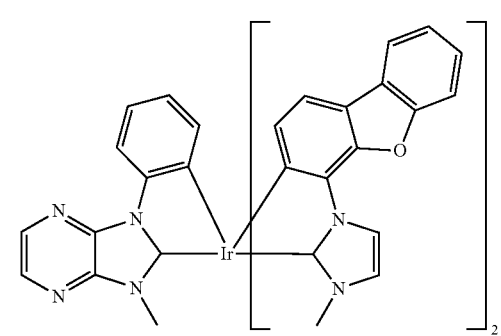
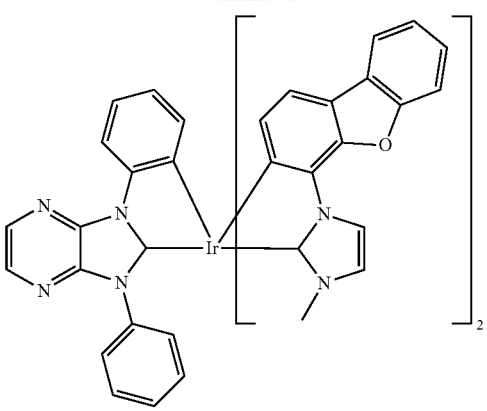
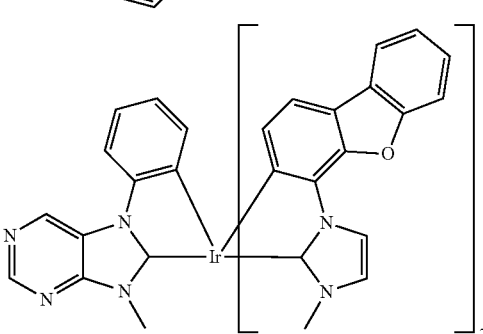
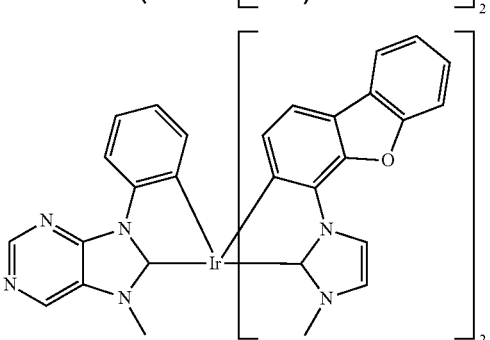
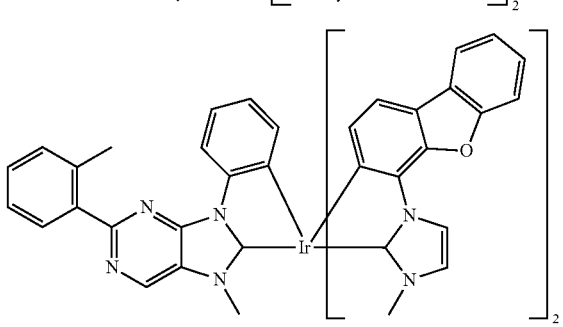
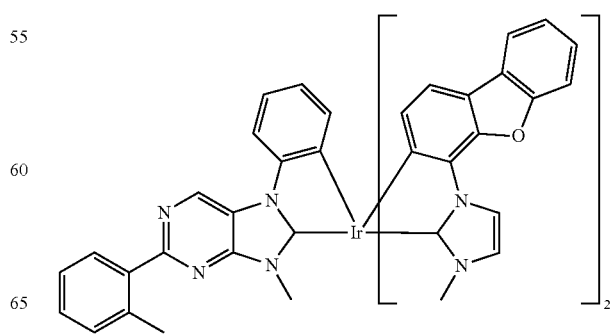

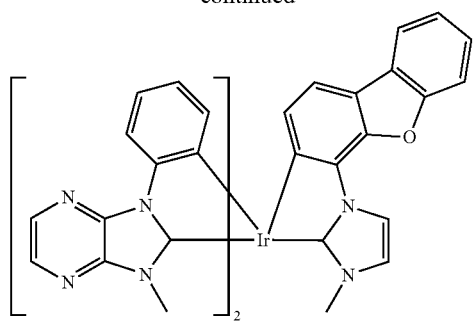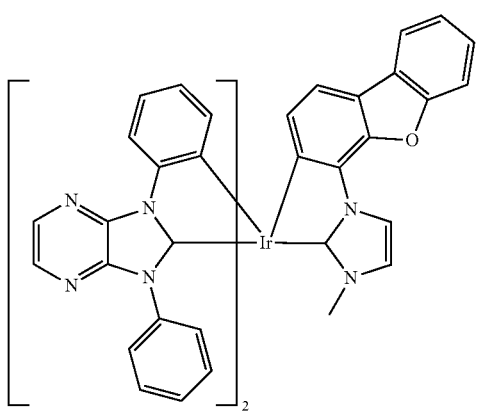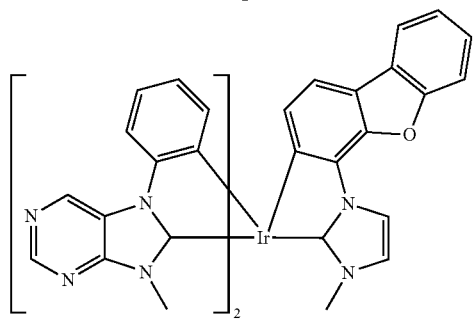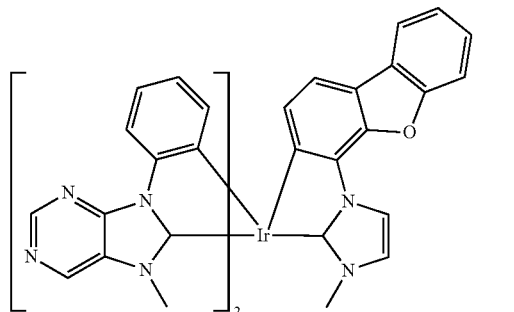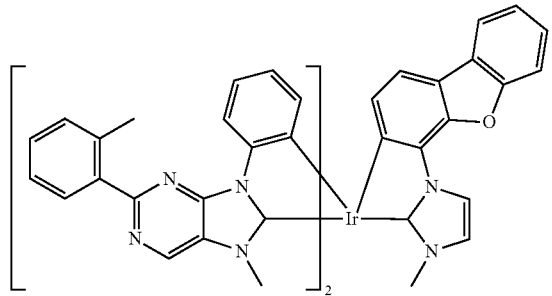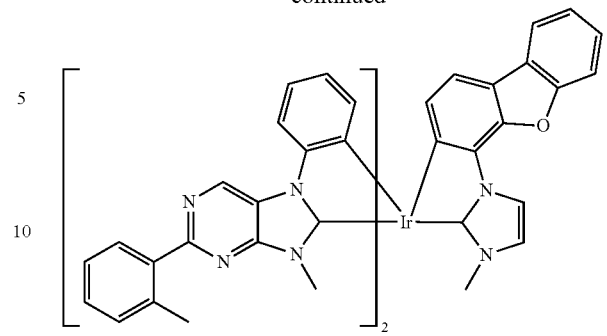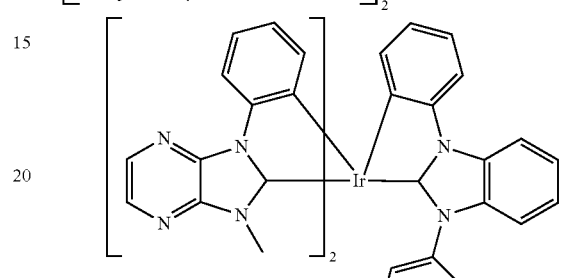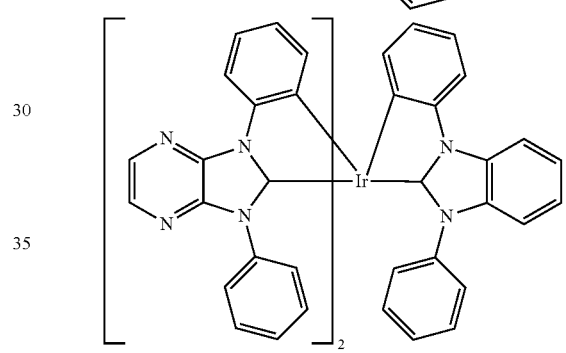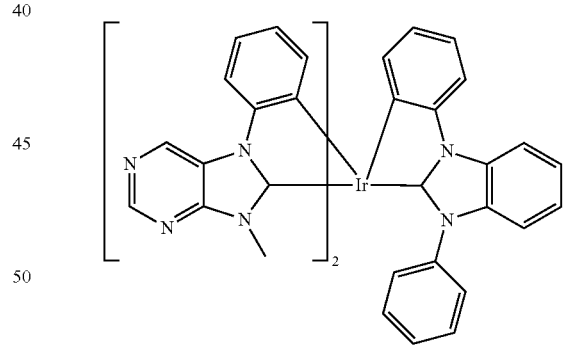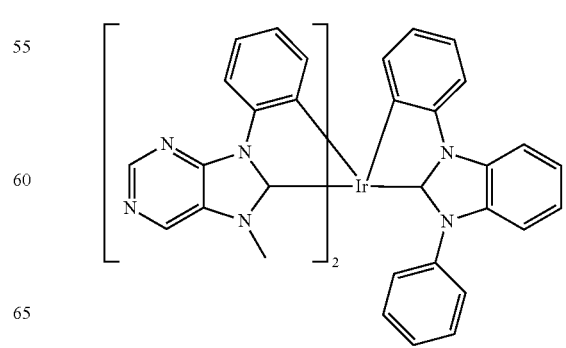

-continued
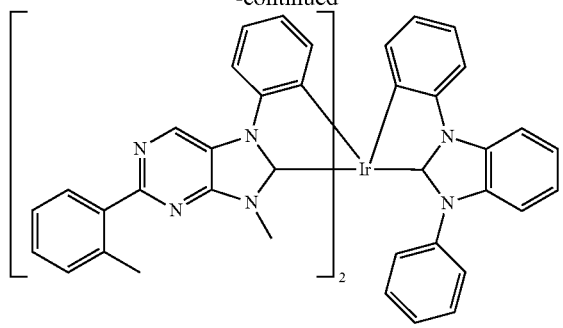
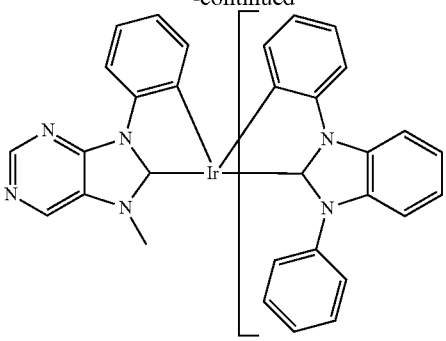
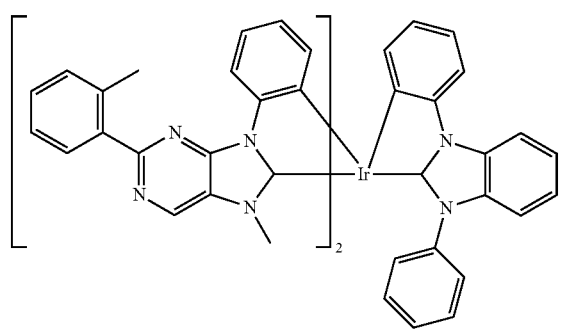
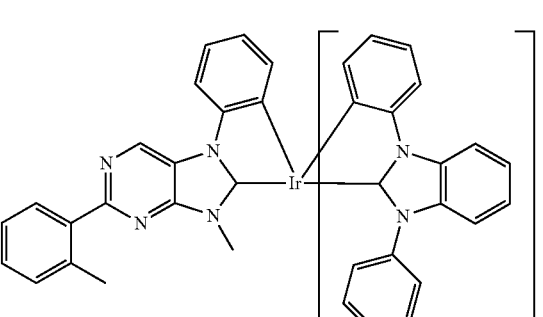
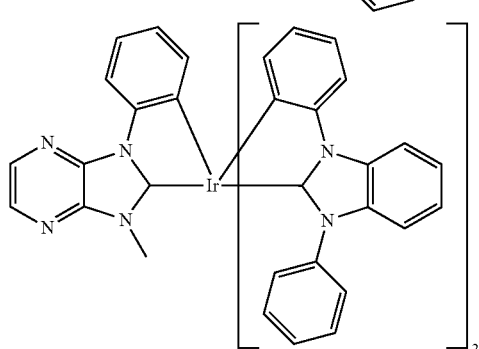
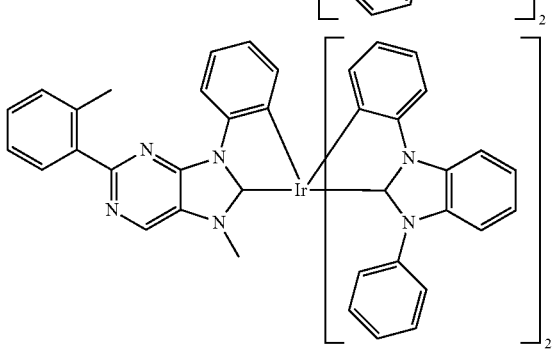
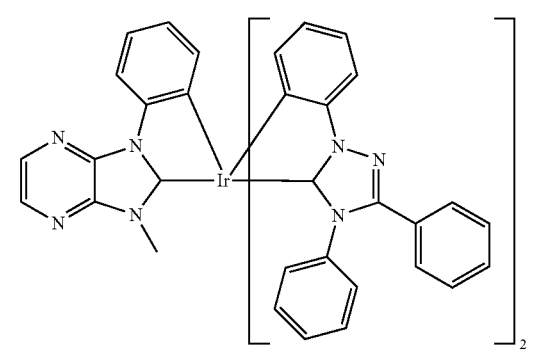
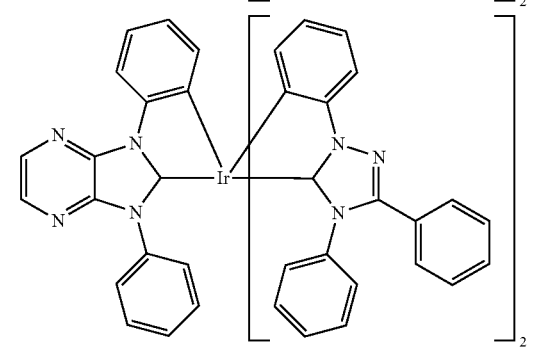

33
-continued
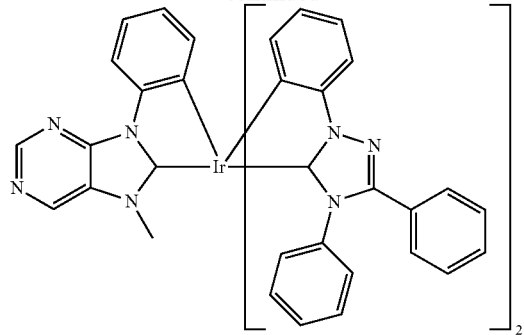
34
-continued
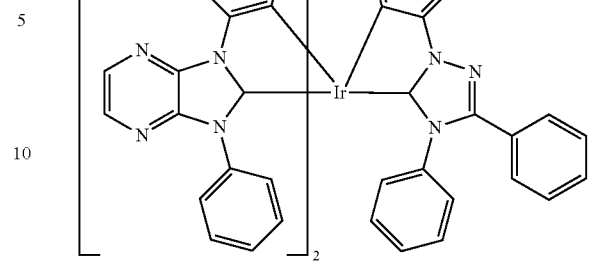
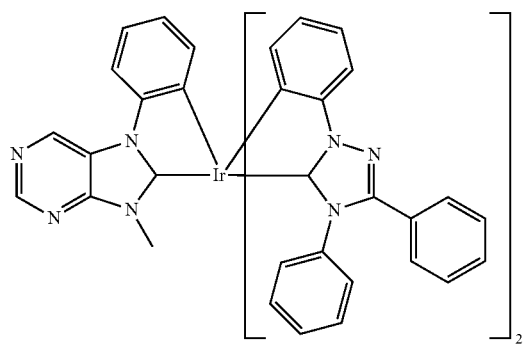
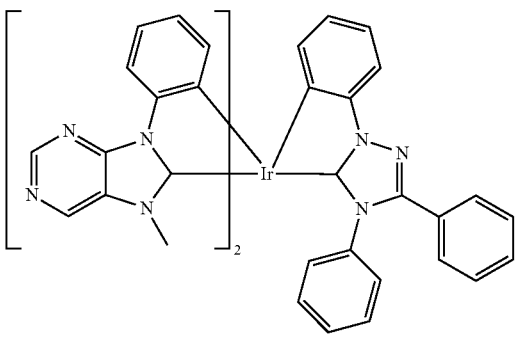
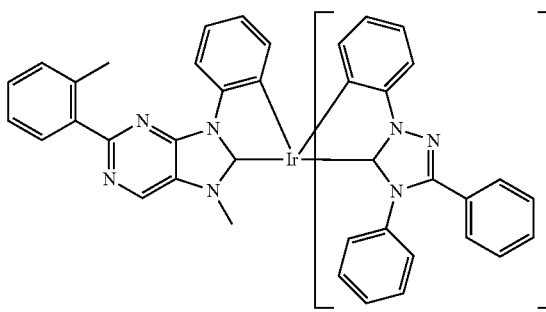
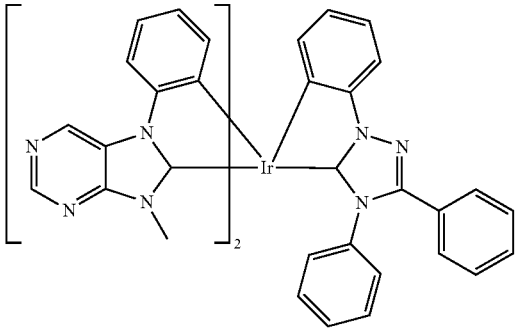
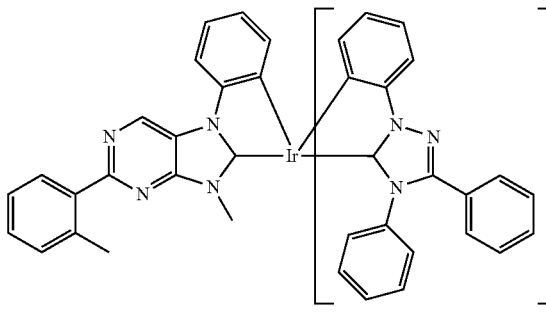
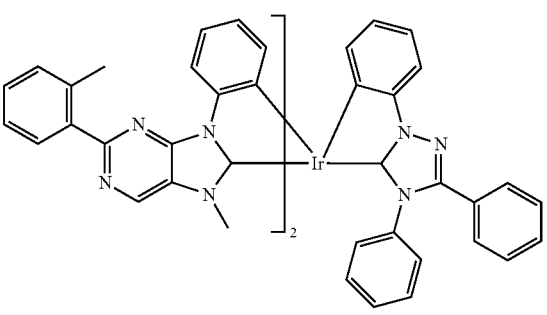
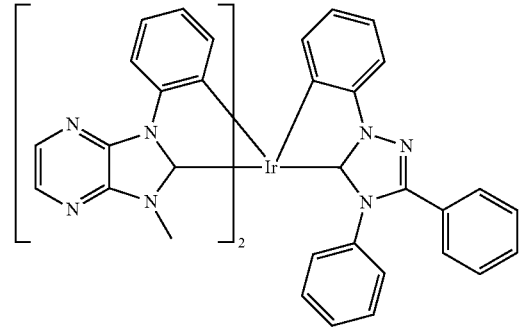
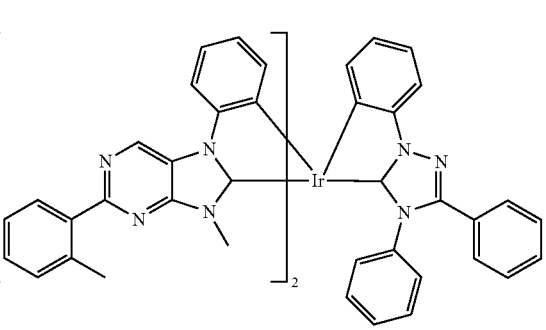

-continued
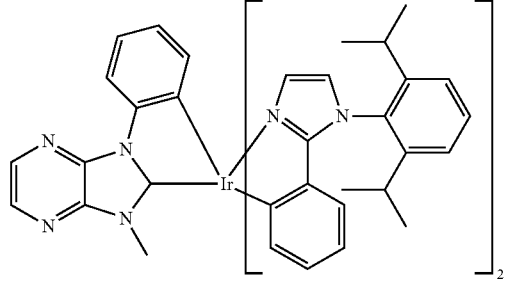
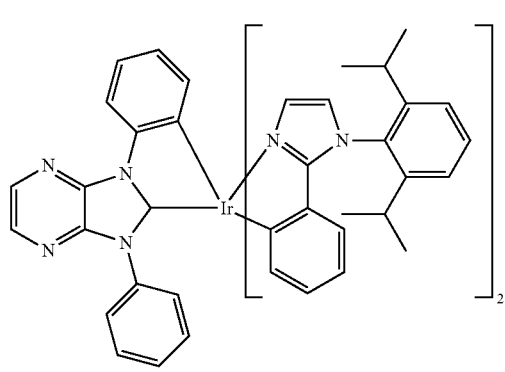
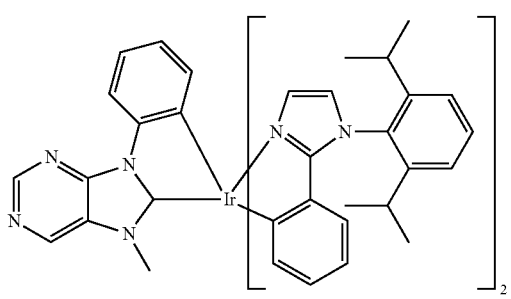
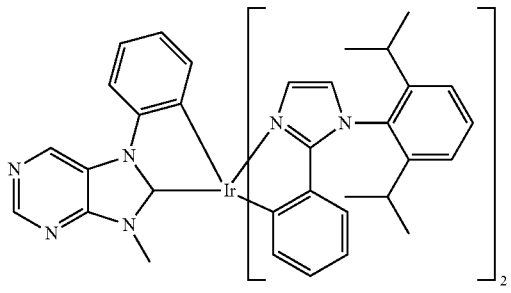
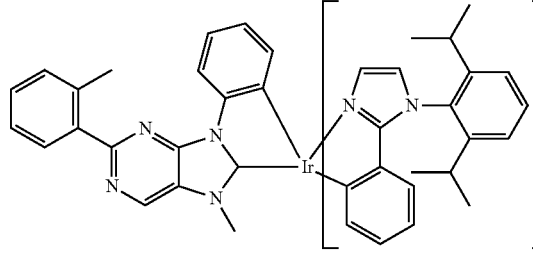
-continued
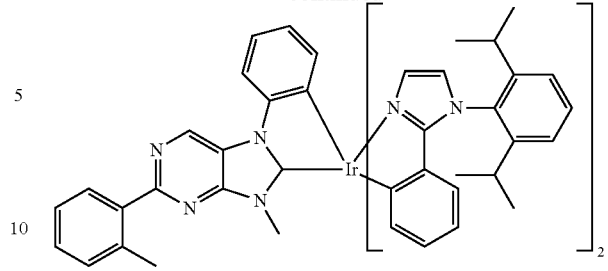
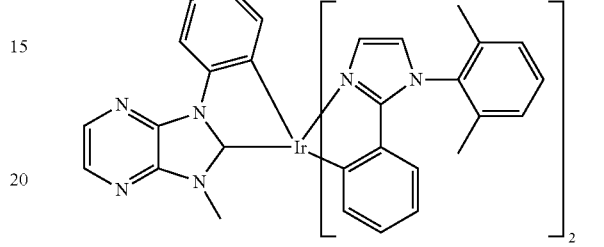
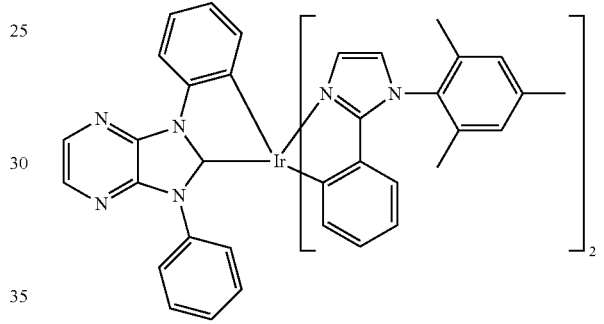
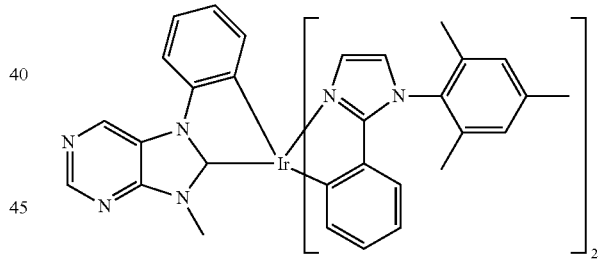
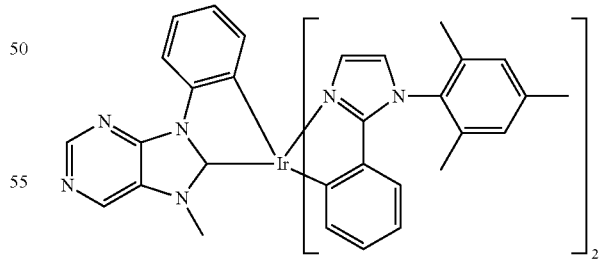
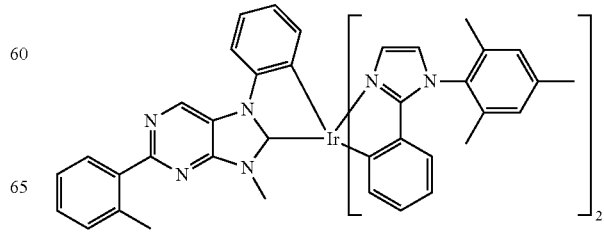

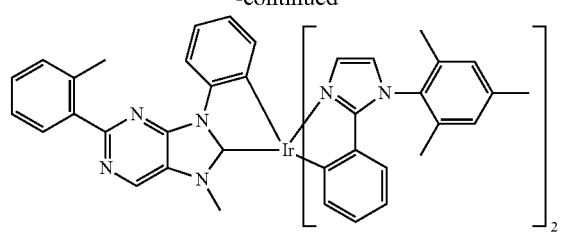
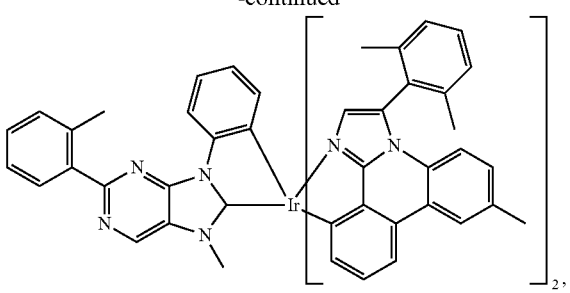
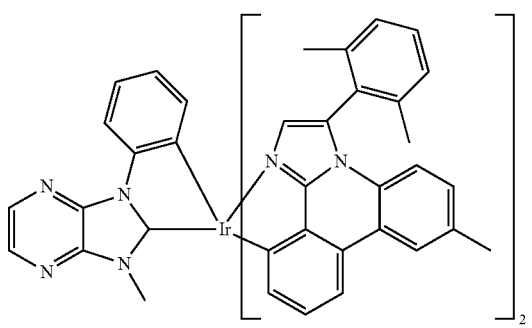
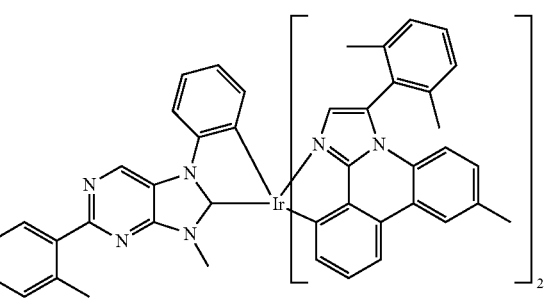
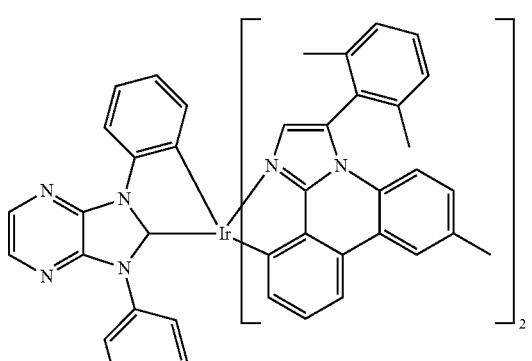
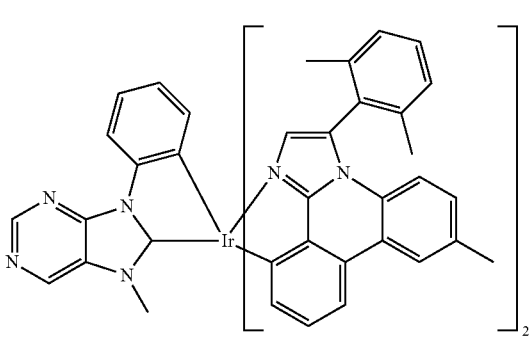
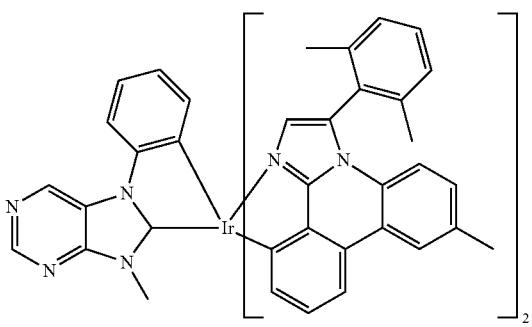
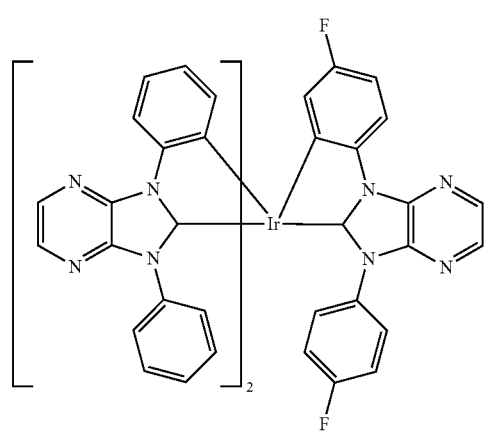

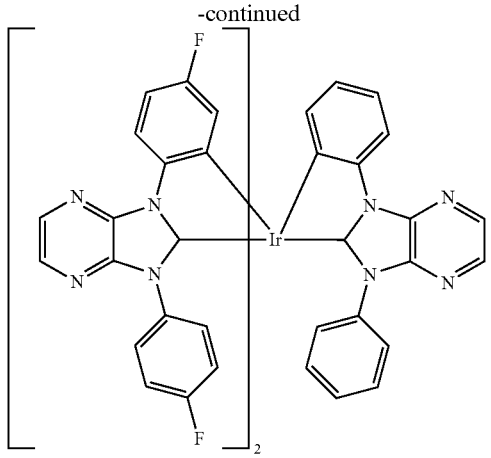

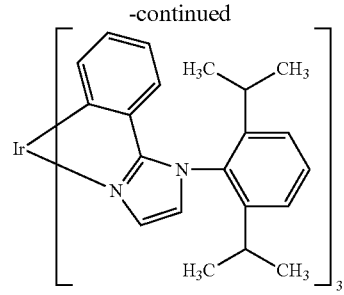

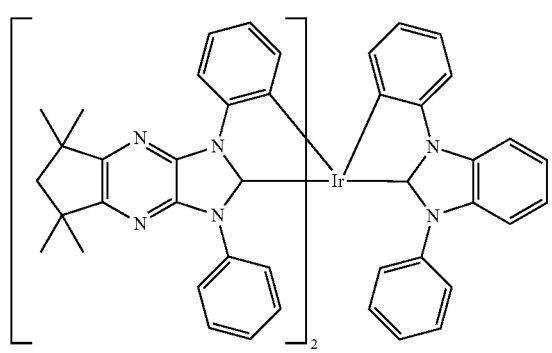

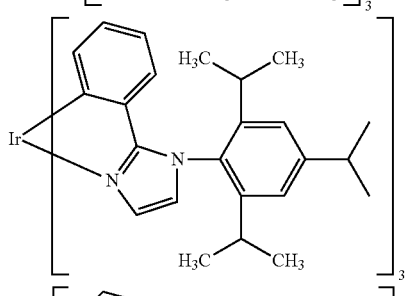

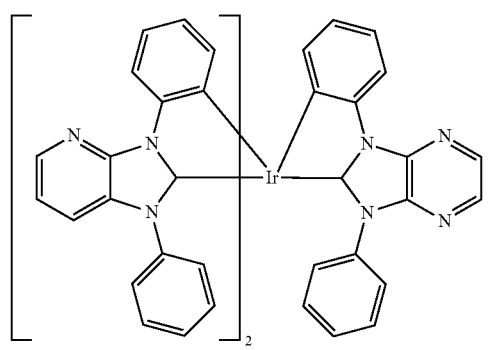

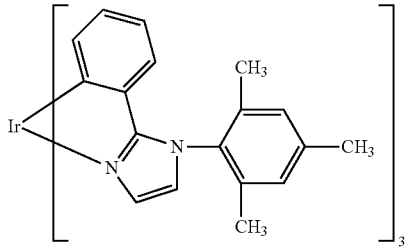

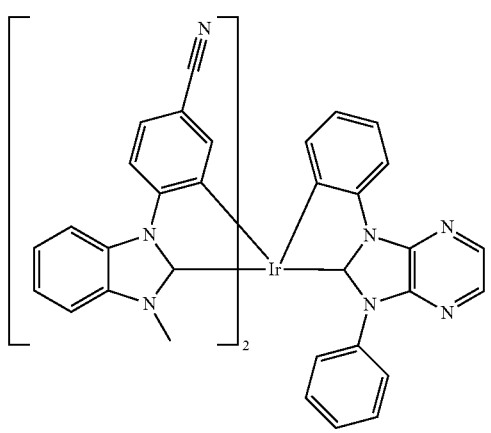

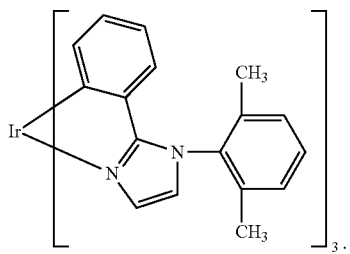

The homoleptic metal-carbene complexes may be present in the form of facial or meridional isomers, preference being given to the facial isomers.

In the case of the heteroleptic metal-carbene complexes, four different isomers may be present, preference being given to the pseudo-facial isomers.

The compound of the formula IX is more preferably a compound of the formula

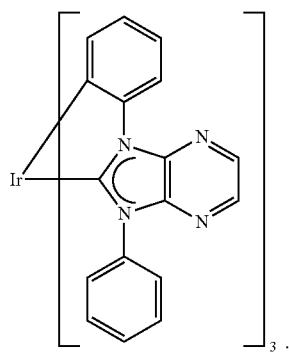

Further suitable metal complexes are the commercially available metal complexes tris(2-phenylpyridine)iridium (III), iridium(III) tris(2-(4-tolyl)pyridinato-N,C²'), bis(2-phenylpyridine)(acetylacetonato)iridium(III), iridium(III) tris(1-phenylisoquinoline), iridium(III) bis(2,2'-benzothienyl)pyridinato-N,C³')(acetylacetonate), tris(2-phenylquinoline)iridium(III), iridium(III) bis(2-(4,6-difluorophenyl)pyridinato-N,C²)picolinate, iridium(III) bis(1-phenylisoquinoline)(acetylacetonate), bis(2-phenylquinoline)(acetylacetonato)iridium(III), iridium(III) bis(di-benzo[f,h]quinoxaline)(acetylacetonate), iridium(III) bis(2-methyldibenzo[f,h]quinoxaline)(acetylacetonate) and tris(3-methyl-1-phenyl-4-trimethylacetyl-5-pyrazolino)terbium(III), bis[1-(9,9-dimethyl-9H-fluoren-2-yl)isoquinoline](acetylacetonato)iridium(III), bis(2-phenylbenzothiazolato)(acetylacetonato)iridium(III), bis(2-(9,9-dihexylfluorenyl)-1-pyridine)(acetylacetonato)iridium(III), bis(2-benzo[b]thiophen-2-yl-pyridine)(acetylacetonato)iridium(III).

In addition, the following commercially available materials are suitable: tris(dibenzoylacetonato)mono(phenanthroline)europium(III), tris(dibenzoylmethane)-mono(phenanthroline)europium(III), tris(dibenzoylmethane)mono(5-aminophenanthroline)-europium(III), tris(di-2-naphthoylmethane)mono(phenanthroline)europium(III), tris(4-bromobenzoylmethane)mono(phenanthroline)europium(III), tris(di(biphenyl)methane)-mono(phenanthroline)europium(III), tris(dibenzoylmethane)mono(4,7-diphenyl-phenanthroline)europium(III), tris(dibenzoylmethane)mono(4,7-di-methyl-phenanthroline)europium(III), tris(dibenzoylmethane)mono(4,7-dimethylphenanthrolinedisulfonic acid)europium(III) disodium salt, tris[di(4-(2-(2-ethoxyethoxy)ethoxy)-benzoylmethane)]mono(phenanthroline)europium(III) and tris[d][4-(2-(2-ethoxyethoxy)ethoxy)benzoylmethane)]mono(5-aminophenanthroline)europium(III), osmium(II) bis(3-(trifluoromethyl)-5-(4-tert-butylpyridyl)-1,2,4-triazolato) diphenylmethylphosphine, osmium(II) bis(3-(trifluoromethyl)-5-(2-pyridyl)-1,2,4-triazole) dimethylphenylphosphine, osmium(II) bis(3-(trifluoromethyl)-5-(4-tert-butylpyridyl)-1,2,4-triazolato) dimethylphenylphosphine, osmium(II) bis(3-(trifluoromethyl)-5-(2-pyridyl)-pyrazolato) dimethylphenylphosphine, tris[4,4'-di-tert-butyl(2,2')-bipyridine]ruthenium(III), osmium(II) bis(2-(9,9-dibutylfluorenyl)-1-isoquinoline(acetylacetonate).

Suitable triplet emitters are, for example, carbene complexes. In one embodiment of the present invention, the compounds of the formula X are used in the light-emitting layer as matrix material together with carbene complexes as triplet emitters.

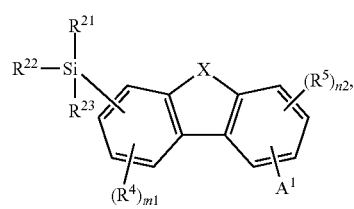

(X)

wherein

X is NR, S, O or PR;

R is aryl, heteroaryl, alkyl, cycloalkyl, or heterocycloalkyl;

A¹ is —NR⁶R⁷, —P(O)R⁸R⁹, —PR¹⁰R¹¹, —S(O)₂R¹², —S(O)R¹³, —SR¹⁴, or —OR¹⁶;

R²¹, R²² and R²³ are independently of each other aryl, heteroaryl, alkyl, cycloalkyl, or heterocycloalkyl, wherein at least on of the groups R¹, R², or R³ is aryl, or heteroaryl;

R⁴ and R⁵ are independently of each other alkyl, cycloalkyl, heterocycloalkyl, aryl, heteroaryl, a group A¹, or a group having donor, or acceptor characteristics;

n2 and m1 are independently of each other 0, 1, 2, or 3;

R⁶, R⁷ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and R⁵, R⁹, R¹⁰, R¹¹, R¹², R¹³, R¹⁴ and R¹⁵ are independently of each other aryl, heteroaryl, alkyl, cycloalkyl, or heterocycloalkyl. Compounds of formula X, such as, for example,

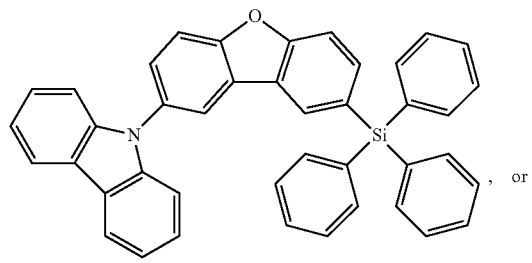

, or

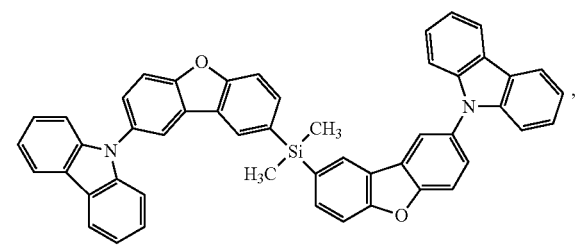

, are described in WO2010079051 (PCT/EP2009/067120; in particular pages on 19 to 26 and in tables on pages 27 to 34, pages 35 to 37 and pages 42 to 43).

Additional matrix materials on basis of dibenzofurane are, for example, described in US2009066226, EP1885818B1, EP1970976, EP1998388 and EP2034538. Examples of particularly preferred matrix materials are shown below:

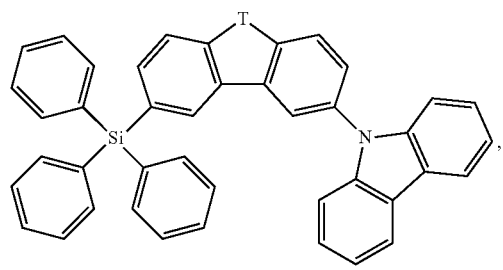,
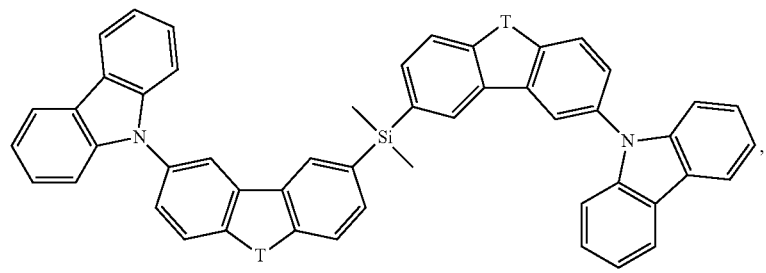,
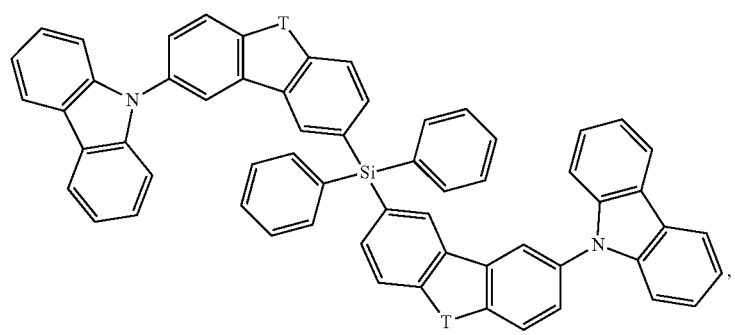,
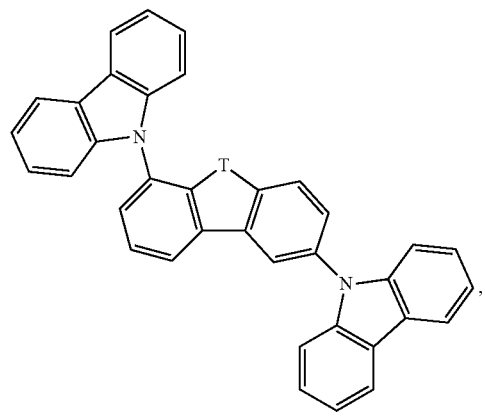,
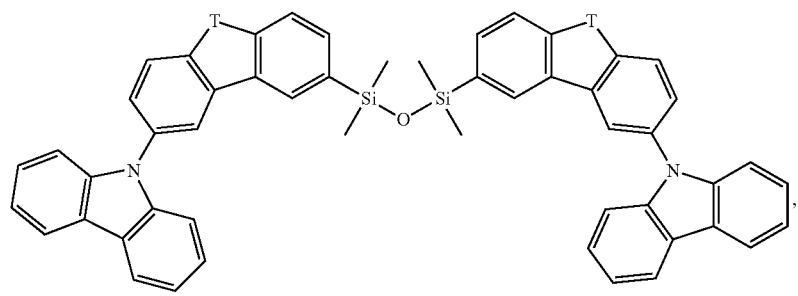,

-continued
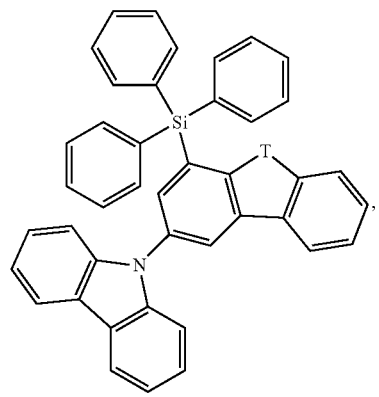
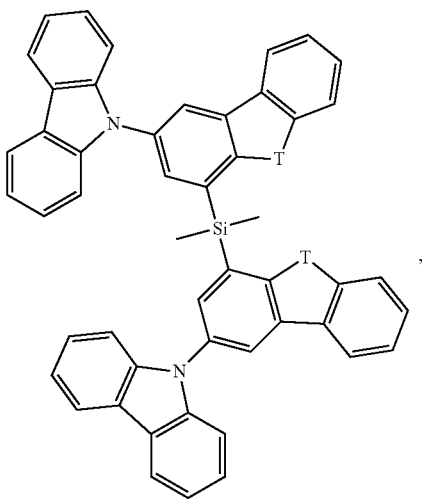
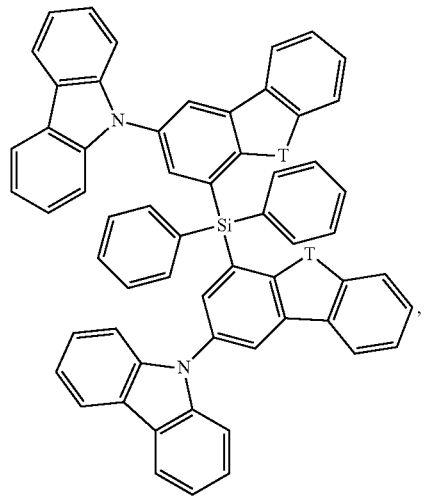
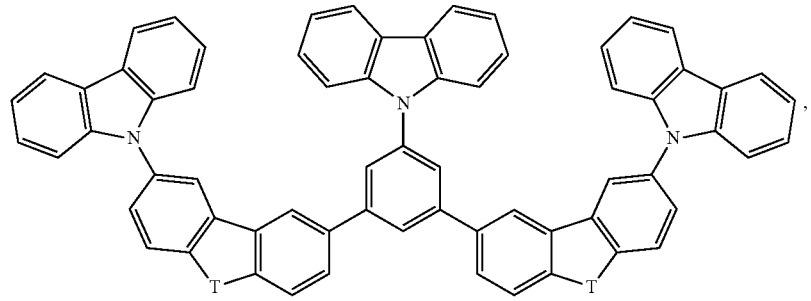
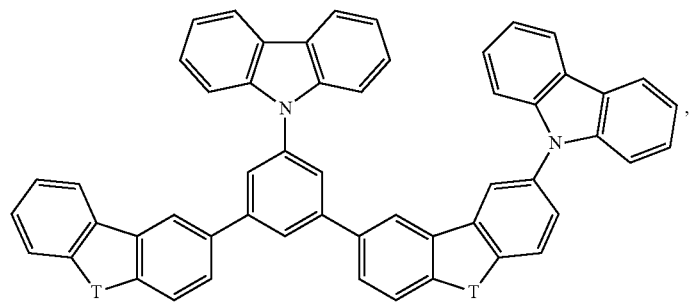

-continued
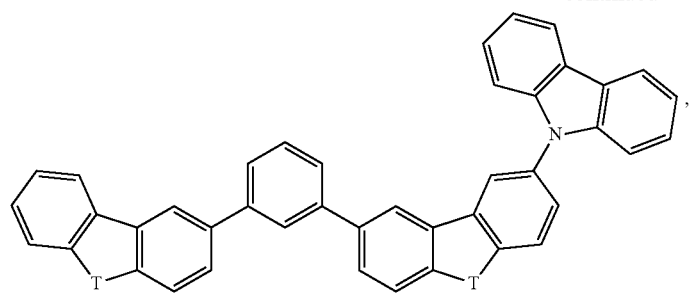
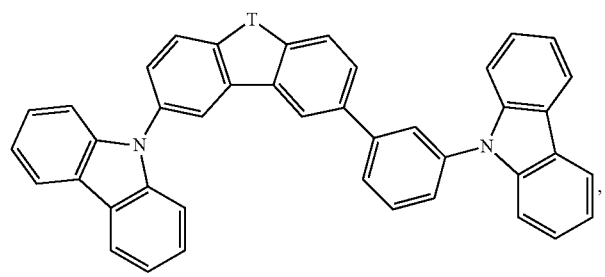
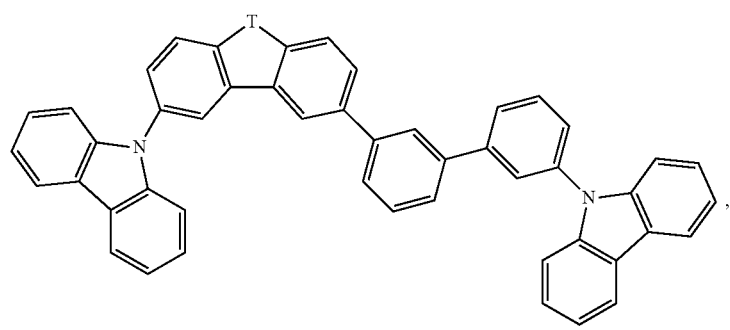
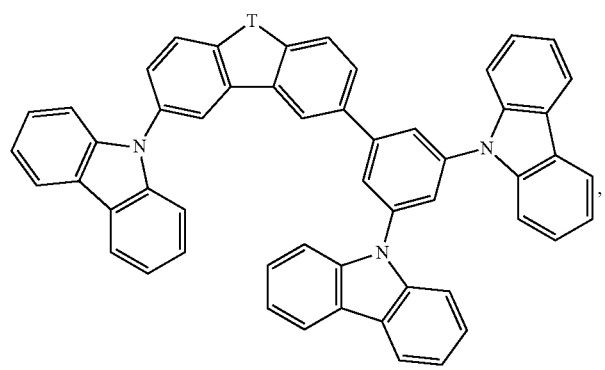
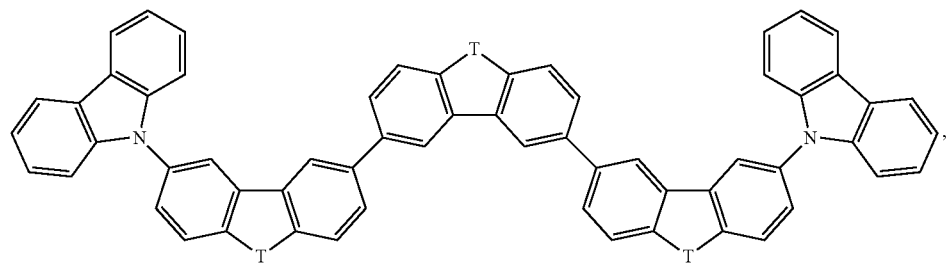

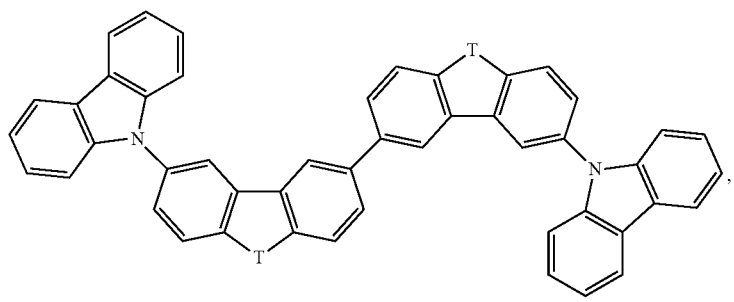
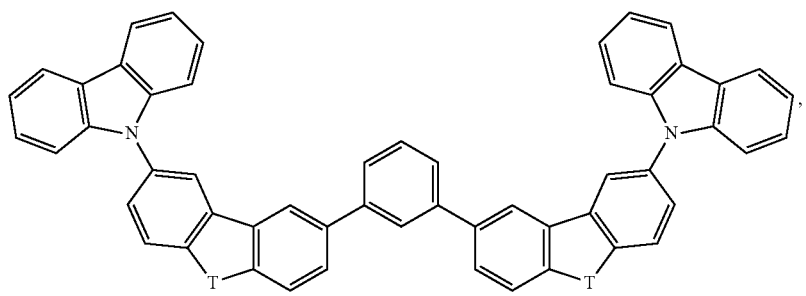
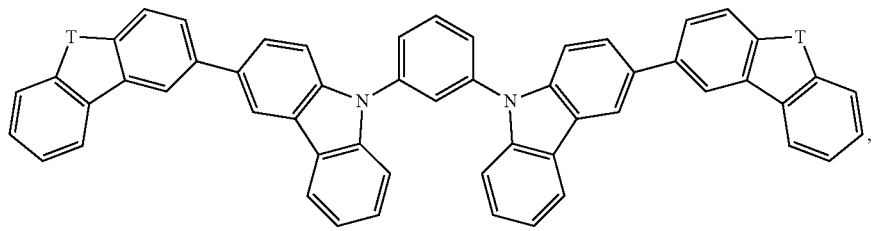
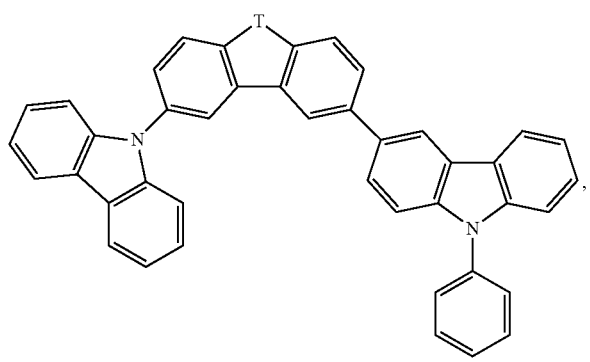
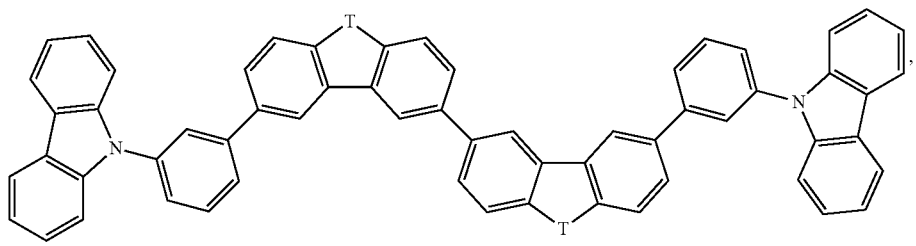

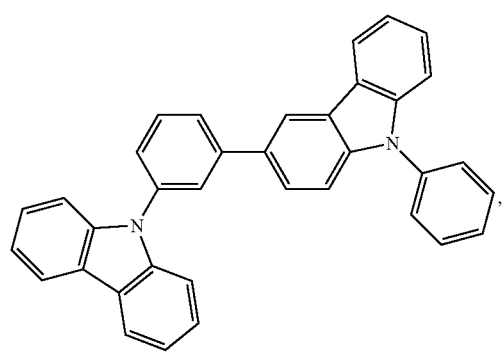
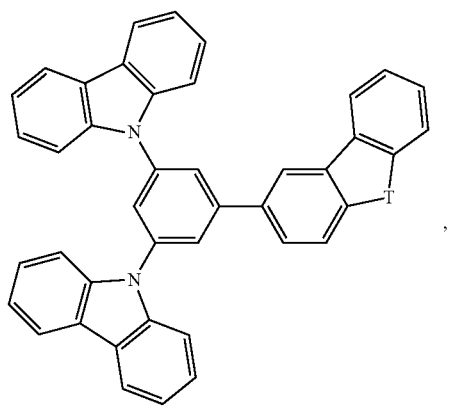
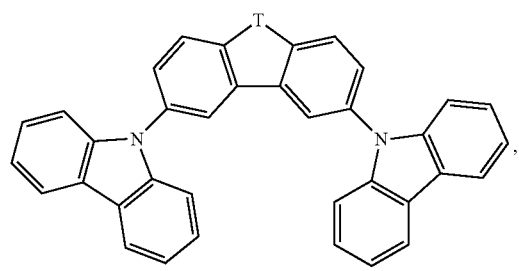
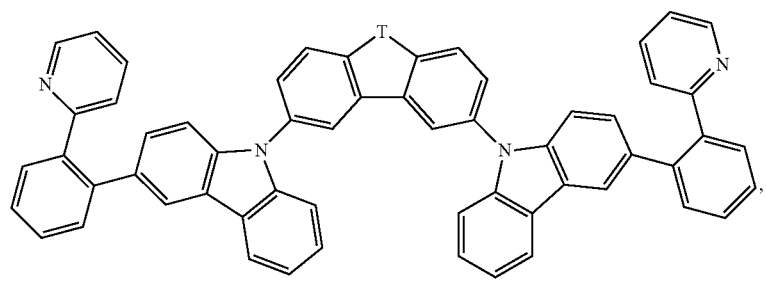
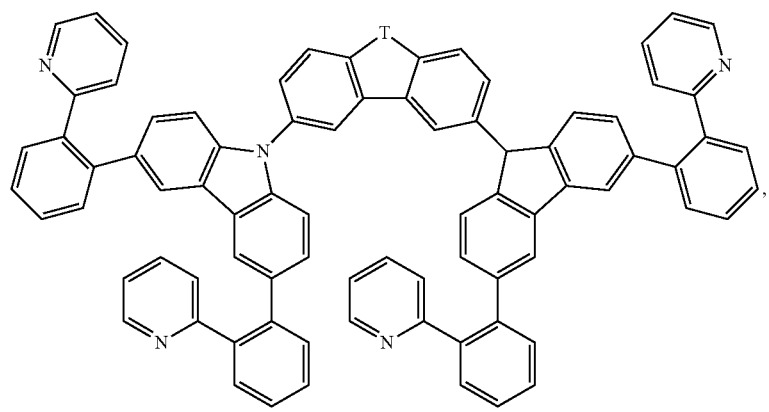
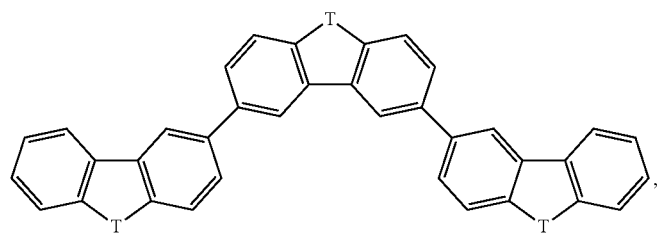

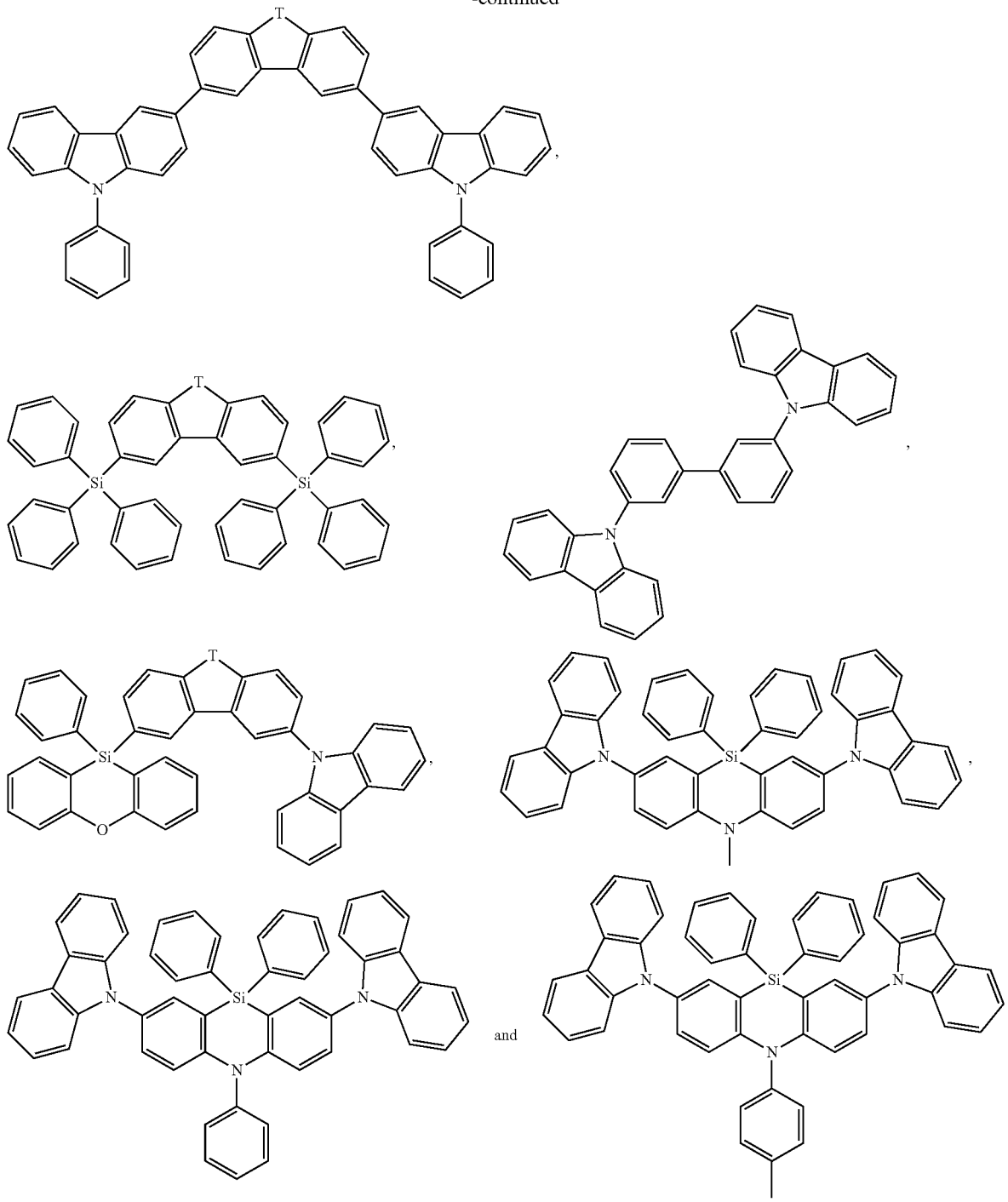

In the above-mentioned compounds T is O, or S, preferably O. If T occurs more than one time in a molecule, all groups T have the same meaning.

Suitable carbene complexes are known to those skilled in the art and are described, for example, in WO 2005/019373 A2, WO 2006/056418 A2, WO 2005/113704, WO 2007/115970, WO 2007/115981 and WO 2008/000727.

The light-emitting layer may comprise further components in addition to the emitter material. For example, a fluorescent dye may be present in the light-emitting layer in order to alter the emission color of the emitter material. In addition—in a preferred embodiment—a matrix material can be used. This matrix material may be a polymer, for example poly(N-vinylcarbazole) or polysilane. The matrix material may, however, be a small molecule, for example 4, 4'-N,N'-dicarbazolebiphenyl (CDP=CBP) or tertiary aromatic amines, for example TCTA. In a preferred embodiment of the present invention, at least one of the above-mentioned matrix materials on basis of dibenzofurane, especially at least one of the compounds of the formula X is used as matrix material.

In a preferred embodiment, the light-emitting layer is formed from 2 to 20% by weight, preferably 5 to 17% by weight, of at least one of the aforementioned emitter materials and 80 to 98% by weight, preferably 83 to 95% by weight, of at least one of the aforementioned matrix materials—in one embodiment at least one compound of the formula X—where the sum total of the emitter material and of the matrix material adds up to 100% by weight.

In a preferred embodiment, the light-emitting layer comprises a compound of formula X, such as, for example,

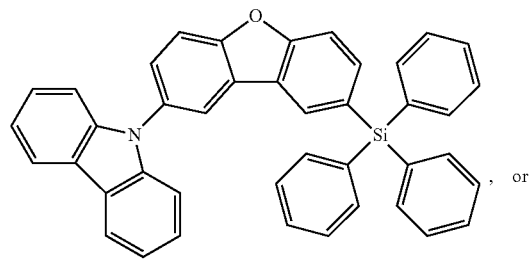

, or

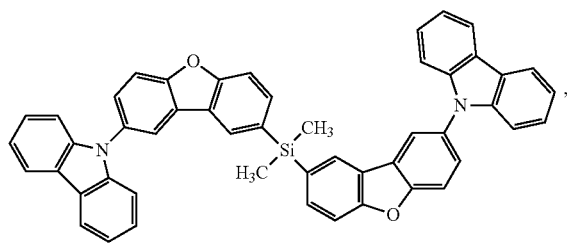

and two carbene complexes, preferably of formula

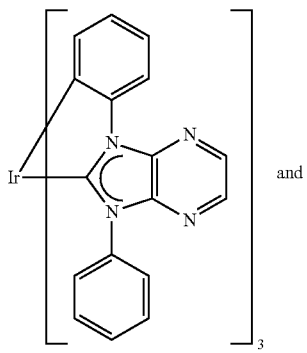

and

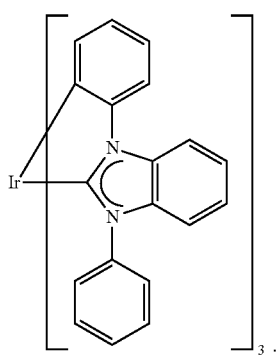

In said embodiment, the light-emitting layer is formed from 2 to 40% by weight, preferably 5 to 35% by weight, of

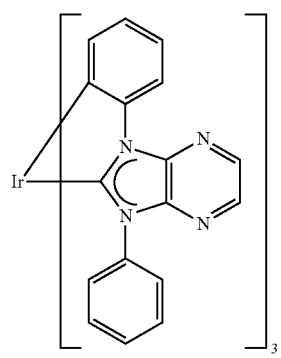

and 60 to 98% by weight, preferably 65 to 95% by weight, of a compound of the formula X and

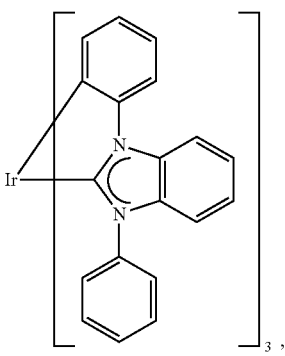

where the sum total of the carben complexes and of the compound of formula X adds up to 100% by weight.

In a further embodiment, the above-mentioned matrix materials on basis of dibenzofurane, especially the compounds of the formula X are used as hole/exciton blocker material, preferably together with carbene complexes as triplet emitters. The above-mentioned matrix materials on basis of dibenzofurane, especially compounds of the formula X may be used as matrix materials or both as matrix materials and as hole/exciton blocker materials together with carbene complexes as triplet emitters.

Suitable metal complexes for use together with the above-mentioned matrix materials on basis of dibenzofurane, especially compounds of the formula X as matrix material and/or hole/exciton blocker material, in OLEDs are thus, for example, also carbene complexes as described in WO 2005/019373 A2, WO 2006/056418 A2, WO 2005/113704, WO 2007/115970, WO 2007/115981 and WO 2008/000727. Explicit reference is made here to the disclosure of the WO applications cited, and these disclosures shall be considered to be incorporated into the content of the present application.

Hole blocker materials typically used in OLEDs are the above-mentioned matrix materials on basis of dibenzofurane, especially compounds of formula X, 2,6-bis(N-carbazolyl) pyridine (mCPy), 2,9-dimethyl-4,7-diphenyl-1,10-phenanthroline (bathocuproin, (BCP)), bis(2-methyl-8-quinolinato)-4-phenylphenylato)aluminum(III) (BAlq), phenothiazine S,S-dioxide derivates and 1,3,5-tris(N-phenyl-2-benzylimidazolyl)benzene) (TPBI), TPBI also being suitable as electron-conducting material. Further suitable hole blockers and/or electron transport materials are 2,2',2"-(1,3, 5-benzenetriyl)tris(1-phenyl-1-H-benzimidazole), 2-(4-biphenylyl)-5-(4-tert-butylphenyl)-1,3,4-oxadiazole, 8-hydroxyquinolinolatolithium, 4-(naphthalen-1-yl)-3,5-diphenyl-4H-1,2,4-triazole, 1,3-bis[2-(2,2'-bipyridin-6-yl)-1,3,4-oxadiazo-5-yl]benzene, 4,7-diphenyl-1,10-phenanthroline, 3-(4-bi-phenylyl)-4-phenyl-5-tert-butylphenyl-1,2,4-triazole, 6,6'-bis[5-(biphenyl-4-yl)-1,3,4-oxadiazo-2-yl]-2,2'-bipyridyl, 2-phenyl-9,10-di(naphthalene-2-yl)anthracene, 2,7-bis[2-(2,2'-bipyridin-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalene-2-yl)-4,7-diphenyl-1,10-phenanthroline, tris-(2,4,6-trimethyl-3-(pyridin-3-yl)phenyl)borane, 2,9-bis(naphthalene-2-yl)-4,7-diphenyl-1,10-phenanthroline, 1-methyl-2-(4-(naphthalene-2-yl)phenyl)-1H-imidazo[4,5-f][1,10]-phenanthroline. In a further embodiment, it is possible to use compounds which comprise aromatic or heteroaromatic rings joined via groups comprising carbonyl groups, as disclosed in WO2006/100298, disilyl compounds selected from the group consisting of disilylcarbazoles, disilylbenzofurans, disilylbenzothiophenes, disilylbenzophospholes, disilylbenzothiophene S-oxides and disilylbenzothiophene S,S-dioxides, as specified, for example, in WO2009003919 (PCT/EP2008/058207) and WO2009003898 (PCT/EP2008/058106) and disilyl compounds as disclosed in WO2008/034758, as a blocking layer for holes/excitons (4) or as matrix materials in the light-emitting layer (3).

In a preferred embodiment, the present invention relates to an inventive OLED comprising the layers (1) anode, (2) hole transport layer, (3) light-emitting layer, (4) blocking layer for holes/excitons, (5) electron transport layer and (6) cathode, and if appropriate further layers, wherein the electron transport layer comprises the organic metal complex of formula I and the compound of formula II, or III.

The electron transport layer (5) of the inventive OLEDs comprises the organic metal complex of formula I and the compound of formula II, or III. The layer (5) preferably improves the mobility of the electrons.

Among the materials mentioned above as hole transport materials and electron transport materials, some may fulfil several functions. For example, some of the electron-transporting materials are simultaneously hole-blocking materials when they have a low-lying HOMO. These can be used, for example, in the blocking layer for holes/excitons (4).

The charge transport layers can also be electronically doped in order to improve the trans-port properties of the materials used, in order firstly to make the layer thicknesses more generous (avoidance of pinholes/short circuits) and in order secondly to minimize the operating voltage of the device. For example, the hole transport materials can be doped with electron acceptors; for example, phthalocyanines or arylamines such as TPD or TDTA can be doped with tetrafluorotetracyanquinodimethane (F4-TCNQ) or with molybdenum oxide ($MoO_x$), especially $MoO_3$, or with rhenium oxide ($ReO_x$), especially $ReO_3$, or $WO_3$. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo. Appl. Phys. Lett., Vol. 82, No. 25, 23 Jun. 2003 and Pfeiffer et al., Organic Electronics 2003, 4, 89-103. For example, the hole transport layer may, in addition to a carbene complex, e.g. $Ir(dpbic)_3$, be doped with molybdenum oxide ($MoO_x$), especially $MoO_3$, or with rhenium oxide ($ReO_x$), especially $ReO_3$, or $WO_3$.

The cathode (6) is an electrode which serves to introduce electrons or negative charge carriers. Suitable materials for the cathode are selected from the group consisting of alkali metals of group Ia, for example Li, Cs, alkaline earth metals of group IIa, for example calcium, barium or magnesium, metals of group IIb of the periodic table of the elements (old IUPAC version), comprising the lanthanides and actinides, for example samarium. In addition, it is also possible to use metals such as aluminum or indium, and combinations of all metals mentioned. In addition, lithium-comprising organometallic compounds or potassium fluoride (KF) can be applied between the organic layer and the cathode in order to reduce the operating voltage.

The OLED according to the present invention may additionally comprise further layers which are known to those skilled in the art. For example, a layer which facilitates the trans-port of the positive charge and/or matches the band gaps of the layers to one another may be applied between the layer (2) and the light-emitting layer (3). Alternatively, this further layer may serve as a protective layer. In an analogous manner, additional layers may be present between the light-emitting layer (3) and the layer (4) in order to facilitate the trans-port of negative charge and/or to match the band gaps between the layers to one another. Alternatively, this layer may serve as a protective layer.

In a preferred embodiment, the inventive OLED, in addition to layers (1) to (6), comprises at least one of the following layers mentioned below:
a hole injection layer between the anode (1) and the hole-transport layer (2);
a blocking layer for electrons between the hole-transport layer (2) and the light-emitting layer (3);
an electron injection layer between the electron-transport layer (5) and the cathode (6).

Materials for a hole injection layer may be selected from copper phthalocyanine, 4,4',4"-tris(N-3-methylphenyl-N-phenylamino)triphenylamine (m-MTDATA), 4,4',4"-tris(N-(2-naphthyl)-N-phenylamino)triphenylamine (2T-NATA), 4,4',4"-tris(N-(1-naphthyl)-N-phenylamino)triphenylamine (1T-NATA), 4,4',4"-tris(N,N-diphenylamino)triphenylamine (NATA), titanium oxide phthalocyanine, 2,3,5,6-tetrafluoro-7,7,8,8-tetracyanoquino-dimethane (F4-TCNQ), pyrazino[2,3-f][1,10]phenanthroline-2,3-dicarbonitrile (PPDN), N,N,N',N'-tetrakis(4-methoxyphenyl)benzidine (MeO-TPD), 2,7-bis[N,N-bis(4-methoxyphenyl)amino]-9,9-spirobifluorene (MeO-Spiro-TPD), 2,2'-bis[N,N-bis(4-methoxyphenyl)amino]-9,9-spirobifluorene (2,2'-MeO-Spiro-TPD), N,N'-diphenyl-N,N'-di-[4-(N,N-ditolylamino)phenyl]benzidine (NTNPB), N,N'-diphenyl-N,N'-di-[4-(N,N-diphenyl-amino)phenyl]benzidine (NPNPB), N,N'-di(naphthalen-2-yl)-N,N'-diphenylbenzene-1,4-diamine (α-NPP). In principle, it is possible that the hole injection layer comprises at least one of the above-mentioned matrix materials on basis of dibenzofurane, especially at least one compound of the formula X as hole injection material.

As a material for the electron injection layer, KF, or Liq, for example, can be selected. KF is more preferred than Liq.

The person skilled in the art is aware (for example on the basis of electrochemical studies) of how suitable materials have to be selected. Suitable materials for the individual layers are known to those skilled in the art and are disclosed, for example, in WO 00/70655.

In addition, it is possible that some of the layers used in the inventive OLED have been surface-treated in order to increase the efficiency of charge carrier transport. The selection of the materials for each of the layers mentioned is preferably determined by obtaining an OLED with a high efficiency and lifetime.

The inventive OLED can be produced by methods known to those skilled in the art. In general, the inventive OLED is produced by successive vapor deposition of the individual layers onto a suitable substrate. Suitable substrates are, for example, glass, inorganic semi-transports, typically ITO, or IZO, or polymer films. For vapor deposition, it is possible to use customary techniques, such as thermal evaporation, chemical vapor deposition (CVD), physical vapor deposition (PVD) and others. In an alternative process, the organic layers of the OLED can be applied from solutions or dispersions in suitable solvents, employing coating techniques known to those skilled in the art.

In general, the different layers have the following thicknesses: anode (1) 50 to 500 nm, preferably 100 to 200 nm; hole-conducting layer (2) 5 to 100 nm, preferably 20 to 80 nm, light-emitting layer (3) 1 to 100 nm, preferably 10 to 80 nm, blocking layer for holes/excitons (4) 2 to 100 nm, preferably 5 to 50 nm, electron-conducting layer (5) 5 to 100 nm, preferably 20 to 80 nm, cathode (6) 20 to 1000 nm, preferably 30 to 500 nm. The relative position of the recombination zone of holes and electrons in the inventive OLED in relation to the cathode and hence the emission spectrum of the OLED can be influenced, among other factors, by the relative thickness of each layer. This means that the thickness of the electron transport layer should preferably be selected such that the position of the recombination zone is matched to the optical resonator property of the diode and hence to the emission wavelength of the emitter. The ratio of the layer thicknesses of the individual layers in the OLED depends on the materials used. The layer thicknesses of any additional layers used are known to those skilled in the art. It is possible that the electron-conducting layer and/or the hole-conducting layer have greater thicknesses than the layer thicknesses specified when they are electrically doped.

Use of the electron transport layer of the present application makes it possible to obtain OLEDs with high efficiency and with low operating voltage. Frequently, the OLEDs obtained by the use of the electron transport layer of the present application additionally have high lifetimes. The efficiency of the OLEDs can additionally be improved by optimizing the other layers of the OLEDs. Shaped substrates and novel hole-transport materials which bring about a reduction in the operating voltage or an increase in the quantum efficiency are likewise usable in the inventive OLEDs. Moreover, additional layers may be present in the OLEDs in order to adjust the energy level of the different layers and to facilitate electroluminescence.

The OLEDs may further comprise at least one second light-emitting layer. The overall emission of the OLEDs may be composed of the emission of the at least two light-emitting layers and may also comprise white light.

The OLEDs can be used in all apparatus in which electroluminescence is useful. Suitable devices are preferably selected from stationary and mobile visual display units and illumination units. Stationary visual display units are, for example, visual display units of computers, televisions, visual display units in printers, kitchen appliances and advertising panels, illuminations and information panels. Mobile visual display units are, for example, visual display units in cellphones, laptops, digital cameras, MP3 players, vehicles and destination displays on buses and trains. Further devices in which the inventive OLEDs can be used are, for example, keyboards; items of clothing; furniture; wallpaper.

In addition, the electron transport layer of the present application can be used in OLEDs with inverse structure. The structure of inverse OLEDs and the materials typically used therein are known to those skilled in the art.

In addition, the present invention relates to an apparatus selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, MP3 players, vehicles and destination displays on buses and trains; illumination units; keyboards; items of clothing; furniture; wallpaper, comprising the inventive organic electronic device, or the inventive organic layer, especially electron trans-port layer.

The following examples are included for illustrative purposes only and do not limit the scope of the claims. Unless otherwise stated, all parts and percentages are by weight.

EXAMPLES

Comparative Application Example 1

The ITO substrate used as the anode is first cleaned with commercial detergents for LCD production (Deconex® 20NS, and 250RGAN-ACID® neutralizing agent) and then in an acetone/isopropanol mixture in an ultrasound bath. To eliminate any possible organic residues, the substrate is exposed to a continuous ozone flow in an ozone oven for a further 25 minutes. This treatment also improves the hole injection properties of the ITO. Then AJ20-1000 (commercially available from Plexcore) is spin-coated and dried to form an hole injection layer (~40 nm).

Thereafter, the organic materials specified below are applied by vapor deposition to the clean substrate at a rate of approx. 0.5-5 nm/min at about $10^{-8}$ mbar. As a hole transport and exciton blocker, Ir(dpbic)$_3$ (V1) is applied to the substrate with a thickness of 45 nm, wherein the first 35 nm are doped with MoO$_x$ (~50%) to improve the conductivity.

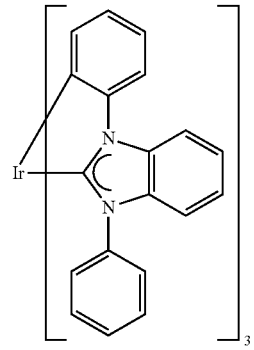

V-1

Ir(dpbic)$_3$ (for preparation, see Ir complex (7) in the application WO 2005/019373).

Subsequently, a mixture of 30% by weight of compound

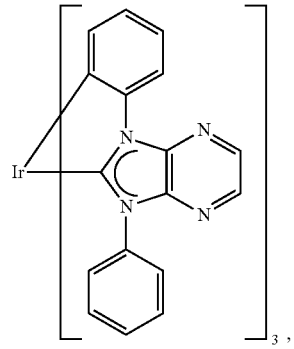

(V2)

35% by weight of compound (V-1) and 35% by weight of compound

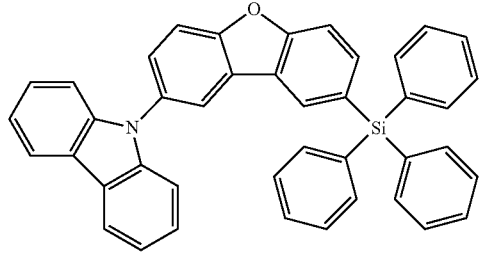

(V3, described in PCT/EP2009/067120) is applied by vapor deposition in a thickness of 20 nm.

Subsequently, the material

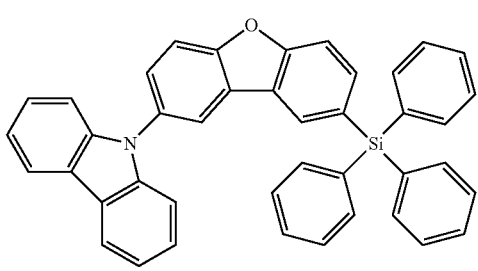 [SMILES: c1ccc([Si](c2ccccc2)(c2ccccc2)c2ccc3oc4ccc(-n5c6ccccc6c6ccccc65)cc4c3c2)cc1]

(V3)

is applied by vapor deposition with a thickness of 5 nm as exciton and hole blocker.

Next, a mixture of

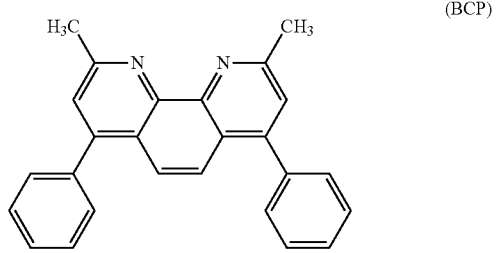 [SMILES: Cc1cc(-c2ccccc2)c2ccc3c(-c4ccccc4)cc(C)nc3c2n1]

(BCP)

50% by weight of and 50% by weight of

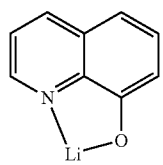

(8-hydroxyquinolinolato-lithium (Liq)) is applied as electron transport layer by vapor deposition in a thickness of 40 nm, as are a 2 nm-thick potassium fluoride layer (electron injection layer) and finally a 100 nm-thick Al electrode.

Comparative Application Example 2

Production and construction of an OLED as in the comparative application example 1, except compound A-10 is used alone instead of the mixture of BCP and Liq.

Comparative Application Example 3

Production and construction of an OLED as in the comparative application example 1, except Liq is used alone instead of the mixture of BCP and Liq.

Comparative Application Example 4

Production and construction of an OLED as in the comparative application example 1, except compound A-10 is used instead of the mixture of BCP and Liq and Liq is used instead of potassium fluoride.

Application Example 1

Production and construction of an OLED as in the comparative application example 1, except a mixture of 50% by weight of compound A-10 and 50% by weight of Liq is used instead of the mixture of BCP and Liq.

Application Example 2

Production and construction of an OLED as in the comparative application example 1, except a mixture of 50% by weight of compound A-10 and 50% by weight of Liq is used instead of the mixture of BCP and Liq and Liq is used instead of potassium fluoride.

Application Example 3

The ITO substrate used as the anode is first cleaned with commercial detergents for LCD production (Deconex® 20NS, and 250RGAN-ACID® neutralizing agent) and then in an acetone/isopropanol mixture in an ultrasound bath. To eliminate any possible organic residues, the substrate is exposed to a continuous ozone flow in an ozone oven for a further 25 minutes. This treatment also improves the hole injection properties of the ITO. Then AJ20-1000 (commercially available from Plexcore) is spin-coated and dried to form an hole injection layer (~40 nm).

Thereafter, the organic materials specified below are applied by vapor deposition to the clean substrate at a rate of approx. 0.5-5 nm/min at about $10^{-8}$ mbar. As a hole transport and exciton blocker, Ir(dpbic)$_3$ (V1) is applied to the substrate with a thickness of 40 nm, wherein the first 35 nm are doped with MoO$_x$ (~50%) to improve the conductivity. Subsequently, a mixture of 30% by weight of compound (V2), 35% by weight of compound (V1) and 35% by weight of compound (V3) is applied by vapor deposition in a thickness of 20 nm. Subsequently, the material (V3) is applied by vapor deposition with a thickness of 5 nm as exciton and hole blocker.

Next, a mixture of 50% by weight of compound (A-10) and 50% by weight of Liq is applied as electron transport layer by vapor deposition in a thickness of 40 nm, as are a 1 nm-thick Liq layer (electron injection layer) and finally a 100 nm-thick Al electrode.

Comparative Application Example 5

Production and construction of an OLED as in the application example 3, except that compound

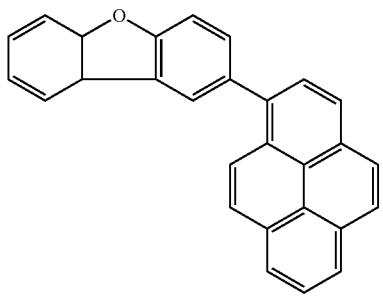

(V-4)

is used instead of compound A-10.

To characterize the OLED, electroluminescence spectra are recorded at various currents and voltages. In addition, the current-voltage characteristic is measured in combination with the light output emitted. The light output can be converted to photometric parameters by calibration with a photometer. To determine the lifetime, the OLED is operated at a constant current density and the decrease in the light output is recorded. The lifetime is defined as that time which lapses until the luminance decreases to half of the initial luminance.

V at 300 cd/m², lm/W at 300 cd/m², EQE (%) at 300 cd/m² and lifetime (h) at 300 cd/m² measured for the devices of the Application Examples and Comparative Application Examples are shown in the Tables 1-1 to 1-5 below, wherein the measured data of the Comparative Application Examples are set to 100 and the data of the Application Examples are specified in relation to those of the Comparative Application Examples.

TABLE 1-1

| Device | ET Layer | EI Layer | V at 300 cd/m² | lm/W at 300 cd/m² | EQE[2] (%) at 300 cd/m² | Lifetime (h) at 300 cd/m² | Color |
|---|---|---|---|---|---|---|---|
| Appl. Ex. 1 | Liq[1] Cpd. A-10[1] | KF | 85 | 170 | 140 | 750 | X = 0.171 Y = 0.294 |
| Comp. Appl. Ex. 1 | Liq[1] BCP[1] | KF | 100 | 100 | 100 | 100 | X = 0.167 Y = 0.282 |

TABLE 1-2

| Device | ET Layer | EI Layer | V at 300 cd/m² | lm/W at 300 cd/m² | EQE[2] (%) at 300 cd/m² | Lifetime (h) at 300 cd/m² | Color |
|---|---|---|---|---|---|---|---|
| Appl. Ex. 1 | Liq[1] Cpd. A-10[1] | KF | 60 | 160 | 100 | 140 | X = 0.171 Y = 0.294 |
| Comp. Appl. Ex. 2 | Cpd. A-10 | KF | 100 | 100 | 100 | 100 | X = 0.171 Y = 0.288 |

TABLE 1-3

| Device | ET Layer | EI Layer | V at 300 cd/m² | lm/W at 300 cd/m² | EQE[2] (%) at 300 cd/m² | Lifetime (h) at 300 cd/m² | Color |
|---|---|---|---|---|---|---|---|
| Appl. Ex. 1 | Liq[1] Cpd. A-10[1] | KF | 40 | 260 | 112 | 360 | X = 0.171 Y = 0.294 |
| Comp. Appl. Ex. 3 | Liq | KF | 100 | 100 | 100 | 100 | X = 0.172 Y = 0.300 |

TABLE 1-4

| Device | ET Layer | EI Layer | V at 300 cd/m² | lm/W at 300 cd/m² | EQE[2] (%) at 300 cd/m² | Lifetime (h) at 300 cd/m² | Color |
|---|---|---|---|---|---|---|---|
| Appl. Ex. 2 | Liq[1] Cpd. A-10[1] | Liq | 35 | 2400 | 800 | 5600 | X = 0.174 Y = 0.296 |
| Comp. Appl. Ex. 4 | Cpd. A-10 | Liq | 100 | 100 | 100 | 100 | X = 0.169 Y = 0.281 |

TABLE 1-5

| Device | ET Layer | EI Layer | V at 300 cd/m² | lm/W at 300 cd/m² | EQE[2] (%) at 300 cd/m² | Lifetime (h) at 300 cd/m² | Color |
|---|---|---|---|---|---|---|---|
| Appl. Ex. 3 | Liq[1] Cpd. A-10[1] | Liq | 90 | 110 | 102 | 1650 | X = 0.170 Y = 0.290 |
| Comp. Appl. Ex. 4 | Liq[1] Cpd. V-4 | Liq | 100 | 100 | 100 | 100 | X = 0.170 Y = 0.300 |

[1] 50% by weight.
[2] External quantum efficiency (EQE) is # a of generated photons escaped from a substance or a device/# of electrons flowing through it.
ET Layer = Electron Transport Layer.
EI Layer = Electron Injection Layer.

The life time, power efficiency, quantum efficiency and/or voltage at 300 cd/m² of the devices of the Application Examples are superior as compared with the devices of the Comparative Application Examples.

The invention claimed is:

1. An organic electronic device including
an anode,
a cathode,
a light-emitting layer arranged between the anode and the cathode,
and
an electron transport layer arranged between the cathode and the light-emitting layer,
wherein the electron transport layer comprises
an organic metal complex of formula

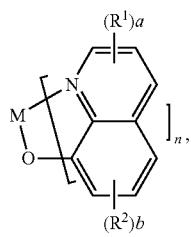

(I)

and
a compound of formula

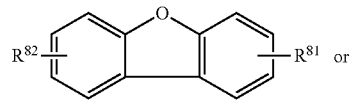

(II)

or

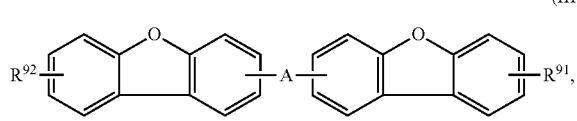

(III)

wherein
$R^1$ and $R^2$ are independently of each other F, $C_1$-$C_8$alkyl, or $C_6$-$C_{14}$aryl, which may optionally be substituted by one, or more $C_1$-$C_8$alkyl groups, or
two substituents $R^1$ and/or $R^2$ combine to form a fused benzene ring group, which may optionally be substituted by one, or more $C_1$-$C_8$alkyl groups,
a and b are independently of each other 0, or an integer 1 to 3,
$R^{81}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$ alkyl, $C_6$-$C_{14}$aryl, or $C_2$-$C_{20}$heteroaryl groups,
$R^{82}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups,
$R^{91}$ is phenanthryl, pyrenyl, triphenylenyl, 1,10-phenanthrolinyl, triazinyl, dibenzothiophenyl, pyrimidinyl, or dibenzofuranyl, each of which may optionally be substituted by one, or more $C_1$-$C_{18}$alkyl, $C_6$-$C_{14}$aryl, or $C_2$-$C_{20}$heteroaryl groups,
$R^{92}$ is H, phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups,
A is a single bond, an arylene, or heteroarylene group, each of which may optionally be substituted by one, or more $C_1$-$C_{18}$alkyl groups; or —$SiR^{83}R^{84}$—, wherein $R^{83}$ and $R^{84}$ are independently of each other a $C_1$-$C_{18}$alkyl, or a $C_6$-$C_{14}$aryl group, which may optionally be substituted by one, or more $C_1$-$C_{18}$alkyl groups;
M is an alkali metal atom, or an earth alkaline metal atom,
n is 1, if M is an alkali metal atom, n is 2, if M is an earth alkaline metal atom.

2. The organic electronic device according to claim 1, wherein the compound of formula II is a compound of formula

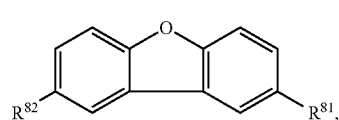

(IIa)

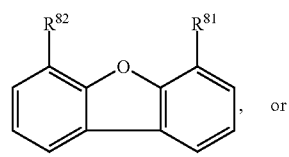

(IIb)

or

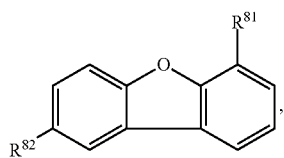
(IIc)

and the compound of formula III is a compound of formula

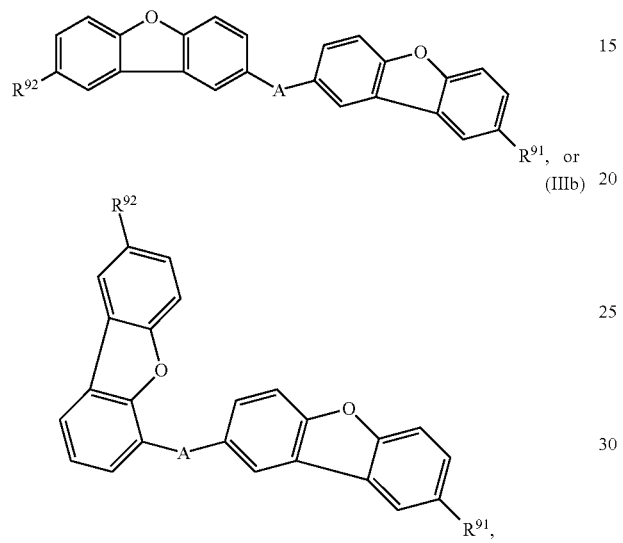

wherein A, $R^{81}$, $R^{82}$, $R^{91}$ and $R^{92}$ are as defined in claim 1.

3. The organic electronic device according to claim 2, wherein $R^{81}$ is

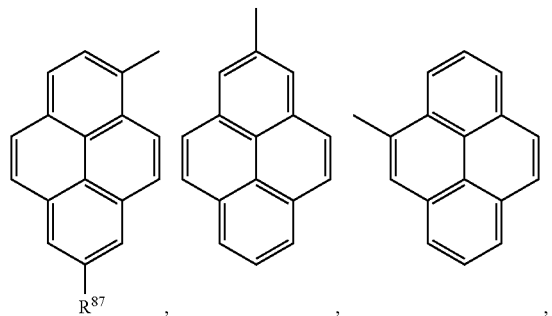
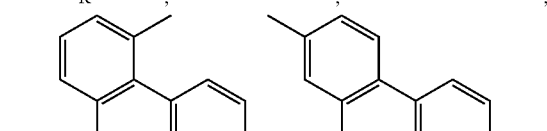
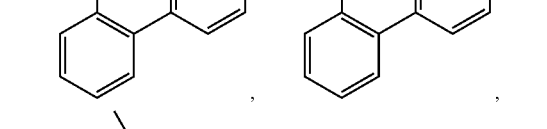
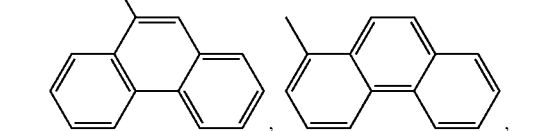

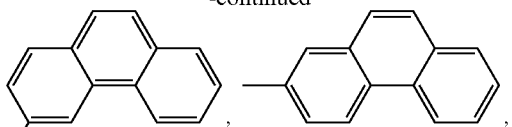
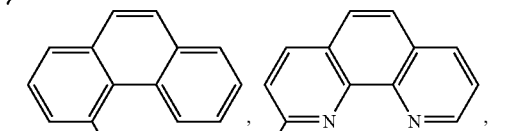
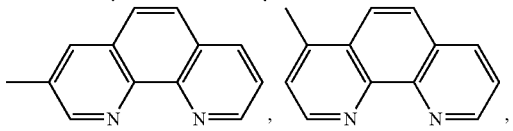
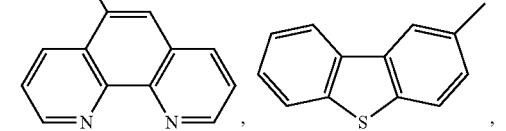
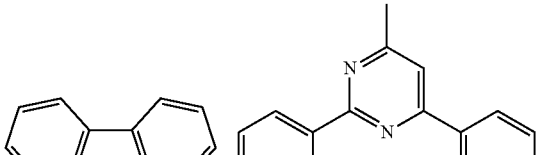
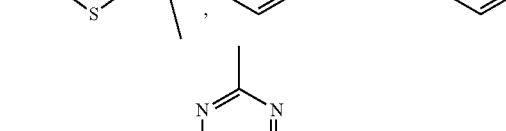
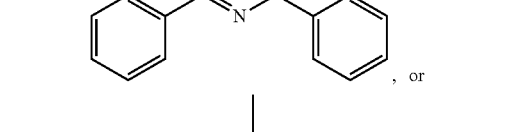
, or
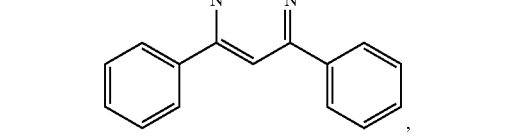

wherein $R^{87}$ is H, or $C_1$-$C_8$alkyl;

$R^{82}$ has the meaning of $R^{81}$, $R^{91}$ has the meaning of $R^{81}$, or is

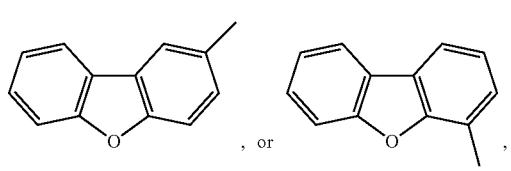

$R^{92}$ has the meaning of $R^{81}$, or is H.

4. The organic electronic device according to claim 1, wherein A is a single bond, a group —SiR$^{83}$R$^{84}$—, a group of formula

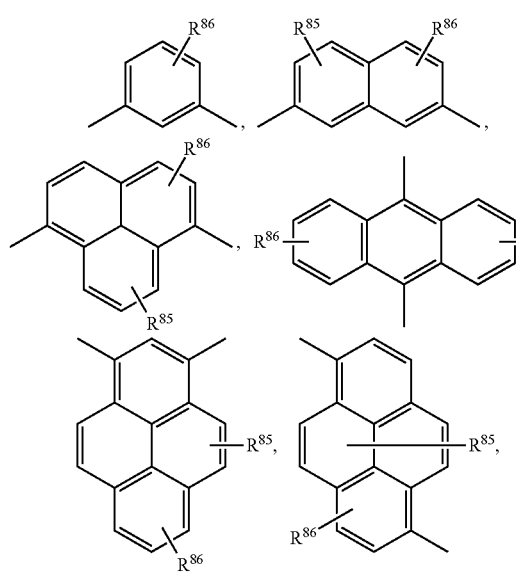
(A-1)
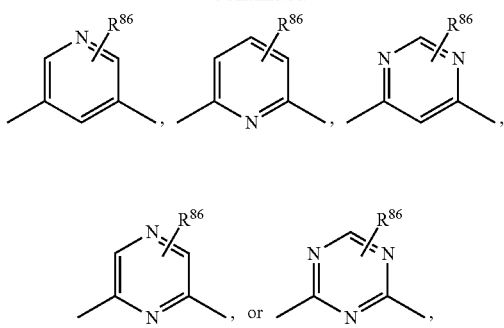
wherein $R^{85}$ and $R^{86}$ are independently of each other H, or a $C_1$-$C_{18}$alkyl group and $R^{83}$ and $R^{84}$ are independently of each other a $C_1$-$C_8$alkyl group.
5. The organic electronic device according to claim 1, wherein the compound of formula II, or III is a compound of formula
(A-1)
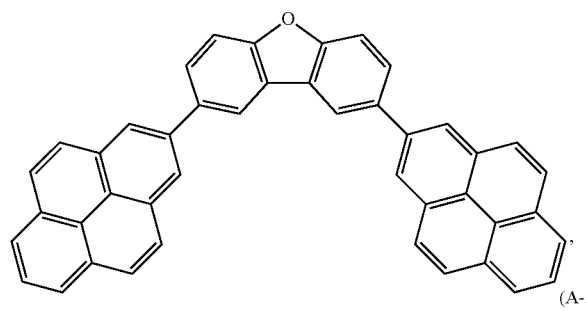
(A-2)
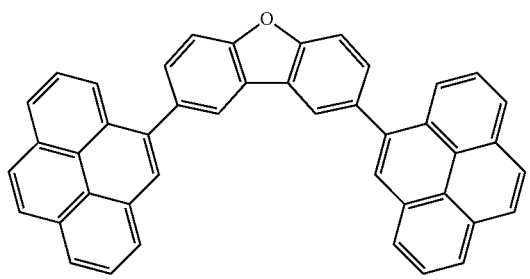
(A-3)
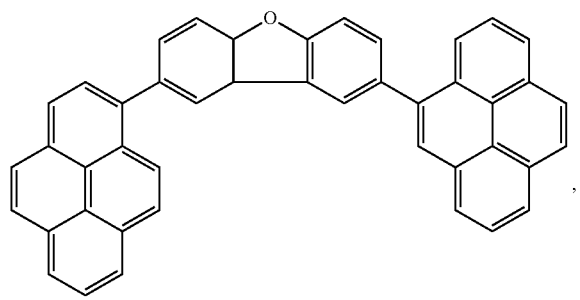
(A-4)
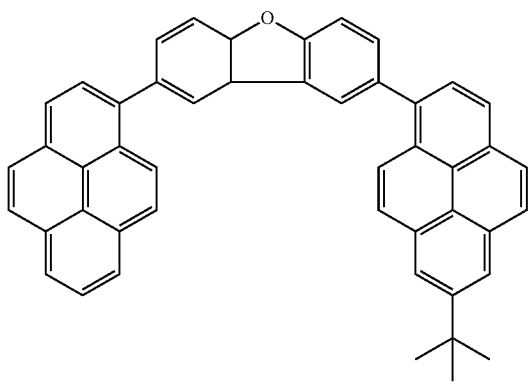
(A-5)
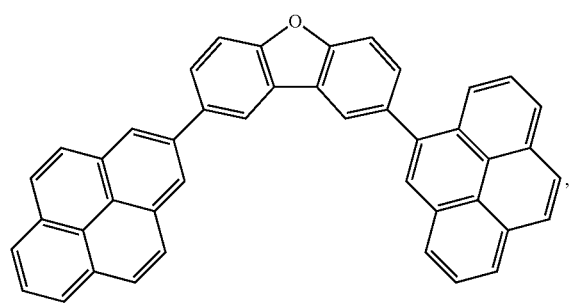
(A-6)
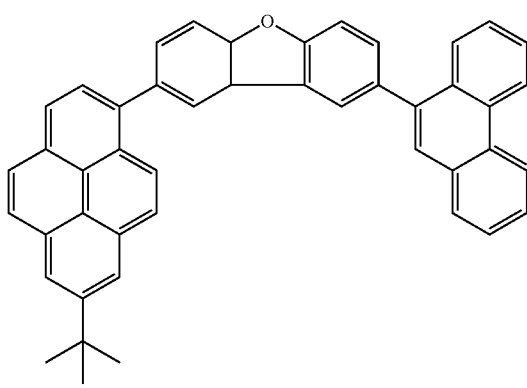

-continued
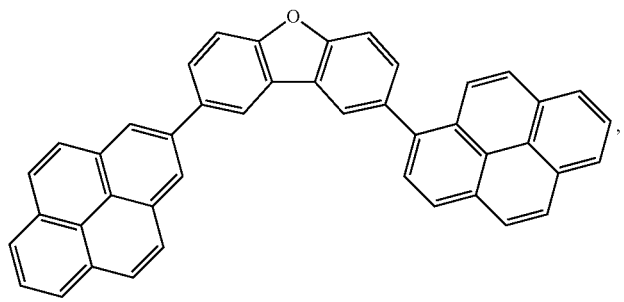
(A-7)
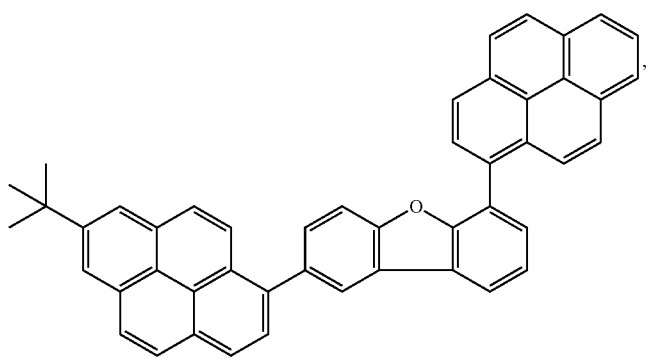
(A-8)
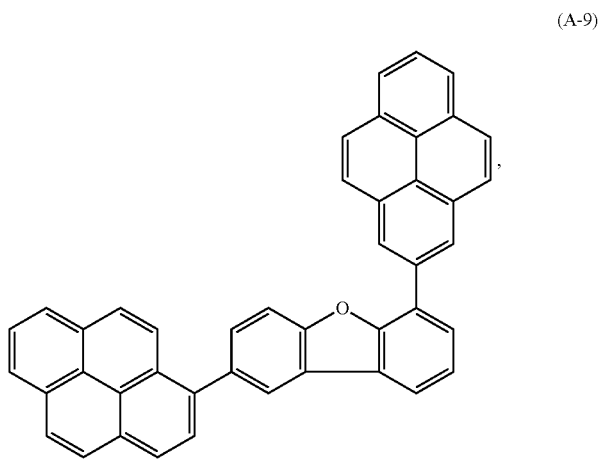
(A-9)
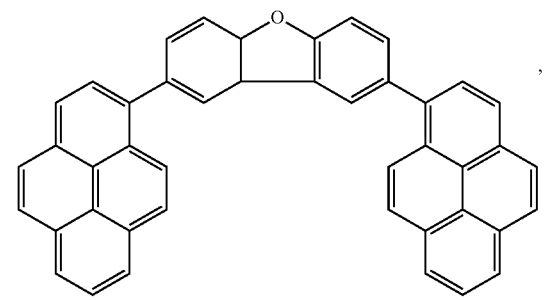
(A-10)
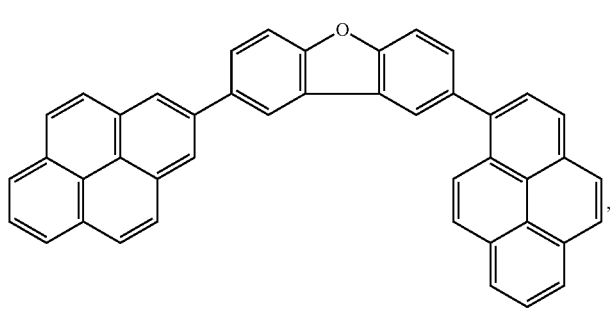
(A-11)

-continued
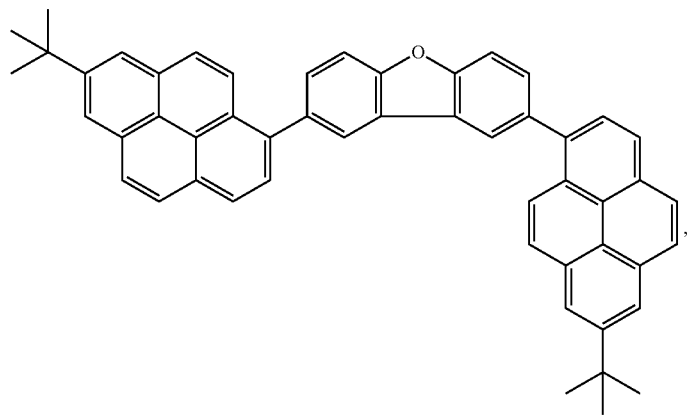
(A-12)
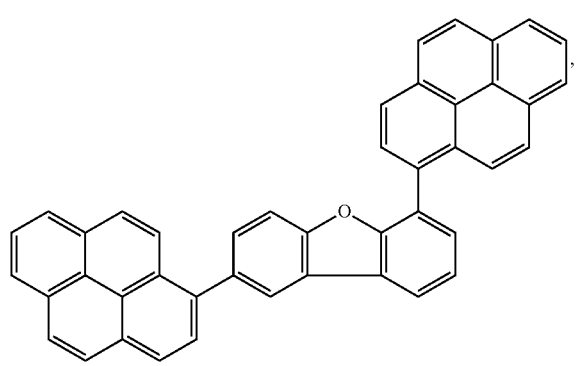
(A-13)
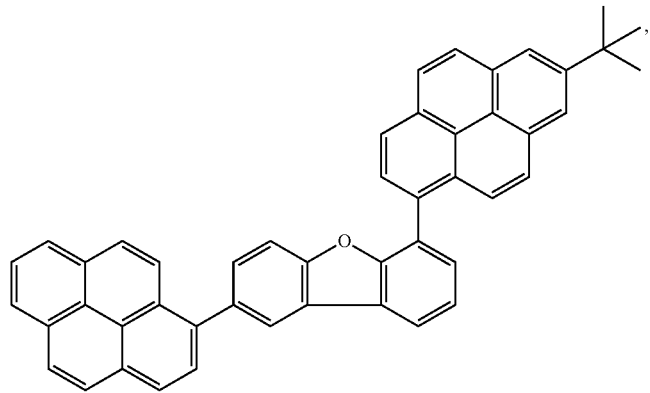
(A-14)
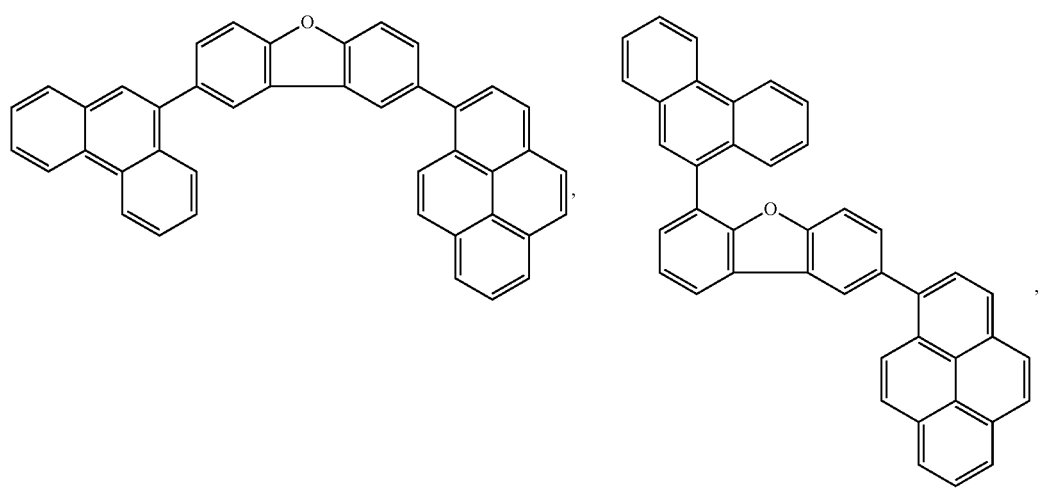
(A-15)                (A-16)

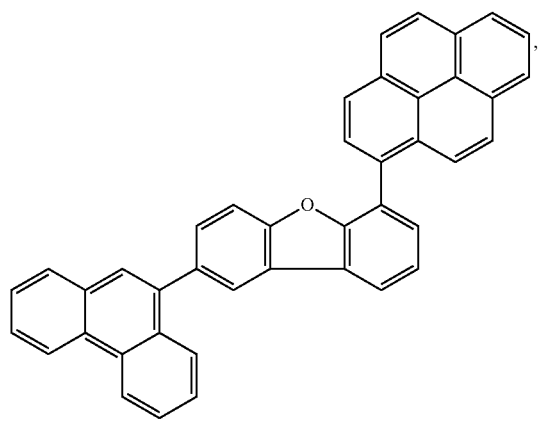
(A-17)
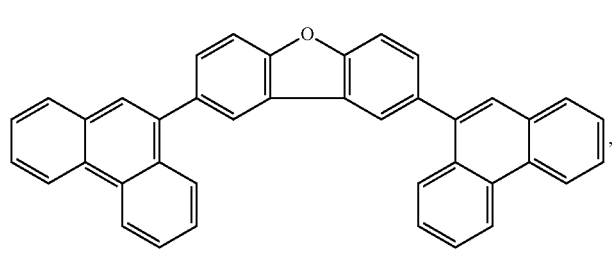
(A-18)
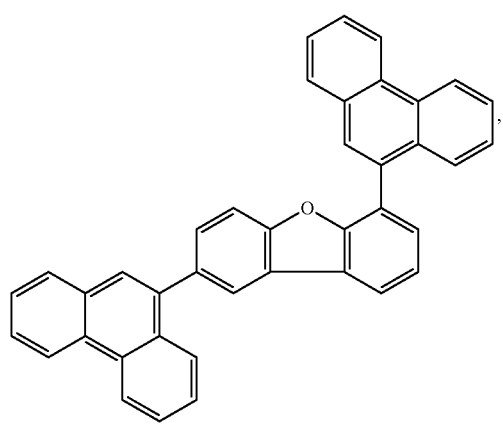
(A-19)
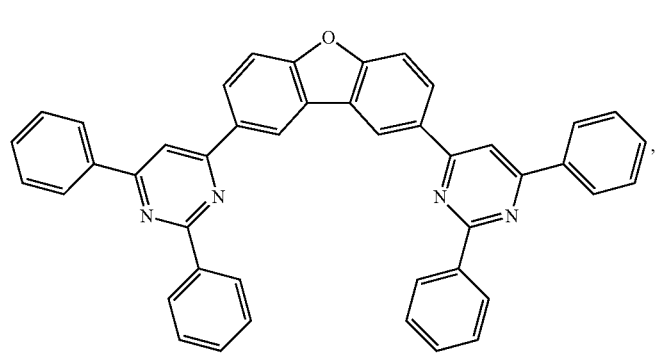
(A-20)

(A-21)
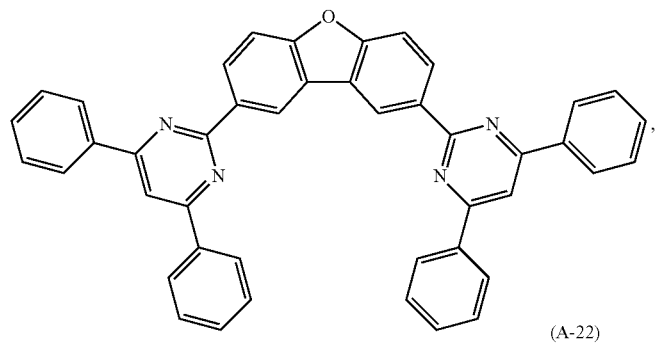
(A-22)
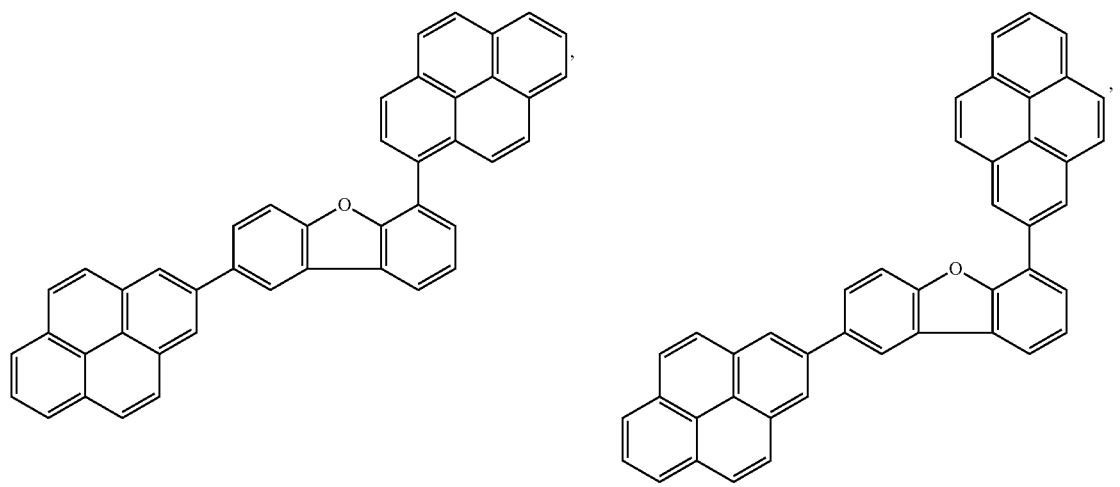
(A-23)
(A-24)
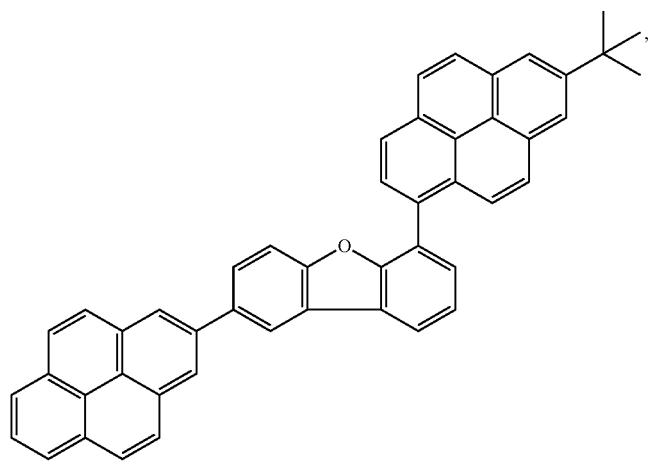
(A-25)
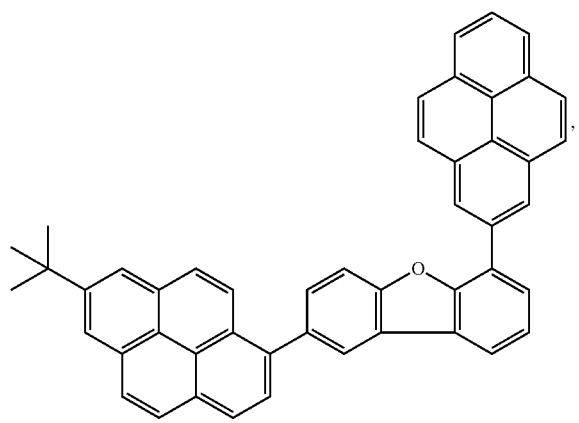

(A-26)
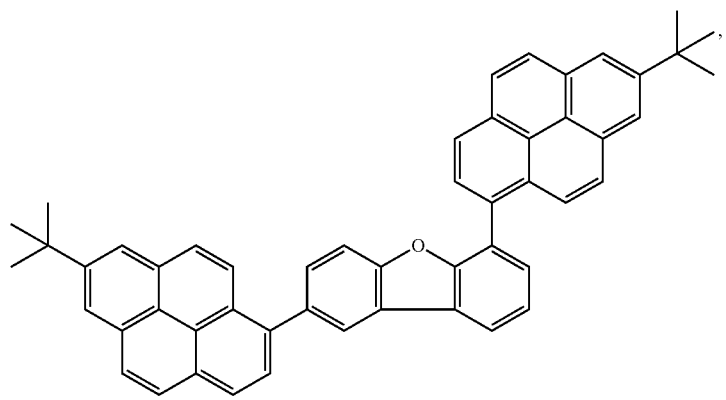
(A-27)
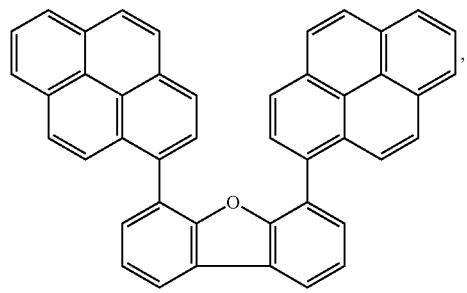
(A-28)
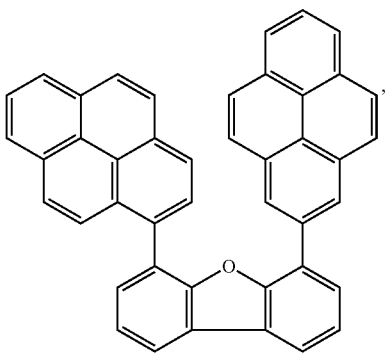
(A-29)
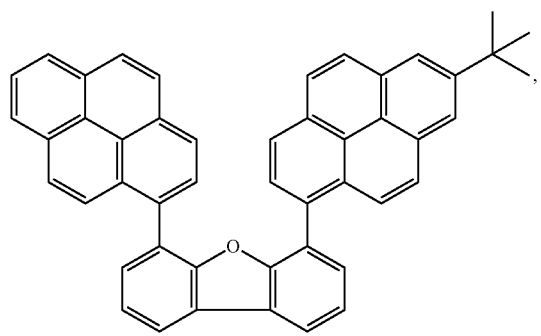
(A-30)
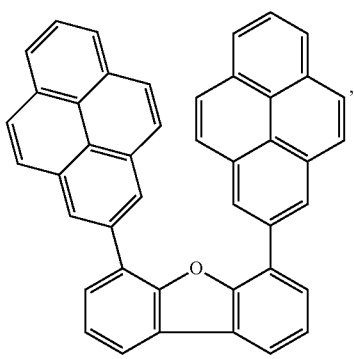
(A-31)
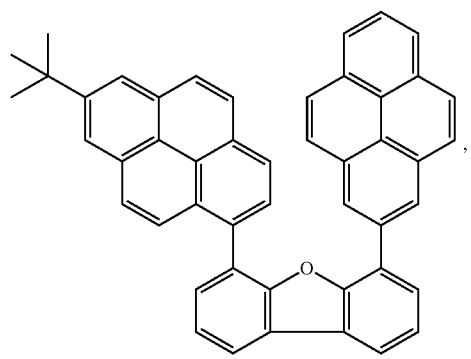

-continued
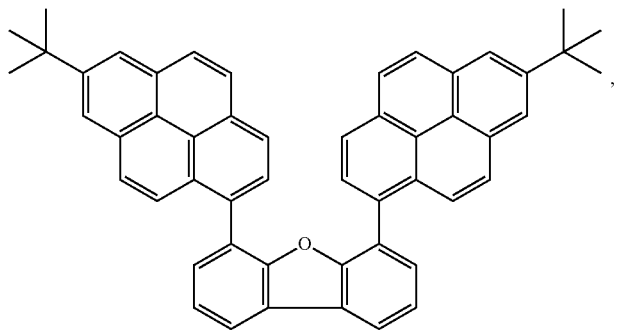
(A-32)
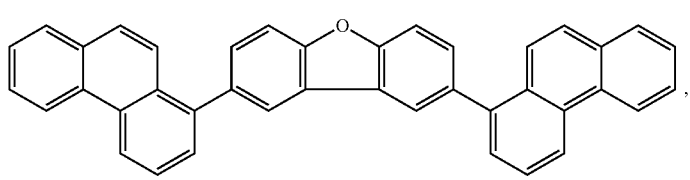
(A-33)
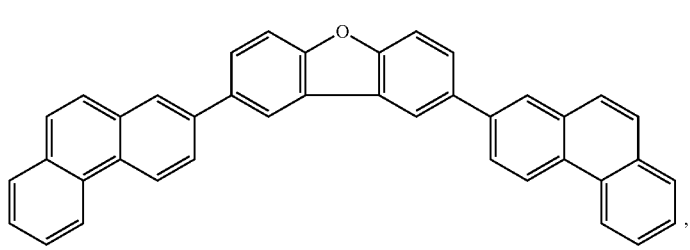
(A-34)
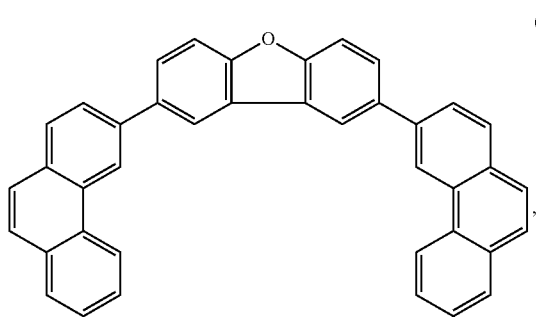
(A-35)
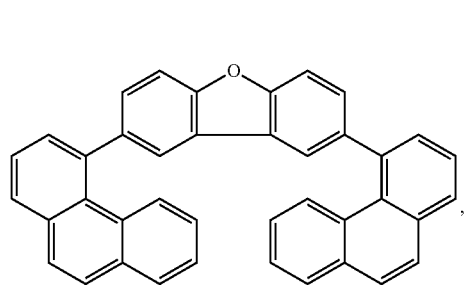
(A-36)
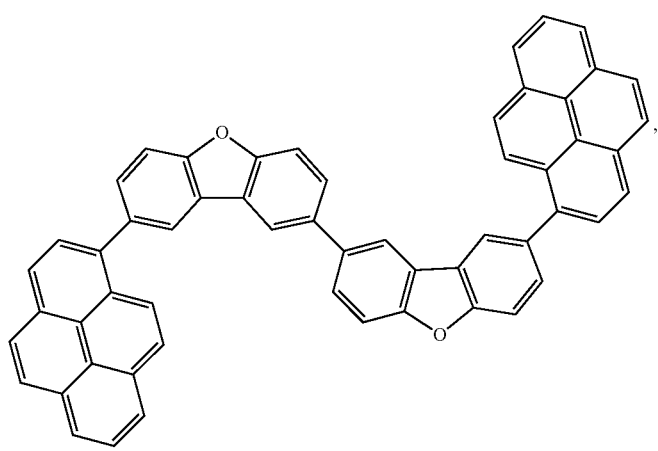
(B-1)

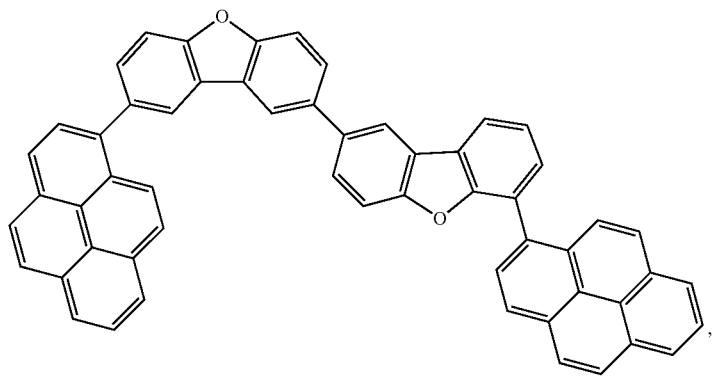
(B-2)
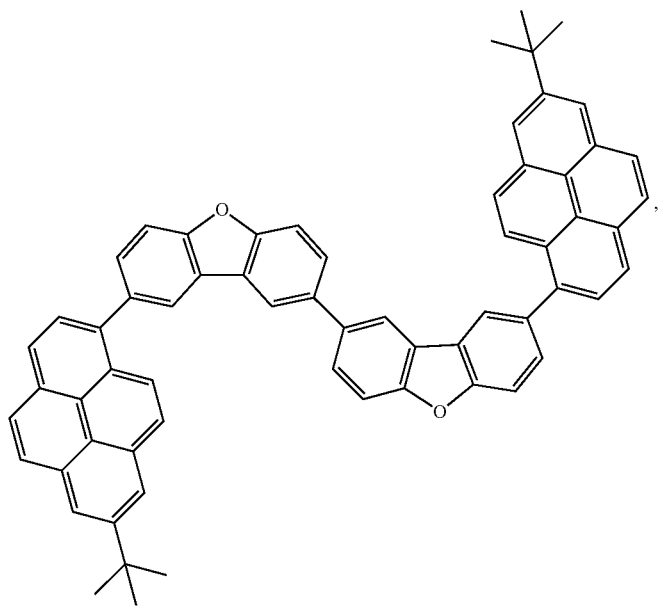
(B-3)
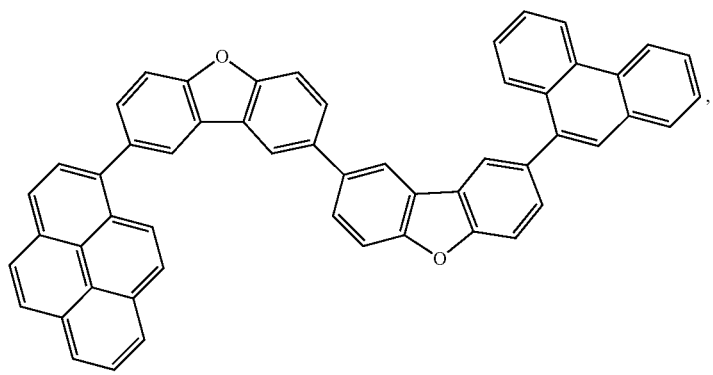
(B-4)
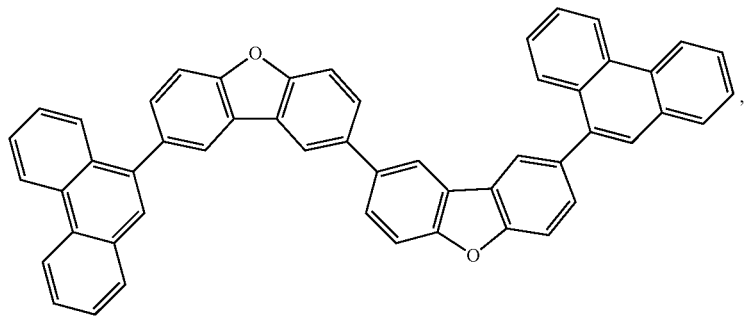
(B-5)

-continued
(B-6)
(B-7)
(B-8)
(B-9)
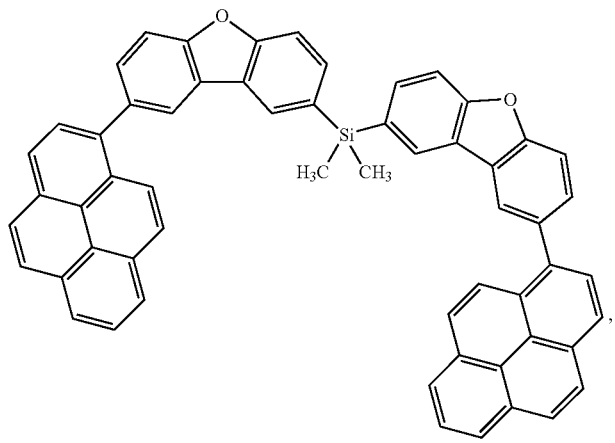

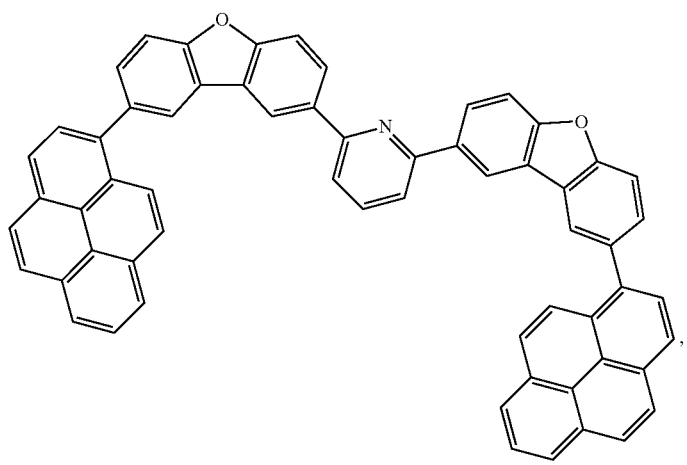
(B-10)
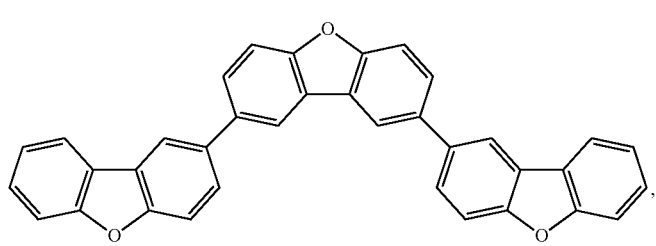
(B-11)
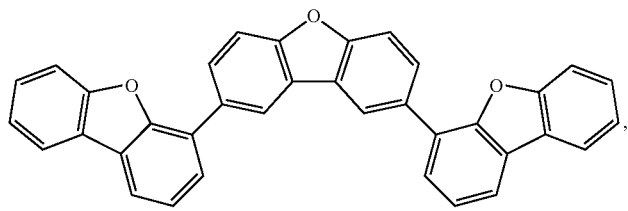
(B-12)
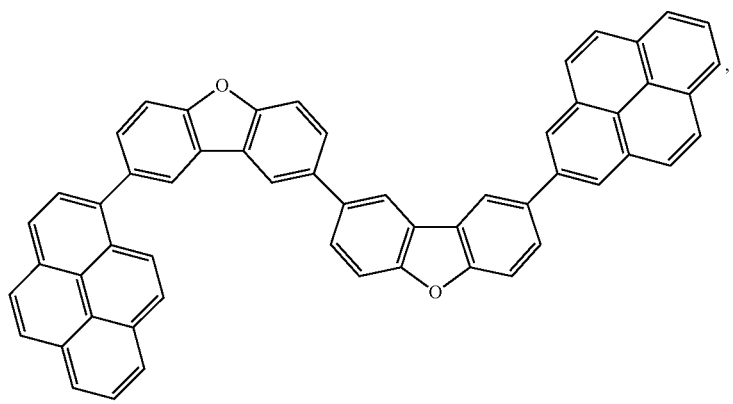
(B-13)

(B-14)
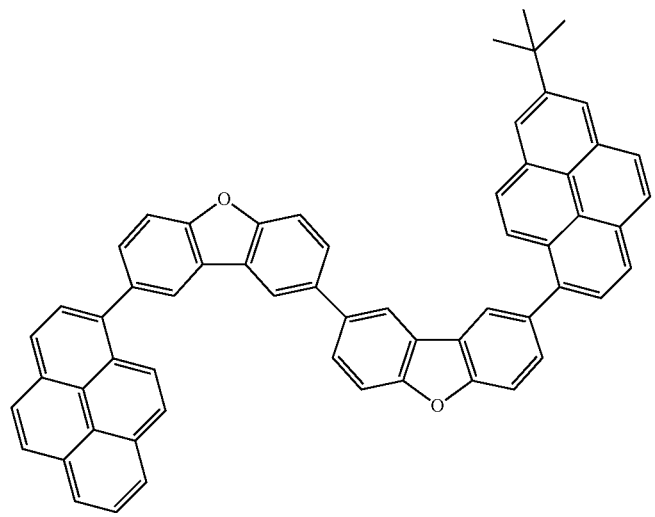
(B-15)
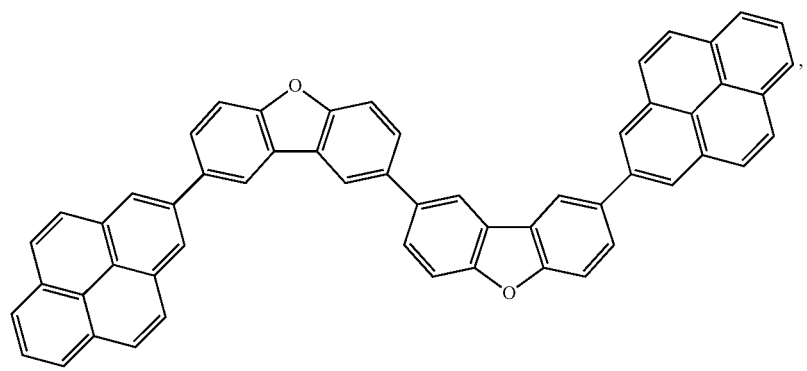
(B-16)
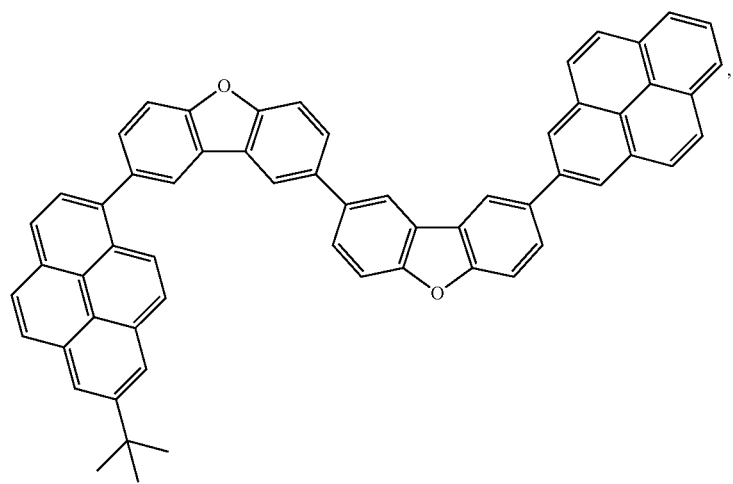

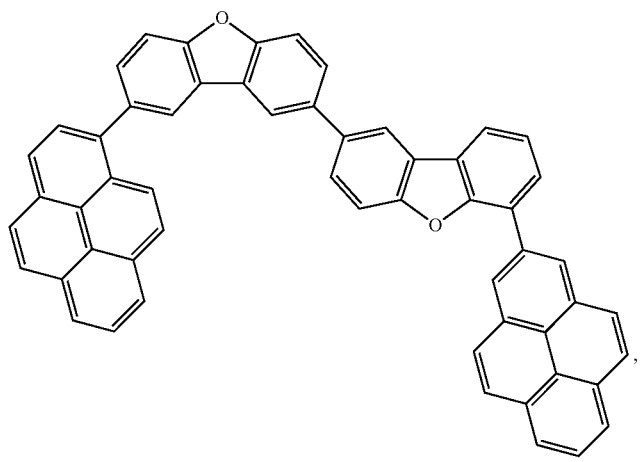 (B-17)
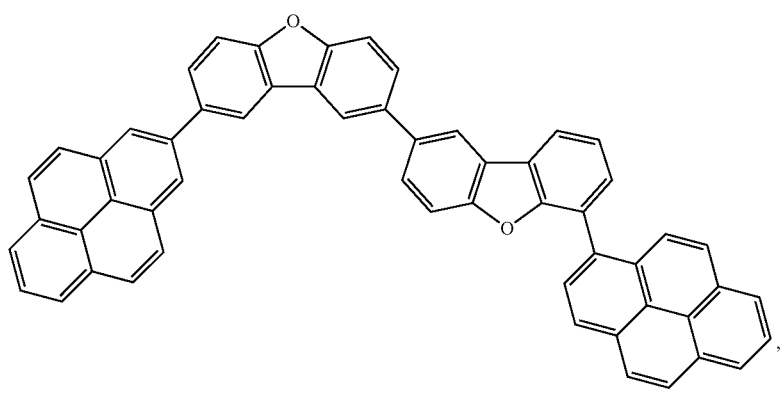 (B-18)
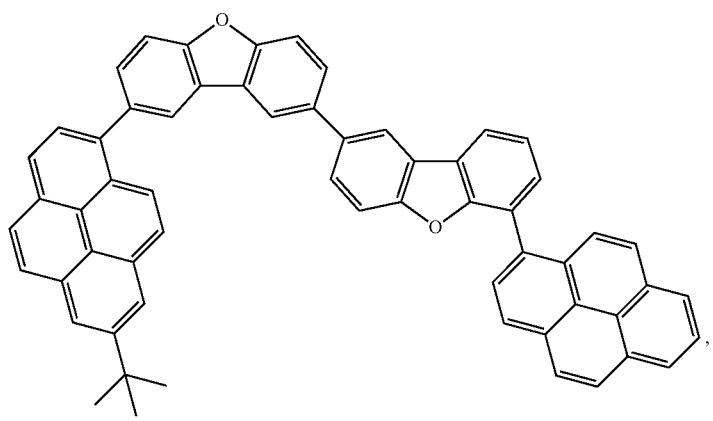 (B-19)
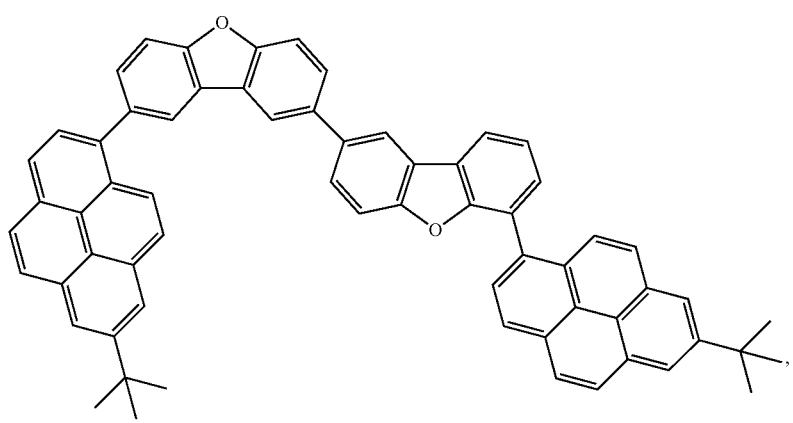 (B-20)

(B-21)
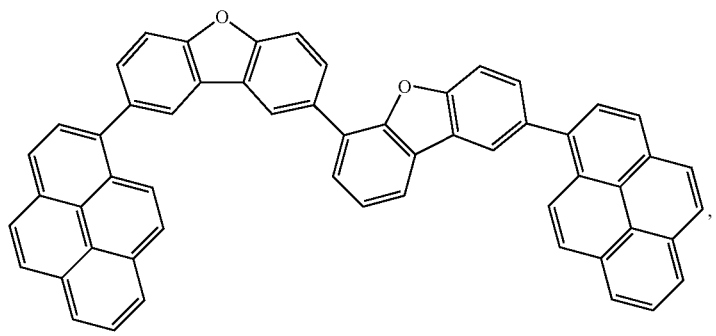
(B-22)
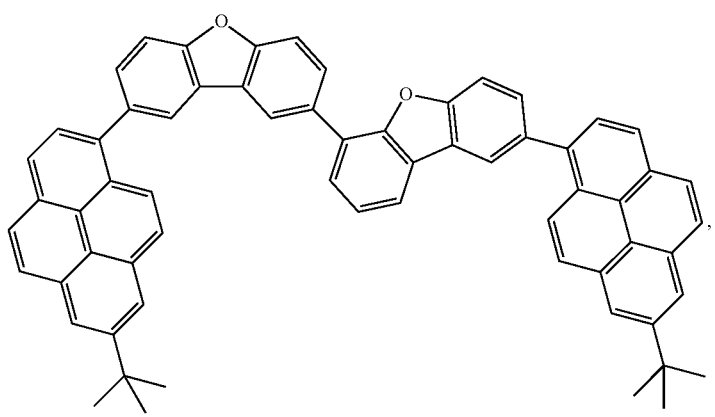
(B-23)
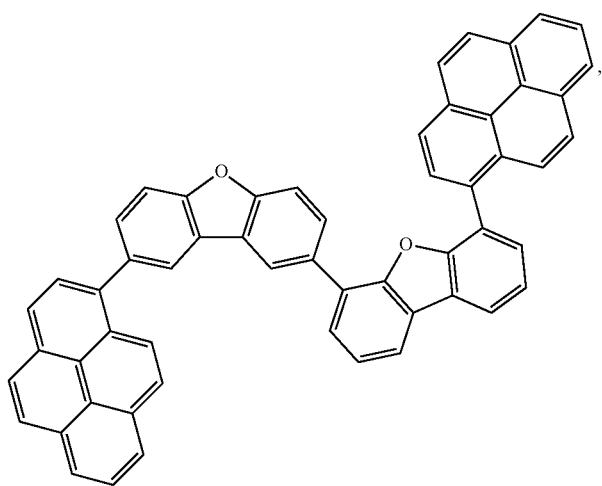

-continued
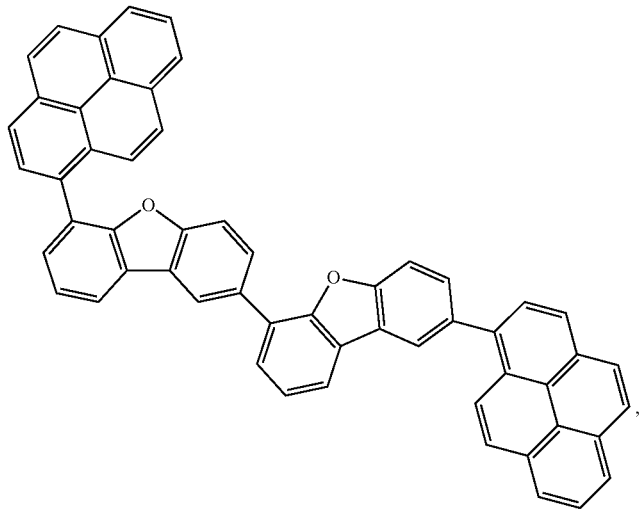
(B-24)
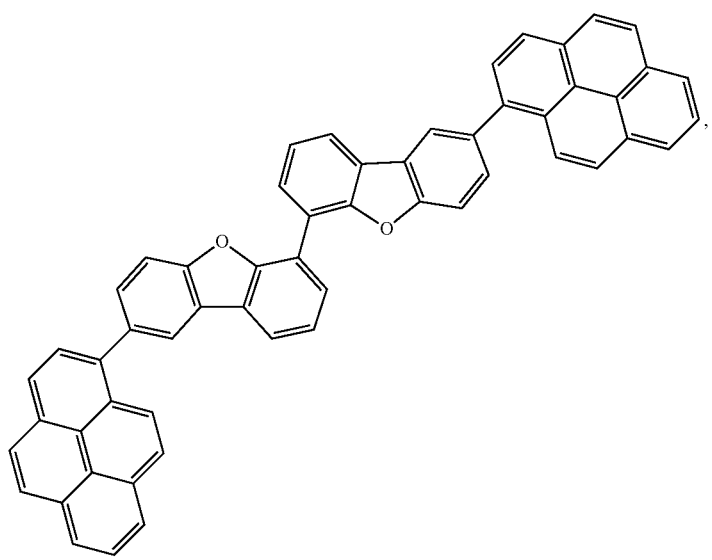
(B-24)
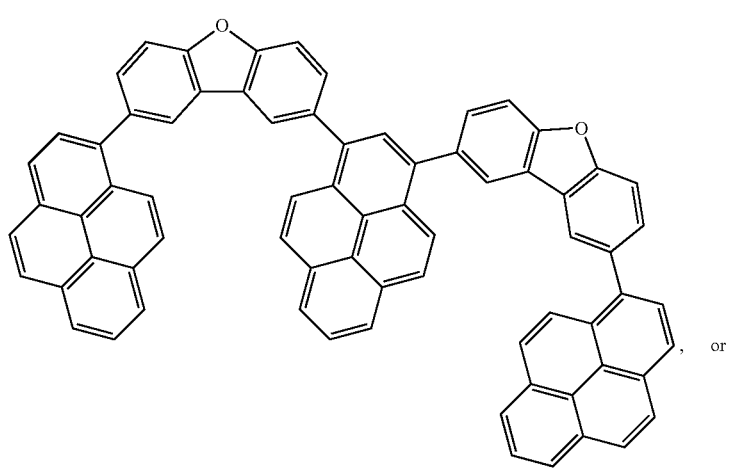
(B-26)
or

-continued

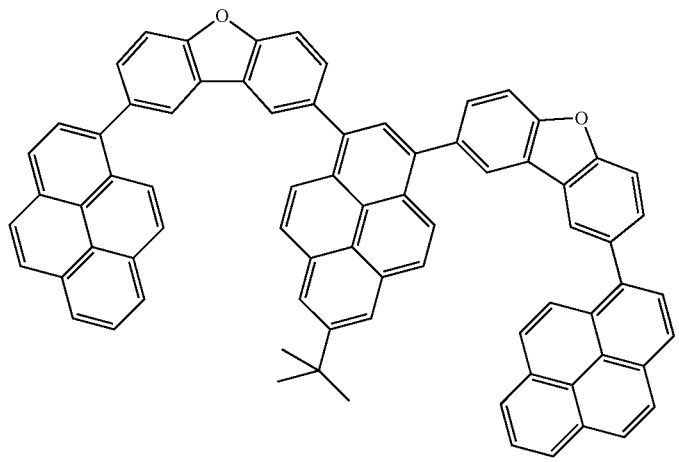

(B-27)

6. The organic electronic device according to claim 1, wherein the compound of formula I is a compound of formula

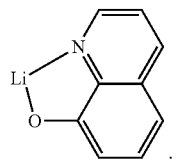

(Liq)

7. The organic electronic device according to claim 1, which is an organic light emitting device, comprising the anode, a hole injection layer, a hole transport layer, the light emitting layer, a hole and exciton blocking layer, the electron transport layer comprising the compounds of formula I and II or III, an electron injection layer and the cathode.

8. The organic electronic device according to claim 7, wherein the electron transport layer comprises a mixture of a compound of formula

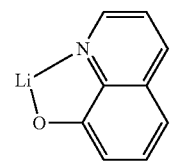

(Liq)

and a compound of formula

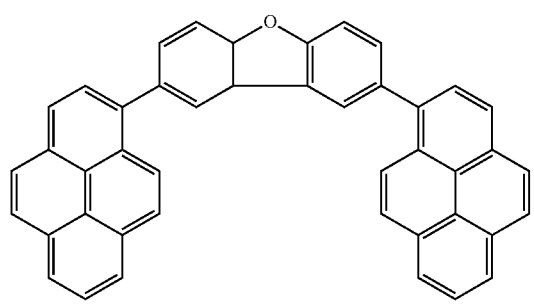

(A-10)

9. The organic electronic device according to claim 7, wherein the electron injection layer comprises, or consists of potassium fluoride, or Liq.

10. The organic electronic device according to claim 7, wherein the light emitting layer comprises a compound of the formula

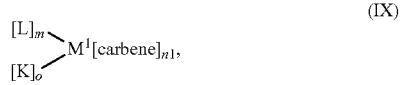

(IX)

wherein the symbols have the following meanings:

$M^1$ is a metal atom selected from the group consisting of Co, Rh, Ir, Nb, Pd, Pt, Fe, Ru, Os, Cr, Mo, W, Mn, Tc, Re, Cu, Ag and Au in any oxidation state possible for the respective metal atom;

carbene is a carbene ligand which may be uncharged or monoanionic and monodentate, bidentate or tridentate, with the carbene ligand also being able to be a biscarbene or triscarbene ligand;

L is a monoanionic or dianionic ligand, which may be monodentate or bidentate;

K is an uncharged monodentate or bidentate ligand selected from the group consisting of phosphines; phosphonates and derivatives thereof, arsenates and derivatives thereof; phosphites; CO; pyridines; nitriles and conjugated dienes which form a π complex with $M^1$;

N1 is the number of carbene ligands, where n1 is at least 1 and when n1>1 the carbene ligands in the complex of the formula I can be identical or different;

m is the number of ligands L, where m can be 0 or ≥1 and when m>1 the ligands L can be identical or different;

o is the number of ligands K, where o can be 0 or ≥1 and when o>1 the ligands K can be identical or different;

where the sum n1+m+o is dependent on the oxidation state and coordination number of the metal atom and on the denticity of the ligands carbene, L and K and also on the charge on the ligands, carbene and L, with the proviso that n1 is at least 1.

11. The organic electronic device according to claim 10, wherein the compound of the formula IX is a compound of the formula

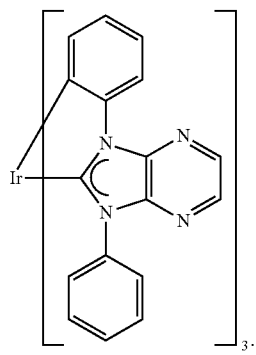

12. The organic electronic device according to claim 7, wherein the hole transport layer comprises a compound of formula

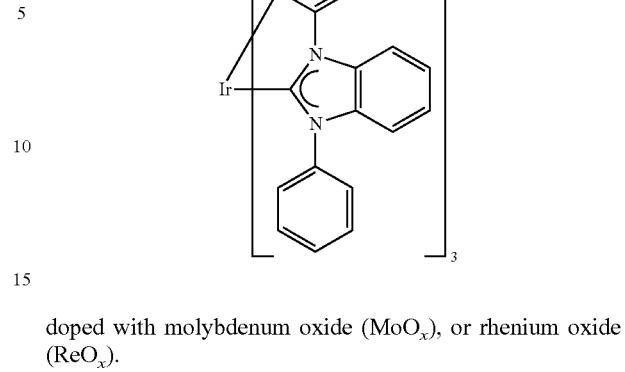

doped with molybdenum oxide ($MoO_x$), or rhenium oxide ($ReO_x$).

13. An apparatus comprising the organic electronic device according to claim 1.

* * * * *